United States Patent
Sakano et al.

(10) Patent No.: US 9,490,373 B2
(45) Date of Patent: Nov. 8, 2016

(54) SOLID-STATE IMAGING DEVICE AND ELECTRONIC APPARATUS WITH IMPROVED STORAGE PORTION

(71) Applicant: Sony Corporation, Tokyo (JP)

(72) Inventors: Yorito Sakano, Kanagawa (JP); Itaru Oshiyama, Kanagawa (JP); Yuki Miyanami, Kanagawa (JP); Takeshi Takeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 82 days.

(21) Appl. No.: 13/749,393

(22) Filed: Jan. 24, 2013

(65) Prior Publication Data
US 2013/0200479 A1 Aug. 8, 2013

(30) Foreign Application Priority Data

Feb. 2, 2012 (JP) .................................. 2012-020867
Feb. 6, 2012 (JP) .................................. 2012-022724

(51) Int. Cl.
*H01L 31/0216* (2014.01)
*H01L 31/0224* (2006.01)
*H01L 27/146* (2006.01)
*H04N 5/359* (2011.01)
*H04N 5/3745* (2011.01)

(52) U.S. Cl.
CPC ..... *H01L 31/0216* (2013.01); *H01L 27/14603* (2013.01); *H01L 27/14609* (2013.01); *H01L 27/14623* (2013.01); *H01L 27/14641* (2013.01); *H01L 27/14689* (2013.01); *H01L 31/0224* (2013.01); *H04N 5/3591* (2013.01); *H04N 5/37452* (2013.01)

(58) Field of Classification Search
CPC .................................................. H01L 31/02164
USPC .......................................................... 257/435
See application file for complete search history.

(56) References Cited

U.S. PATENT DOCUMENTS

| | | | |
|---|---|---|---|
| 6,317,154 B2 * | 11/2001 | Beiley .......................... | 348/308 |
| 8,917,341 B2 * | 12/2014 | Sakano et al. ................ | 348/308 |
| 9,293,503 B2 * | 3/2016 | Sakano ............ | H01L 27/14609 |
| 2002/0192934 A1 * | 12/2002 | Jeong ............................ | 438/598 |

(Continued)

FOREIGN PATENT DOCUMENTS

| | | |
|---|---|---|
| CN | 102208426 A | 10/2011 |
| JP | 06-061449 A | 4/1997 |

(Continued)

OTHER PUBLICATIONS

Chinese Office Action issued Aug. 3, 2016 for corresponding Chinese Application No. 201310028975.0.

*Primary Examiner* — Lex Malsawma
*Assistant Examiner* — Gardner W Swan
(74) *Attorney, Agent, or Firm* — Michael Best & Friedrich LLP

(57) ABSTRACT

There is provided a solid-state imaging device including a pixel array portion in which multiple unit pixels are arranged on a semiconductor substrate, the multiple unit pixels each including a photoelectric conversion portion generating and accumulating a light charge based on a quantity of received light and a charge accumulation portion accumulating the light charge, wherein at least part of an electrode closer to an incidence side on which light enters the unit pixel of the charge accumulation portion, is formed with a metal film functioning as a light blocking film.

25 Claims, 73 Drawing Sheets

PLANAR-TYPE MOS CAPACITOR + STACK-TYPE CAPACITOR

(56) References Cited

U.S. PATENT DOCUMENTS

| | | | |
|---|---|---|---|
| 2005/0063141 A1* | 3/2005 | Jeong et al. | 361/312 |
| 2005/0196915 A1* | 9/2005 | Jeong et al. | 438/238 |
| 2006/0065915 A1* | 3/2006 | Kuwazawa | H01L 27/14603 257/292 |
| 2007/0063295 A1* | 3/2007 | Jeon | H01L 21/28088 257/410 |
| 2008/0036888 A1* | 2/2008 | Sugawa et al. | 348/294 |
| 2009/0200454 A1* | 8/2009 | Barbier | H04N 5/3559 250/214.1 |
| 2009/0251582 A1* | 10/2009 | Oike | H01L 27/14609 348/308 |
| 2009/0303366 A1* | 12/2009 | Gambino et al. | 348/308 |
| 2010/0245647 A1* | 9/2010 | Honda et al. | 348/308 |
| 2011/0007196 A1* | 1/2011 | Yamashita | H01L 27/14609 348/294 |
| 2011/0019038 A1* | 1/2011 | Okuno | H01L 27/14609 348/246 |

FOREIGN PATENT DOCUMENTS

| | | |
|---|---|---|
| JP | 09-092801 A | 4/1997 |
| JP | 10-079476 A1 | 3/1998 |
| JP | 2001-250934 A | 9/2001 |
| JP | 3874135 | 11/2006 |
| JP | 2009-165186 A | 7/2009 |
| JP | 2009-268083 | 11/2009 |
| JP | 2011-199816 A | 10/2011 |
| JP | 2011-216970 A | 10/2011 |

* cited by examiner

PLANAR-TYPE MOS CAPACITOR + STACK-TYPE CAPACITOR

PLANAR-TYPE MOS CAPACITOR + STACK-TYPE CAPACITOR

PLANAR-TYPE MOS CAPACITOR + STACK-TYPE CAPACITOR

PLANAR-TYPE MOS CAPACITOR + STACK-TYPE CAPACITOR

PLANAR-TYPE MOS CAPACITOR + STACK-TYPE CAPACITOR

PLANAR-TYPE MOS CAPACITOR + STACK-TYPE CAPACITOR

1 FORMATION OF ELEMENT ISOLATION

2 SACRIFICIAL OXIDATION

3 I/I BEFORE FORMATION OF GATE

4 GATE OXIDATION

5 FORMATION (DEPOSITION) OF GATE ELECTRODE

6 FORMATION (ETCHING) OF GATE ELECTRODE

7 I/I AFTER FORMATION OF GATE

8 FORMATION (DEPOSITION) OF INSULATING FILM

9 FORMATION (DEPOSITION) OF LIGHT BLOCKING FILM

10 FORMATION (ETCHING) OF LIGHT BLOCKING FILM

11 FORMATION (DEPOSITION) OF INTERLAYER INSULATING FILM

12 FORMATION OF WIRE LAYER

FORMATION OF INSULATING FILM

FORMATION OF CONTACT HOLE

FILM FORMATION OF Poly Si

FORMATION/WIRING OF CONTACT HOLE

FORMATION OF INSULATING FILM

FORMATION OF CONTACT HOLE

FILM FORMATION OF Poly Si

PROCESSING OF Poly Si

FORMATION OF CAPACITY INSULATING FILM

FORMATION OF INTERLAYER INSULATING FILM

CMP

FORMATION OF CONTACT HOLE

FILM FORMATION OF W/Tin/Ti, AND CMP

FORMATION OF Cu WIRE

FORMATION OF TRENCH / FORMATION OF INSULATING FILM

FILM FORMATION OF W

PROCESSING OF W

FORMATION OF CAPACITY INSULATING FILM

FORMATION OF CONTACT HOLE

FILM FORMATION OF W/TinN/Ti, AND W PROCESSING

SOLID-STATE IMAGING DEVICE AND ELECTRONIC APPARATUS WITH IMPROVED STORAGE PORTION

BACKGROUND

The present disclosure relates to a solid-state imaging device, a method of producing the solid-state imaging device and electronic apparatus. Particularly, the present disclosure relates to a solid-state imaging device having a charge accumulation portion in a unit pixel, a method of producing the solid-state imaging device and electronic apparatus.

A solid-state imaging device such as a CMOS image sensor, which is a kind of solid-state imaging device of an X-Y addressing scheme, performs an operation of sequentially scanning and reading light charges generated and accumulated in a photoelectric conversion portion every pixel or every row. In the case of this sequential scanning, that is, in the case of adopting a rolling shutter as an electronic shutter, it is not possible to share the exposure start time and exposure end time to accumulate light charges, in all pixels. Therefore, in the case of the sequential scanning, there is a problem that distortion is caused in a taken image at the time of taking an image of a moving subject.

In the case of taking an image of a subject that moves at high speed in which that kind of image distortion is not allowed, or in the case of the sensing use requesting synchronism in a taken image, a global shutter to execute the exposure start and the exposure end at the same timings with respect to all pixels in a pixel array portion is adopted as an electronic shutter. To realize this global shutter, as an area to accumulate light charges separately from a photodiode which is a photoelectric conversion portion, that is, as a charge accumulation portion, for example, a flush-mounted MOS capacitor is set (for example, see Japanese Patent No. 3874135).

However, when a flush-mounted MOS capacitor receives all light charges generated and accumulated by photoelectric conversion in a photodiode at the time of global shutter, the flush-mounted MOS capacitor requests a saturated charge amount equal to or larger than that of the photodiode. To put it the other way around, taking into account the same unit pixel size, when there is a flush-mounted MOS capacitor in a unit pixel, since the photodiode area significantly becomes small, there is a problem that the saturated charge amount of the photodiode becomes small.

As its countermeasure, there is suggested a technique of accumulating light charges, which are generated by photoelectric conversion in a photodiode, in both the photodiode and a flush-mounted MOS capacitor (for example, see Japanese Patent Laid-Open No. 2009-268083). According to this related art, the saturated charge amount is a sum of the saturated charge amount of the photodiode and the saturated charge amount of the flush-mounted MOS capacitor.

However, even in the related art disclosed in Japanese Patent Laid-Open No. 2009-268083, the saturated charge amount is much smaller than that of a CMOS image sensor without a global shutter function. This is because, to realize the global exposure, it is requested to add not only a charge accumulation portion (in the case of the related art, flush-mounted MOS capacitor) but also a transistor into a unit pixel. As a result, it causes degradation of the image dynamic range.

Meanwhile, to increase the saturated charge amount and widen the dynamic range, separately from the related art to realize the global exposure, there is a possible case where a capacitor of a larger capacity value per unit area is used as a charge accumulation portion instead of a flush-mounted MOS capacitor.

SUMMARY

Meanwhile, in a case where a charge accumulation portion is set in a unit pixel, light may be leaked in the charge accumulation portion and a false signal such as smear may be caused.

Therefore, the present disclosure suppresses a light leakage into the light charge accumulation portion of the unit pixel and reduces image noise.

According to a first aspect of the present disclosure, there is provided a solid-state imaging device including a pixel array portion in which multiple unit pixels are arranged on a semiconductor substrate, the multiple unit pixels each including a photoelectric conversion portion generating and accumulating a light charge based on a quantity of received light and a charge accumulation portion accumulating the light charge. At least part of an electrode closer to an incidence side on which light enters the unit pixel of the charge accumulation portion, is formed with a metal film functioning as a light blocking film.

The metal film has a two-layer structure and a first layer adjacent to a capacity insulating film of the charge accumulation portion may have a higher work function and a lower light blocking effect than a second layer.

It may be possible to simultaneously expose the multiple unit pixels and a charge accumulated in the photoelectric conversion portion in an exposure period is accumulated in the charge accumulation portion.

The charge accumulation portion may accumulate a charge overflown from the photoelectric conversion portion during the exposure period.

The charge accumulation portion is formed so as to include a first charge accumulation portion including a flush-mounted MOS capacitor and a second charge accumulation portion including a surface-type MOS capacitor, and the metal film forms a light blocking film with respect to the first charge accumulation portion and an electrode closer to the incidence side of the second charge accumulation portion.

The light blocking film with respect to the first charge accumulation portion and the electrode of the second charge accumulation portion may be separately arranged in the unit pixel.

The light blocking film with respect to the first charge accumulation portion and the electrode of the second charge accumulation portion may be set to different potentials.

According to a second aspect of the present disclosure, there is provided a method of producing a solid-state imaging device including a pixel array portion in which multiple unit pixels are arranged on a semiconductor substrate, where the multiple unit pixels each include a photoelectric conversion portion generating and accumulating a light charge based on a quantity of received light, a first charge accumulation portion including a flush-mounted MOS capacitor and accumulating the light charge, and a second charge accumulation portion including a surface-type MOS capacitor and accumulating the light charge, the method including a first process of forming a light blocking film, and a second process of processing the light blocking film to form a light blocking film with respect to the first charge accumulation portion and an electrode closer to an incidence side on which light enters the unit pixel of the second charge accumulation portion.

According to a second aspect of the present disclosure, there is provided an electronic apparatus including a solid-state imaging device including a pixel array portion in which multiple unit pixels are arranged on a semiconductor substrate, where the multiple unit pixels each include a photoelectric conversion portion generating and accumulating a light charge based on a quantity of received light and a charge accumulation portion accumulating the light charge and at least part of an electrode closer to an incidence side on which light enters the unit pixel of the charge accumulation portion is formed with a metal film functioning as a light blocking film, and a signal processing portion performing signal processing on a signal output from the unit pixel.

According to the first or third aspect of the present disclosure, light entering the unit pixel of the charge accumulation portion is blocked by an electrode close to the incidence side on which the light enters the unit pixel of the charge accumulation portion.

According to the second aspect of the present disclosure, a light blocking film is formed and the light blocking film is processed, thereby forming a light blocking film with respect to the first charge accumulation portion and an electrode closer to the incidence side on which light enters the unit pixel of the second charge accumulation portion.

According to the first to third aspects of the present disclosure, it is possible to suppress a light leakage into a charge accumulation portion of a unit pixel and reduce image noise.

DETAILED DESCRIPTION OF THE EMBODIMENT(S)

Figure 1:
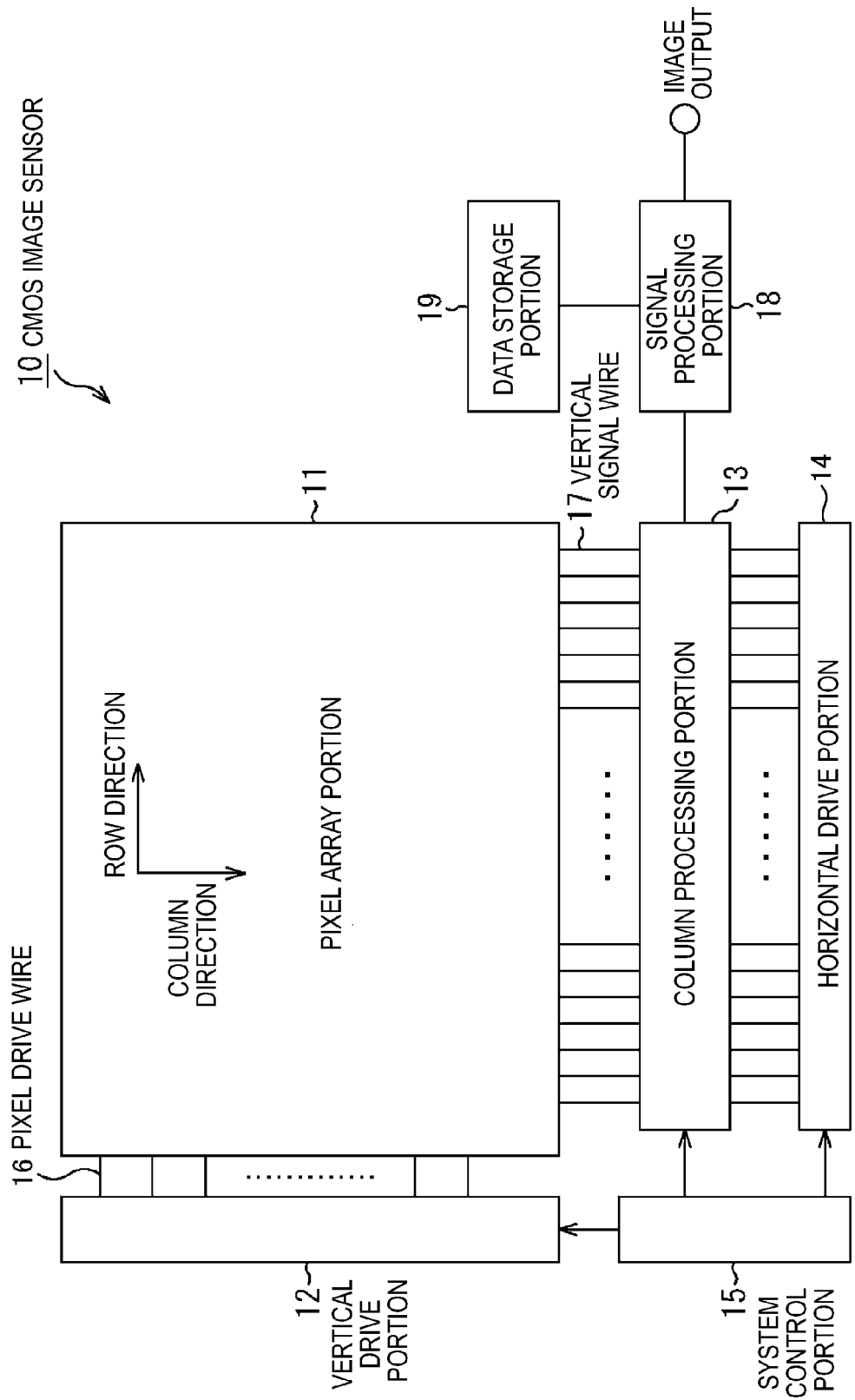
FIG. 1 is a system configuration view illustrating a configuration outline of a CMOS image sensor to which the present disclosure is applied.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

1. SOLID-STATE IMAGING DEVICE TO WHICH THE PRESENT DISCLOSURE IS APPLIED 1-1. Basic System Configuration FIG. 1 is a system configuration view illustrating a configuration outline of a solid-state imaging device to which the present disclosure is applied, such as a CMOS image sensor which is a kind of a solid-state imaging device of an X-Y addressing scheme. Here, the CMOS image sensor denotes an image sensor created by applying CMOS process or using part of it.

A CMOS image sensor 10 according to the present application example has a configuration including a pixel array portion 11 formed on a semiconductor substrate (i.e. chip) (not illustrated) and peripheral circuit portions collected on the same semiconductor substrate as that of the pixel array portion 11. The peripheral circuit portions include, for example, a vertical drive portion 12, a column processing portion 13, a horizontal drive portion 14 and a system control portion 15.

The CMOS image sensor 10 further includes a signal processing portion 18 and a data storage portion 19. The signal processing portion 18 and the data storage portion 19 may be mounted on the same substrate as that of the CMOS image sensor 10 or arranged on a different substrate from that of the CMOS image sensor 10. Also, each processing in the signal processing portion 18 and the data storage portion 19 may be performed by software or an external signal processing portion set on a different substrate from that of the CMOS image sensor 10, such as a DSP (Digital Signal Processor) circuit.

The pixel array portion 11 has a configuration in which unit pixels (which may be simply referred to as "pixels" below) each having a photoelectric conversion portion that generates and accumulates light charges based on a quantity of received light are arranged in a two-dimensional manner in the row and column directions, i.e. in a matrix manner. Here, the row direction denotes the pixel arrangement direction of pixel rows (i.e. horizontal direction) and the column direction denotes the pixel arrangement direction of pixel columns (i.e. vertical direction). A specific circuit configuration and pixel configuration of the unit pixel will be described later.

In the pixel array portion 11, a pixel drive wire 16 is wired along the row direction every pixel row and a vertical signal wire 17 is wired along the column direction every pixel column, in the matrix pixel arrangement. The pixel drive wire 16 transmits a drive signal that performs driving at the time of reading a signal from a pixel. Although FIG. 1 illustrates the pixel drive wire 16 as one wire, it is not limited to one wire. One end of the pixel drive wire 16 is connected to the output terminal corresponding to each row of the vertical drive portion 12.

The vertical drive portion 12 is configured with a shift register, an address decoder and so on, and drives all pixels of the pixel array portion 11 at the same time or drives the pixels of the pixel array portion 11 in a row unit. That is, the vertical drive portion 12 and the system control portion 15 to control the vertical drive portion 12 form a drive portion to drive each pixel of the pixel array portion 11. Although illustration of a specific configuration of this vertical drive portion 12 is omitted, it generally has a configuration including two scanning systems of a reading scanning system and a sweeping scanning system.

The reading scanning system selectively and sequentially scans unit pixels of the pixel array portion 11 in row units to read signals from the unit pixels. The signal read from the unit pixel is an analog signal. The sweeping scanning system performs sweeping scanning with respect to the reading rows subjected to reading scanning in the reading scanning system, earlier than the reading scanning by the time of the shutter speed.

By the sweeping scanning in this sweeping scanning system, unnecessary charges are swept from a photoelectric conversion portion of the unit pixel of a reading row and therefore the photoelectric conversion portion is reset. Subsequently, by the sweeping (resetting) of unnecessary charges in this sweeping scanning system, a so-called electronic shutter operation is performed. Here, the electronic shutter operation denotes an operation of discarding light charges of photoelectric conversion portions and starting an exposure (i.e. starting an accumulation of light charges) anew.

A signal read by the reading operation in the reading scanning system corresponds to the quantity of light received after the previous reading operation or electronic shutter operation. Subsequently, a period between the reading timing by the previous reading operation or the sweeping timing by the electronic shutter operation and the reading timing of the current reading operation is an exposure period of light charges in unit pixels.

The signal output from each unit pixel of the pixel row selectively scanned by the vertical drive portion 12 is input in the column processing portion 13 via each vertical signal wire 17 every pixel column. The column processing portion 13 performs predetermined signal processing on the signal output from each pixel of a selected row via the vertical signal wire 17, every pixel column of the pixel array portion 11, and temporarily holds the pixel signal after the signal processing.

To be more specific, as signal processing, the column processing portion 13 performs at least noise removal processing such as CDS (Correlated Double Sampling) processing. The CDS processing by this column processing portion 13 removes reset noise or fixed pattern noise unique to pixels such as threshold variation of amplification transistors in pixels. In addition to the noise removal processing, for example, the column processing portion 13 can have an AD (analog-to-Digital) conversion function so as to convert an analog pixel signal into a digital signal and output it.

The horizontal drive portion 14 includes a shift register, an address decoder and so on, and selects unit circuits corresponding to the pixel columns of the column processing portion 13 in order. By the selective scanning in this horizontal drive portion 14, pixel signals subjected to signal processing every unit circuit in the column processing portion 13 are output in order.

The system control portion 15 includes a timing generator to generate various timing signals and performs drive control of the vertical drive portion 12, the column processing portion 13 and the horizontal drive portion 14 based on the various timings generated in the timing generator.

The signal processing portion 18 has at least a computation processing function and performs various kinds of signal processing such as computation processing on a pixel signal output from the column processing portion 13. In preparation for signal processing in the signal processing portion 18, the data storage portion 19 temporarily stores data requested in the processing.

The CMOS image sensor 10 having the above configuration adopts a global exposure to execute the exposure start and the exposure end at the same timings with respect to all pixels in the pixel array portion 11. That is, the collective exposure of all pixels is possible in the CMOS image sensor 10. This global exposure is executed under the driving by the drive portion formed with the vertical drive portion 12 and the system control portion 15. The global shutter function that realizes the global exposure is a shutter operation suitable for the case of taking an image of a subject that moves at high speed or the case of the sensing use requesting synchronism in a taken image.

1-2. Other System Configurations

The CMOS image sensor 10 to which the present disclosure is applied is not limited to the above system configuration. As other system configurations, the following system configuration can be provided.

Figure 2:
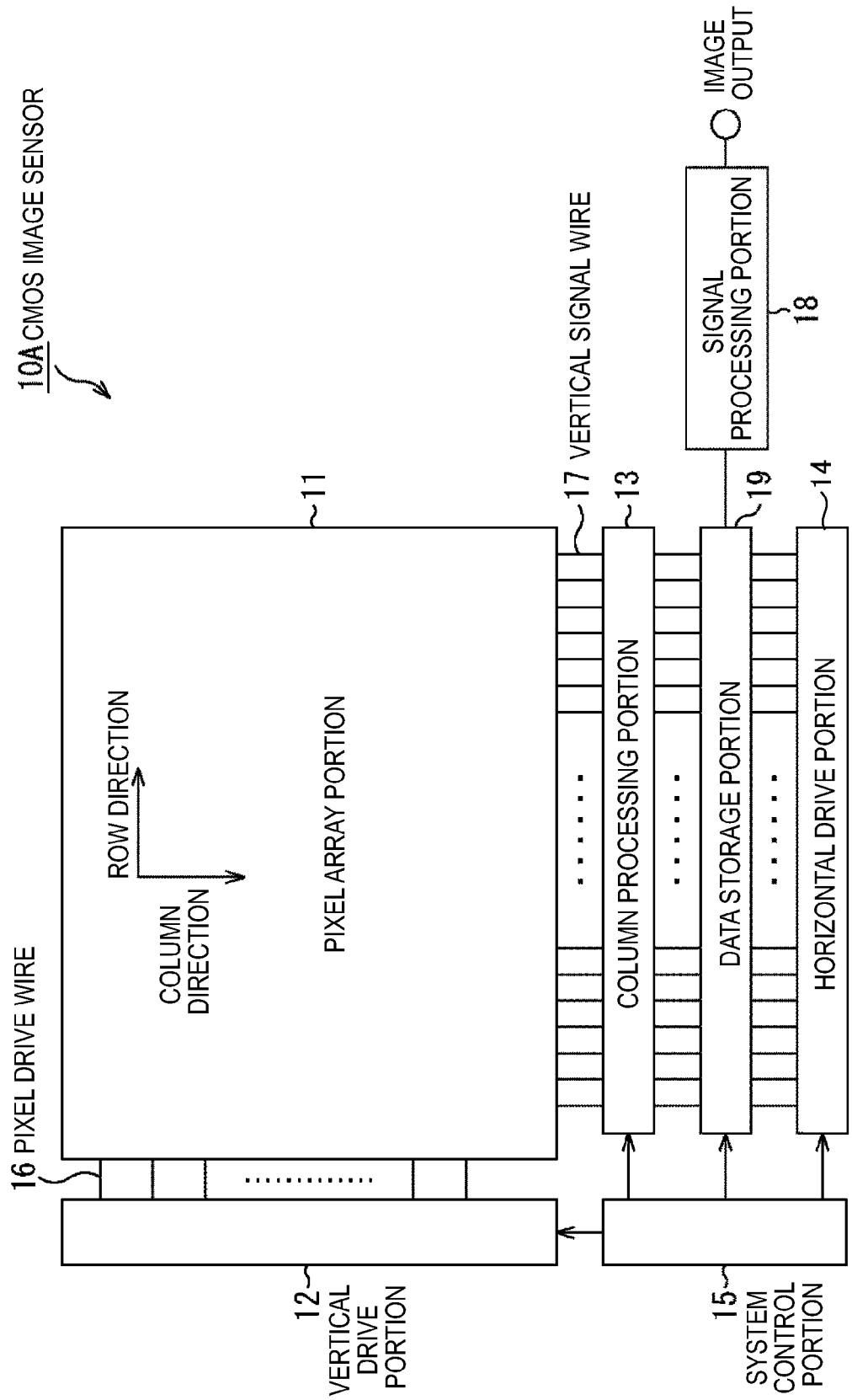
FIG. 2 is a system configuration view (version 1) illustrating another system configuration of the CMOS image sensor to which the present disclosure is applied.

For example, as illustrated in FIG. 2, it is possible to provide a CMOS image sensor 10A having a system configuration in which the data storage portion 19 is arranged after the column processing portion 13 and a pixel signal output from the column processing portion 13 is supplied to the signal processing portion 18 via the data storage portion 19.

Figure 3:
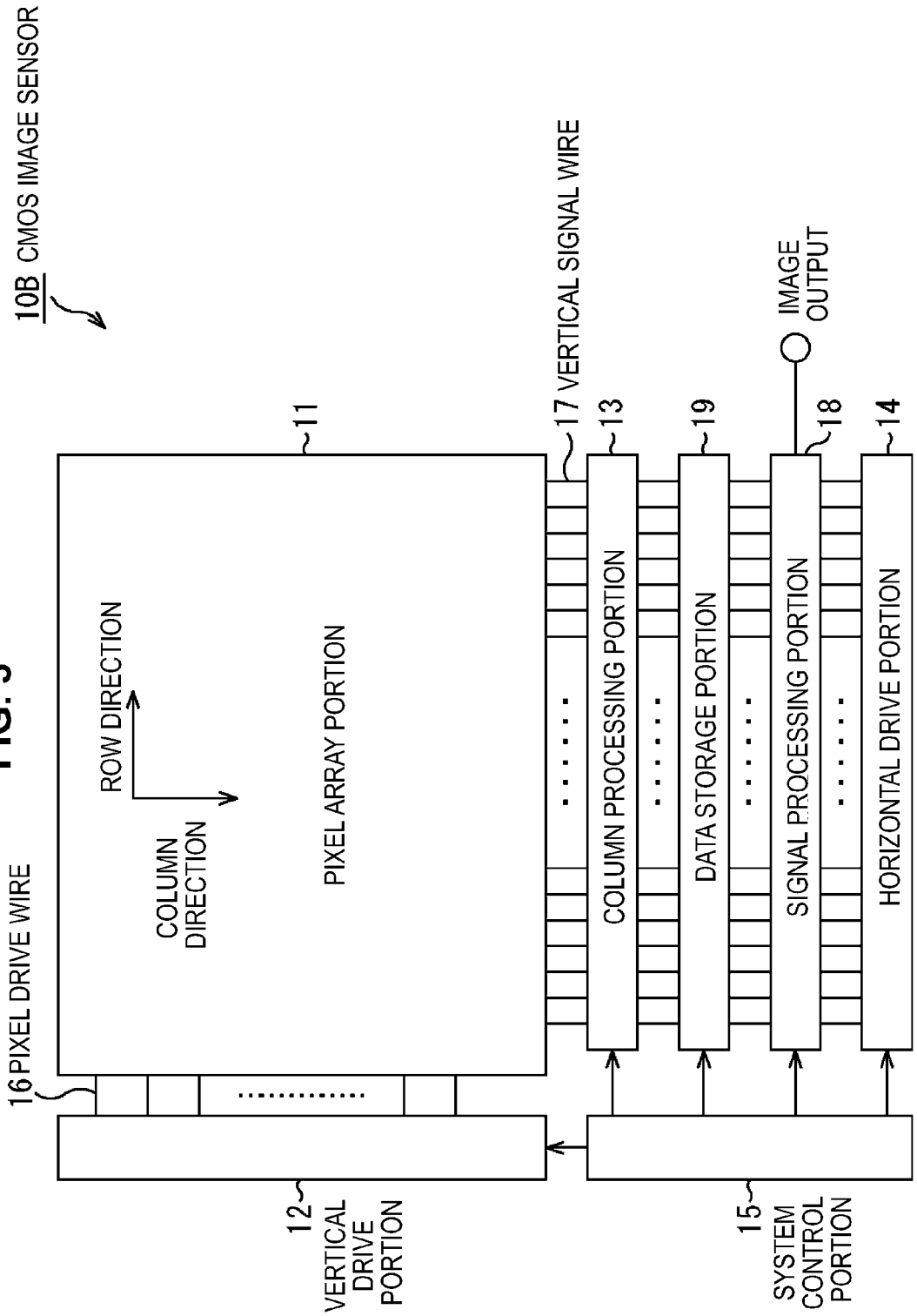
FIG. 3 is a system configuration view (version 2) illustrating another system configuration of the CMOS image sensor to which the present disclosure is applied.

Further, as illustrated in FIG. 3, it is possible to provide a CMOS image sensor 10B having a system configuration in which the column processing portion 13 has an AD conversion function to perform AD conversion every column or columns of the pixel array portion 11 and the data storage portion 19 and the signal processing portion 18 are arranged in parallel with respect to the column processing portion 13.

2. EXPLANATION RELATED TO EMBODIMENTS

To realize the global exposure, compared to the related art that realizes the global exposure, the solid-state imaging device (e.g. CMOS image sensor) according to an embodiment has two charge accumulation portions of first and second charge accumulation portions in a unit pixel to maintain a larger saturated charge amount without degrading image quality of a taken image at dark situation or low illumination. Subsequently, a flush-mounted MOS capacitor is used as the first charge accumulation portion and a capacitor of a larger capacity value per unit area than that of the first charge accumulation portion is used as the second charge accumulation portion.

Preferably, regarding the first charge accumulation portion and the second charge accumulation portion, the amount relationship of saturated charge amounts is set as follows. That is, regarding the first charge accumulation portion, it is preferable that the saturated charge amount be smaller than the saturated charge amount of the photoelectric conversion portion.

When the saturated charge amount of the first charge accumulation portion is made smaller than the saturated charge amount of the photoelectric conversion portion, the difference amount is compensated in the second charge accumulation portion. Therefore, a sum of the saturated charge amount of the second charge accumulation portion and the saturated charge amount of the first charge accumulation portion is requested to be equal to or larger than the saturated charge amount of the photoelectric conversion portion.

As described above, by holding the two charge accumulation portions of the first and second charge accumulation portions in a unit pixel, using the flush-mounted MOS capacitor as the first charge accumulation portion and using the capacitor of a larger capacity value per unit area than that of the first charge accumulation portion as the second charge accumulation portion, the following operational effect can be acquired.

That is, compared to a case where a flush-mounted MOS capacitor is formed on the same area as an area combining the first charge accumulation portion and the second charge accumulation portion, it is possible to largely increase the value of capacity in which it is possible to accumulate light charges, that is, it is possible to maintain a larger saturated charge amount. Further, the flush-mounted MOS capacitor is used with respect to signals at low illumination, they are less influenced by the interface state and defection, and, compared to the related art that realizes the global exposure, dark-situation characteristics are not degraded. Therefore, the image quality of taken images at low illumination is not degraded.

As a result of this, for example, it is possible to realize a CMOS image sensor having a global shutter function that fulfills performance equivalent to that of a CMOS image sensor without the global function of the identical unit pixel size. Also, for example, compared to a CMOS image sensor having the global shutter function of the identical unit pixel size in the related art, it is possible to realize a CMOS image sensor in which the dynamic range is largely expanded.

2-1. Reason why it is Possible to Increase Total Capacity Value of Charge Accumulation Portion by Dividing Charge Accumulation Portion Thus, by using the flush-mounted MOS capacitor as the first charge accumulation portion and the capacitor of a larger capacity value per unit area than that of the first charge accumulation portion as the second charge accumulation portion, it is possible to increase the total capacity value of the charge accumulation portion. Here, the reason why it is possible to increase the total capacity value of the charge accumulation portion will be explained using one numerical value example.

For example, a case is considered where a capacitor with an area of 1 $\mu m^2$ is formed. When the capacity value per unit area of the first charge accumulation portion is 1 fF/$\mu m^2$, the capacity value per unit area of the second charge accumulation portion is 10 fF/$\mu m^2$ and the overall capacitor with an area of 1 $\mu m^2$ is formed by the first charge accumulation portion, the capacity value of the capacitor with an area of 1 $\mu m^2$ is 1 fF.

At this time, when a half of the area of 1 $\mu m^2$ is replaced with the second charge accumulation portion, the capacity value of the capacitor with the area of 1 $\mu m^2$ becomes 5.5 fF (=½ $\mu m^2 \times 1$ fF+½ $\mu m^2 \times 10$ fF). That is, when a half of the area is replaced with the second charge accumulation portion, the capacity value of the capacitor with an area of 1 $\mu m^2$ is 5.5 times larger than that in a case where it is not replaced.

Further, when three quarters of the area of 1 $\mu m^2$ is replaced with the second charge accumulation portion, the capacity value of the capacitor with an area of 1 $\mu m^2$ is 7.75 fF, which is 7.75 times larger than that in a case where it is not replaced. Also, in a case where a half of the area of 1 $\mu m^2$ is replaced with the second charge accumulation portion, when the capacity value per unit area of the second charge accumulation portion is 20 fF/$\mu m^2$, the capacity value of the capacitor with an area of 1 $\mu m^2$ is 10.5 fF, which is 10.5 times larger than that in a case where it is not replaced.

However, since a capacitor of a larger capacity value per unit area has much leakage current as a whole, there is a problem that, in the second charge accumulation portion, the degradation of dark-situation characteristics such as a dark current and white spot becomes significant. Therefore, when light charges are transferred from the photoelectric conversion portion to all pixels at the same time, light charges at low luminance are accumulated in the first charge accumulation portion. Here, the "light charges at low luminance" mean light charges equal to or smaller than the saturated charge amount of the first charge accumulation portion. Since the first charge accumulation portion is formed with the flush-mounted capacitor, it is less influenced by the interface state and defection and therefore has better dark-situation characteristics than the second charge accumulation portion.

Also, light charges at high illumination are accumulated in both the first charge accumulation portion and the second charge accumulation portion. Here, the "light charges at high illumination" means light charges over the saturated charge amount of the first charge accumulation portion. At high illumination at which a treated charge amount is large, since high S/N is maintained, there is less influence of dark-situation characteristics such as a dark current and white spot. Therefore, even if light charges at high illumination are accumulated in the second charge accumulation portion in which there is a large leakage current, there is extremely less influence on image quality.

As clear from the above explanation, by using the flush-mounted MOS capacitor as the first charge accumulation portion and the capacitor of a larger capacity value per unit area than that of the first charge accumulation portion as the second charge accumulation portion, it is possible to maintain a larger saturated charge amount. By contrast, in a case where the equivalent saturated charge amount is acceptable, it is possible to reduce the unit pixel size by the saved space.

Further, at the time of simultaneously reading all pixels, light charges at low illumination are accumulated in the first charge accumulation portion of good dark-situation characteristics such as a dark current and white spot, while light charges at high illumination are accumulated in the second charge accumulation portion of poor dark-situation characteristics. Therefore, compared to the related art that realizes the global exposure, image quality of taken images at dark situation or low illumination is not degraded.

As an example of a capacitor having a larger capacity value per unit area than that of the first charge accumulation portion, that is, as an example of a capacitor having a larger capacity value per unit area than that of the flush-mounted MOS capacitor, there is a surface-type MOS capacitor.

2-2. Explanation of Capacitor Having Large Capacity Value Per Unit Area

Here, an explanation will be given to a difference between the flush-mounted MOS capacitor forming the first charge accumulation portion and, for example, the surface-side MOS capacitor forming the second charge accumulation portion.

Figure 4:
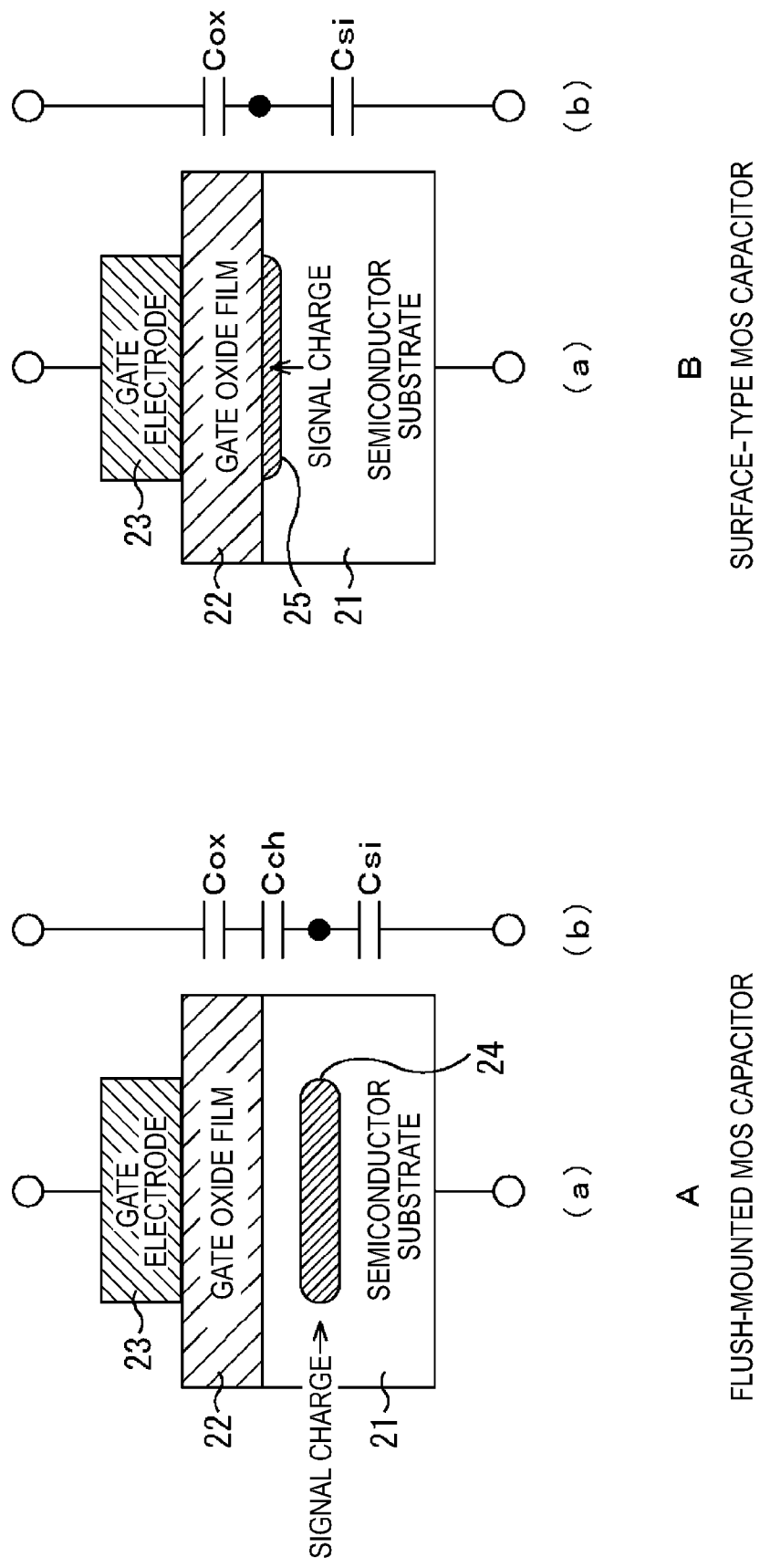
FIG. 4 is an explanatory diagram of a flush-mounted MOS capacitor and a surface-side MOS capacitor.

FIG. 4 illustrates a flush-mounted MOS capacitor A and a surface-side MOS capacitor B. Also, in FIG. 4A and FIG. 4B, drawing (a) illustrates the cross-sectional configuration of each MOS capacitor and drawing (b) illustrates the equivalence circuit of each MOS capacitor.

As illustrated in FIG. 4A and FIG. 4B, in the both MOS capacitors, a gate electrode 23 is arranged on a semiconductor substrate 21 through the intermediary of a gate oxide film 22. Subsequently, the flush-mounted MOS capacitor A employs a configuration in which a charge accumulation area 24 to charge signal charges is formed in a deep part of the semiconductor substrate 21, and, the surface-type MOS capacitor B employs a configuration in which a charge accumulation area 25 is formed on the substrate surface of the semiconductor substrate 21.

In each drawing (b) in FIG. 4A and FIG. 4B, Cox represents the capacity value of the gate oxide film 22, Cch represents the capacity value between the substrate surface and the charge accumulation area, and Csi represents the capacity value between the charge accumulation area and the substrate.

(In the Case of Flush-Mounted Capacitor)

When the capacity value per unit area of the charge accumulation area 24 is Cb, the capacity value Cb is represented by following Equation (1).

$$Cb = Cox \cdot Cch / (Cox + Cch) + Csi \quad (1)$$
$$= Cox \cdot \{1/(1 + Cox/Cch)\} + Csi$$

Here, if it is assumed that the capacity value Csi between the charge accumulation area and the substrate is sufficiently small, Equation 1 is approximated by following Equation (2).

$$Cb \approx Cox \cdot \{1/(1+Cox/Cch)\} \quad (2)$$

(In the Case of Surface-Type Capacitor)

When the capacity value per unit area of the charge accumulation area is Cs, the capacity value Cs is represented by following Equation (3).

$$Cs = Cox + Csi \quad (3)$$

Here, if it is assumed that the capacity value Csi between the charge accumulation area and the substrate is sufficiently small, as illustrated in following Equation (4), it can be approximated by the capacity value Cox of the gate oxide film 22.

$$Cs \approx Cox \quad (4)$$

That is, the magnitude relationship between the capacity value Cb per unit area of the charge accumulation area 24 and the capacity value Cs per unit area of the charge accumulation area 25 is Cb<Cs, and, by embedding the charge accumulation area from the substrate surface into the substrate, the capacity value becomes small. To put it the other way around, by taking the charge accumulation area from the inside of the substrate to the substrate surface, the capacity value becomes large.

(Explanation for Method of Increasing Capacity Value Per Unit Area by Material)

The capacity value Cox per unit area of the gate oxide film 22 is represented by following Equation (5).

$$Cox = \epsilon ox / tox \quad (5)$$

Here, $\epsilon ox$ represents the permittivity of the gate oxide film 22 and tox represents the film thickness of the gate oxide film 22.

Although the film thickness tox of the gate oxide film 22 is important in terms of pressure resistance or leakage amount, by using a material of higher permittivity in the identical film thickness, it is possible to increase the capacity value Cox per unit area. Examples of the material of higher permittivity include the following materials.

$Si_3N_4$: Relative permittivity of 7
$Ta_2O_5$: Relative permittivity of 26
$HfO_2$: Relative permittivity of 25
$ZrO_2$: Relative permittivity of 25

Since the product of the vacuum permittivity and the relative permittivity is the permittivity of each material, taking into consideration a ratio of the relative permittivity with respect to $SiO_2$ (relative permittivity of 3.9), it is possible to estimate an increment of the capacity value per unit area. For example, with an assumption of the surface-type MOS capacitor, when $Si_3N_4$ of the same film thickness as $SiO_2$ is used instead, the capacity value per unit area is increased by 1.8 times, and, when $Ta_2O_5$ is used, the capacity value per unit area is increased by 6.7 times.

(Explanation for Method of Increasing Capacity Value Per Unit Area by Configuration)

Also, as a configuration, by combining a plurality of capacitor configurations, it is possible to increase the capacity value per unit area. Examples of the combined configuration include the configurations illustrated in FIG. 5, that is, a configuration A combining a planar-type MOS capacitor and a junction-type capacitor, and a configuration B combining a planar-type MOS capacitor and a stack-type capacitor.

First, the combined configuration A will be explained. For example, a P-type well 52 is formed on an N-type semiconductor substrate 51. An N+-type semiconductor area 41 as an intermediate electrode is formed on the surface layer part of the P-type well 52, and the junction-type MOS capacitor is formed between the N+-type semiconductor area 41 and the P-type well 52 as a lower electrode. Further, by arranging an upper electrode 42 on the substrate surface through the intermediary of an insulating film 53, a planar-type MOS capacitor is formed in parallel with the junction-type MOS capacitor. That is, the second charge accumulation portion 40 is formed by connecting the planar-type MOS capacitor and the junction-type capacitor in parallel.

Next, the combined configuration B will be explained. Regarding the first charge accumulation portion 30, the same planar-type MOS capacitor as in the case of the combined configuration A is used. Regarding the second charge accumulation portion 40, the planar-type MOS capacitor is formed in an area separated by element isolation insulating films 55 and 56, and, furthermore, the stack-type capacitor is formed in the upper layer by parallel connection.

To be more specific, the P+-type (or N+-type) semiconductor area 43 as a lower electrode is formed on the surface layer part of the P-type well 52 and an intermediate electrode 45 is formed on the semiconductor area 43 through the intermediary of a capacity insulating film 44. This configuration is a configuration of the planar-type MOS capacitor. Further, the upper electrode 47 is formed on the intermediate electrode 45 through the intermediary of a capacity insulating film 46. This configuration is a configuration of the stack-type capacitor. The intermediate electrode 45 is electrically connected to the N+-type semiconductor area 41 by a wire 57.

According to this combined configuration B, that is, according to a configuration combining the planar-type MOS capacitor and the stack-type capacitor, it is possible to form a capacitor of a larger capacity value per unit area.

(Other Configuration Examples of Second Charge Accumulation Portion)

Figure 5:
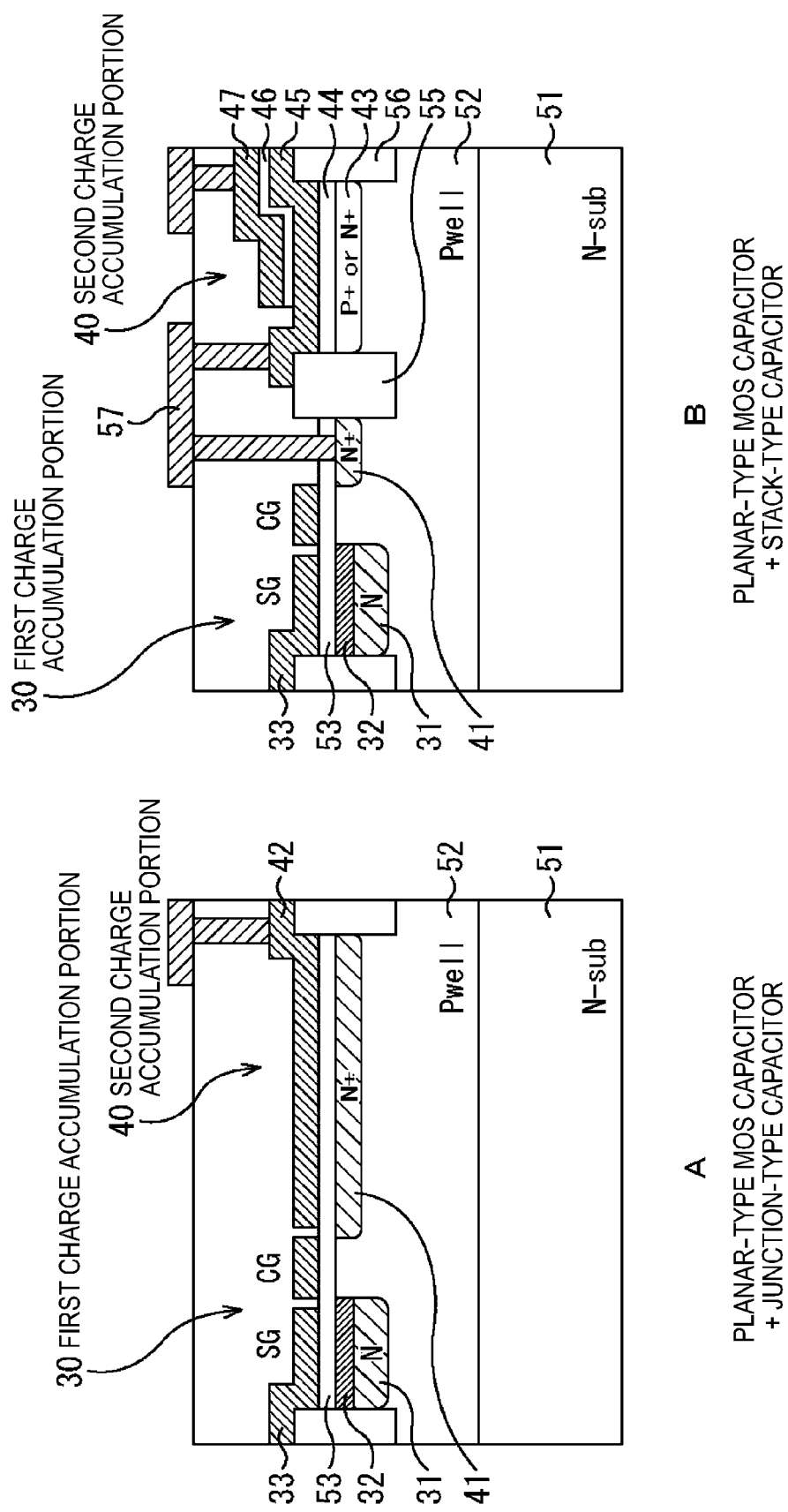
FIG. 5 is an explanatory diagram of a combination of multiple capacitor configurations.
Figure 6:
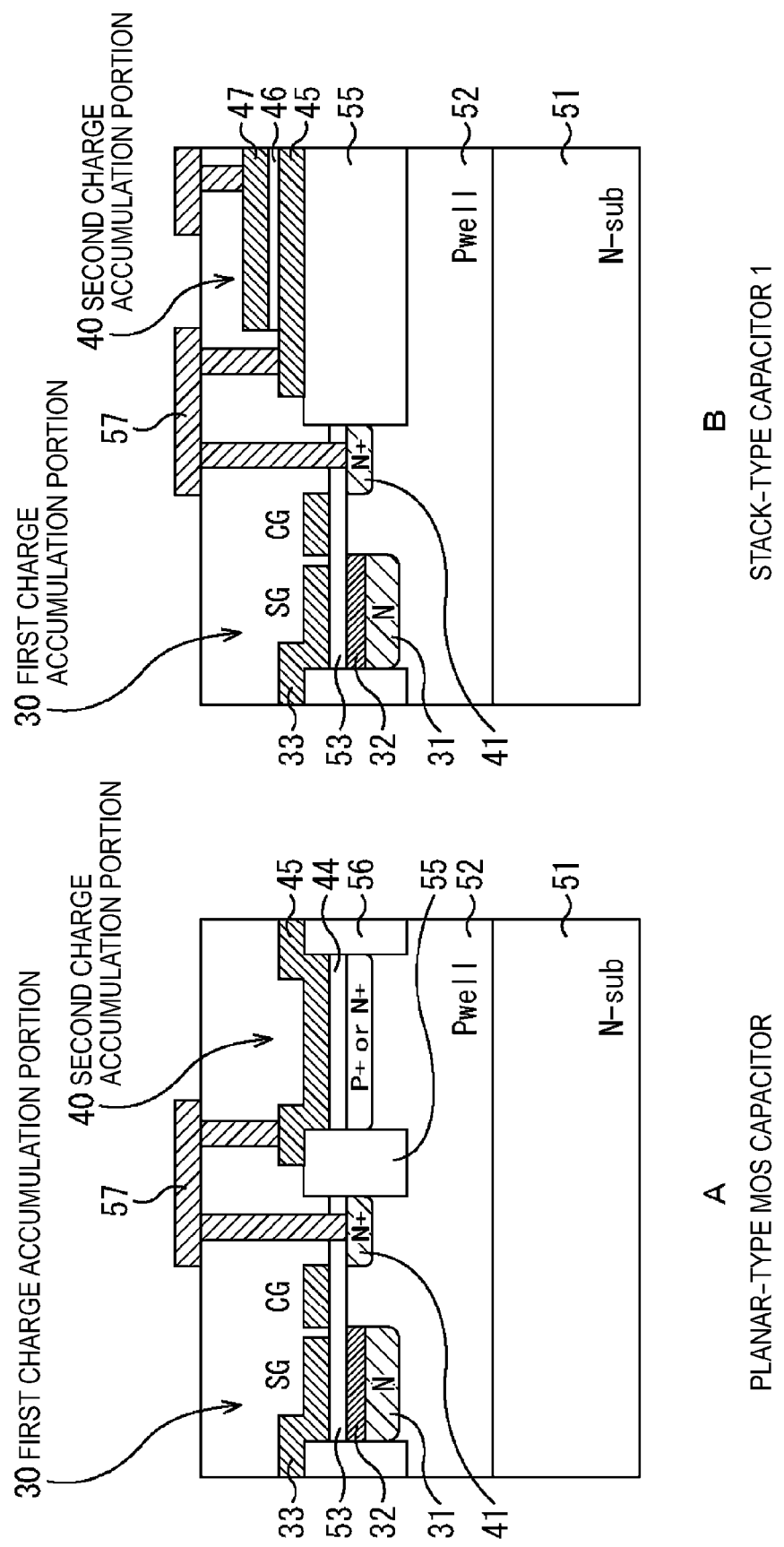
FIG. 6 is a cross-sectional view (version 1) illustrating another configuration example of a second charge accumulation portion.
Figure 7:
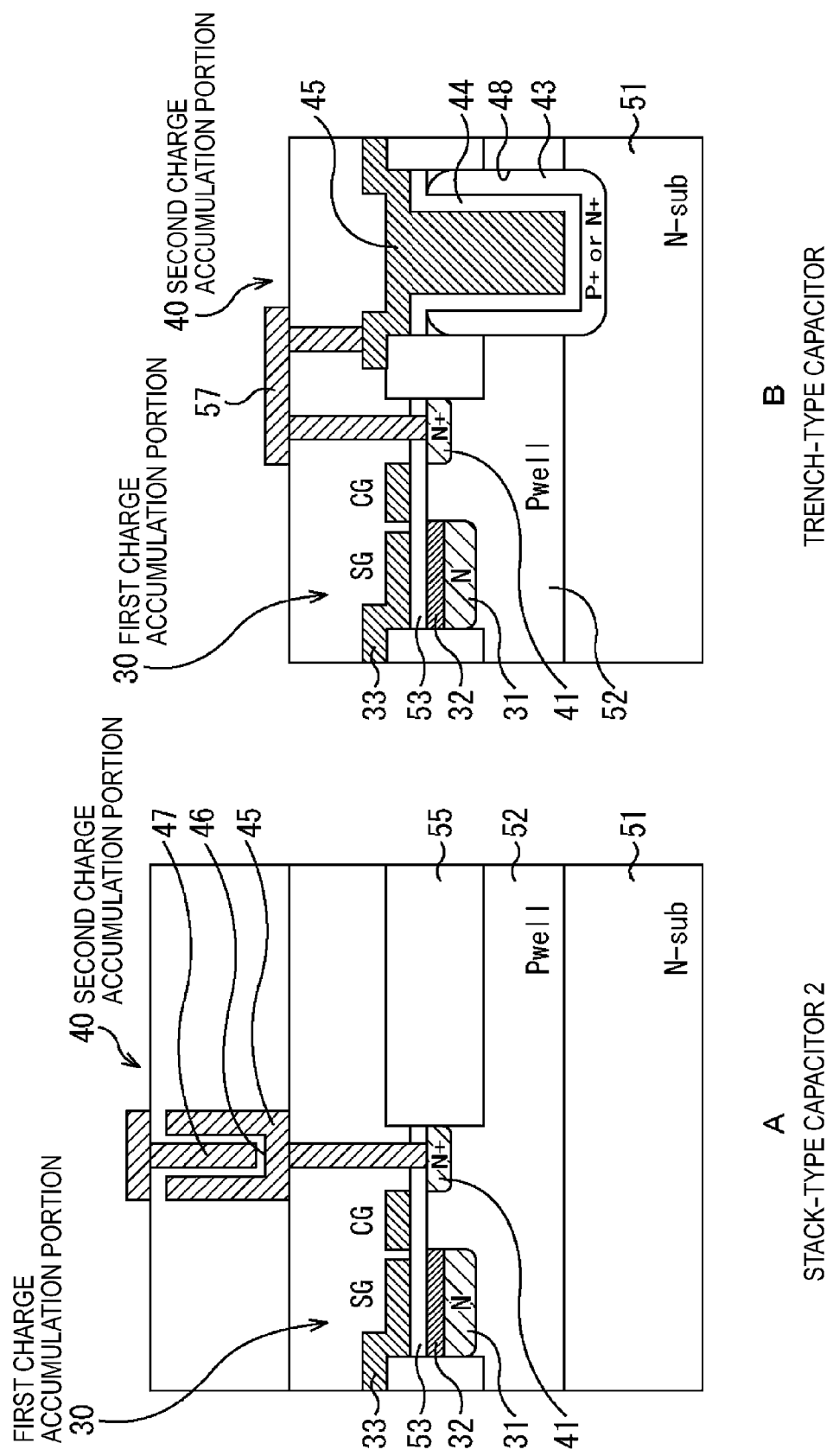
FIG. 7 is a cross-sectional view (version 2) illustrating another configuration example of the second charge accumulation portion.

FIG. 6 and FIG. 7 illustrate other configuration examples of the second charge accumulation portion 40. In FIG. 6 and FIG. 7, the same reference numerals are assigned to the same components as in FIG. 5.

FIG. 6A is a cross-sectional view illustrating a configuration of a planar-type MOS capacitor. The planar MOS capacitor forming the second charge accumulation portion 40 has a configuration in which the P+-type (or N+-type) semiconductor area 43 as a lower electrode is formed on the surface layer part of the P-type well 52 and the upper electrode 45 is formed on the semiconductor area 43 through the intermediary of the capacity insulating film 44.

FIG. 6B is a cross-sectional view illustrating a configuration of a stack-type capacitor 1. The stack-type capacitor 1 forming the second charge accumulation portion 40 has a configuration in which a lower electrode 45 is formed on the element isolation insulating film 55 and the upper electrode 47 is formed on the lower electrode 45 through the intermediary of the capacity insulating film 46.

FIG. 7A is a cross-sectional view illustrating a configuration of a stack-type capacitor 2. The stack-type capacitor 2 forming the second charge accumulation portion 40 has a configuration in which the lower electrode 45 having a U-shaped cross-sectional surface is electrically connected to the N+-type semiconductor area 41 and the upper electrode 47 is inserted in this lower electrode 45 through the intermediary of the capacity insulating film 46.

In the case of this configuration of the stack-type capacitor 2, a source voltage is applied to the upper electrode 47 or the upper electrode 47 is earthed. According to the stack-type capacitor 2 including the lower electrode 45 having a U-shaped cross-sectional surface and the upper electrode 47 embedded in the lower electrode 45, there is an advantage that it is possible to maintain a larger facing area contributing to a capacitance than a normal stack-type capacitor such as the stack-type capacitor 1.

FIG. 7B is a cross-sectional view illustrating a configuration of a trench-type capacitor. The trench-type capacitor forming the second charge accumulation portion 40 has a configuration in which a trench 48 that penetrates the P-type well 52 and reaches the substrate 51 is formed and a capacitor is formed in this trench 48.

To be more specific, it has a configuration in which the N+-type (or P+-type) semiconductor area 43 as a lower electrode is formed in the inner wall of the trench 48, the inner wall of the semiconductor are 43 is covered with the capacity insulating film 44 and the upper electrode 45 is embedded through the intermediary of the capacity insulating film 44.

Further, the second charge accumulation portion 40 is formed with a planar-type MOS capacitor, junction-type capacitor, stack-type capacitor or trench-type capacitor alone or a combination of these in which part or all of the capacity insulating film is formed with a material of a higher permittivity than that of the silicon oxide film. Examples of the material of a higher permittivity than that of the silicon oxide film ($SiO_2$) include $Si_3N_4$, $Ta_2O_5$, $HfO_2$, $ZrO_2$, and so on.

As described above, although a configuration example of the second charge accumulation portion 40 has been explained based on FIG. 6 and FIG. 7, the configuration of the second charge accumulation portion 40 is not limited to the configuration example, and, in order to enhance the capacity in a memory capacitor of DRAM or the like, it is possible to employ various methods that have been developed before.

(Explanation for Suppressing Light Leakage into Charge Accumulation Portion)

Next, with reference to FIG. 8 to FIG. 10, a method of suppressing a light leakage into the first charge accumulation portion 30 and the second charge accumulation portion 40 will be explained.

Figure 8:
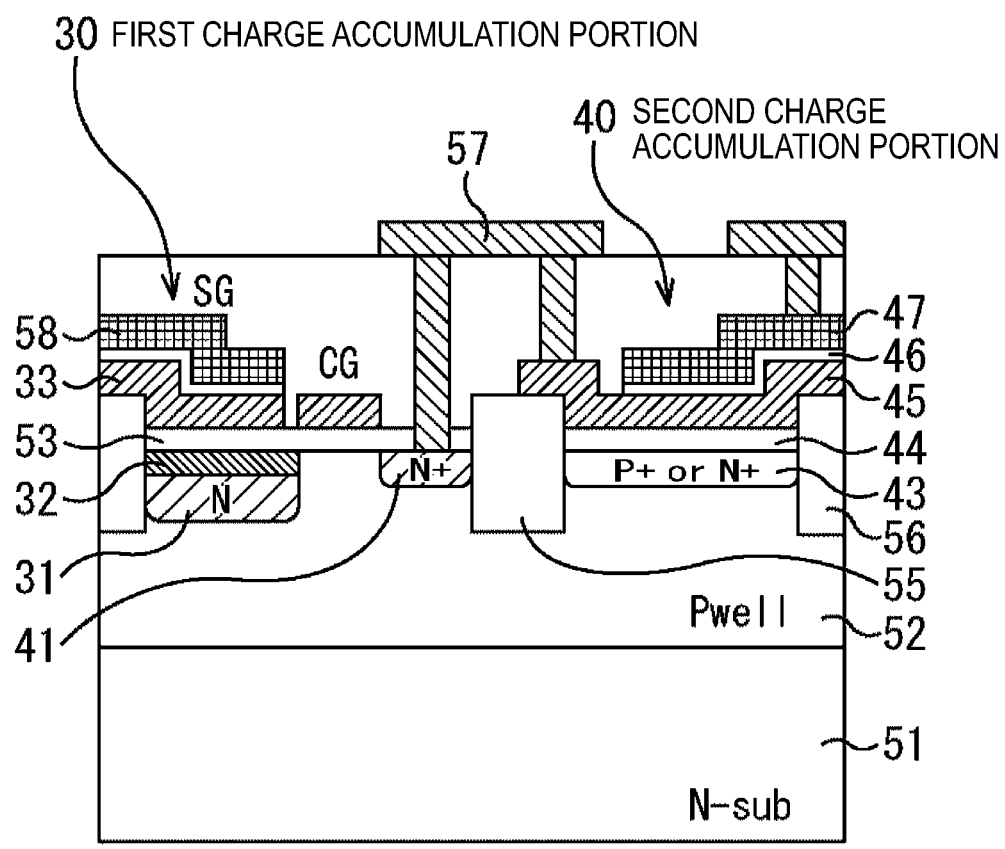
FIG. 8 is a cross-sectional view (version 1) illustrating another configuration example of multiple capacitor structures.

FIG. 8 illustrates an example of a capacitor structure in which a light leakage into the first charge accumulation portion 30 and the second charge accumulation portion 40 is suppressed with respect to the capacitor structure in FIG. 5B.

The capacitor structure in FIG. 8 differs from the capacitor structure in FIG. 5B in providing a material of the upper electrode 47 and a light blocking film 58.

The upper electrode 47 and the light blocking film are formed with metal films having a light blocking effect such as w (wolfram). Alternatively, the upper electrode 47 and the light blocking film 58 can be formed with metal films subjected to barrier metal such as W/TiN/Ti, Al/TiN/Ti and Cu/TaN.

The upper electrode 47 is arranged in the closest position to the side on which light enters the unit pixel among the electrodes of the second charge accumulation portion 40 (hereinafter referred to as "incidence side"), and also functions as a light blocking film with respect to incident light in the unit pixel. Therefore, by the upper electrode 47, a light leakage into the second charge accumulation portion 40 is suppressed and it is possible to suppress an occurrence of false signals such as smear.

Also, by using part of metal films used for a light blocking film as the upper electrode 47, it is possible to efficiently increase the capacity of the second charge accumulation portion 40 and enlarge the image dynamic range.

Here, the upper electrode 47 is connected to the P+-type (or N+-type) semiconductor area 43 by a wire (not illustrated), for example, and a predetermined source voltage is applied or the upper electrode 47 is earthed.

Also, the light blocking film 58 is arranged in a position closer to the incidence side than the gate electrode 33 arranged in the closest position to the incidence side among the electrodes of the first charge accumulation portion 30, so as to cover the gate electrode 33. Therefore, by the light blocking film 58, a light leakage into the first charge accumulation portion 30 is suppressed and it is possible to suppress an occurrence of false signals such as smear.

Further, the upper electrode 47 and the light blocking film 58 are separately arranged in the unit pixel and not requested to be set to the same potential. Therefore, the freedom degree of arrangement of the upper electrode 47 and the light blocking film 58 is high, which simplifies layout design.

Figure 9:
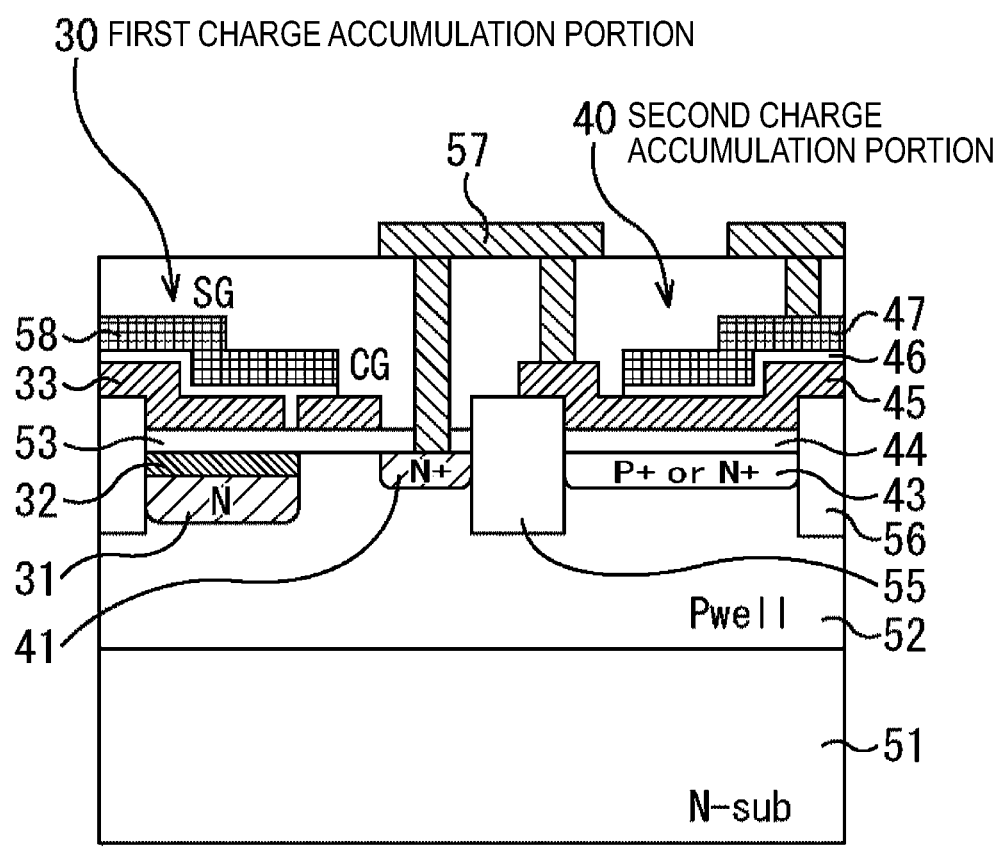
FIG. 9 is a cross-sectional view (version 2) illustrating another configuration example of multiple capacitor structures.

Also, as illustrated in FIG. 9, the light blocking film 58 may be formed so as to overlap not only the gate electrode SG but also part of the upper portion of the adjacent gate electrode CG.

Figure 10:
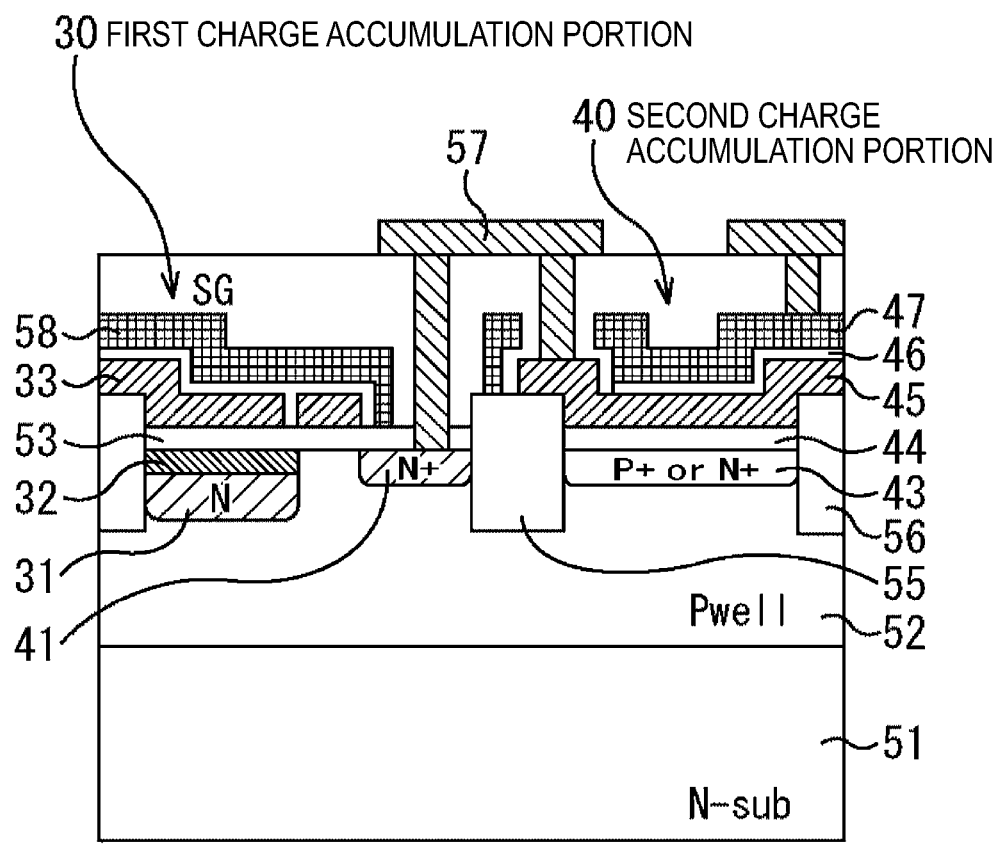
FIG. 10 is a cross-sectional view (version 3) illustrating another configuration example of multiple capacitor structures.

Also, as illustrated in FIG. 10, the upper electrode 47 may be formed so as to cover up to the side surface of the intermediate electrode 45. By this means, it is possible to further suppress a light leakage into the second charge accumulation portion 40.

Similarly, as illustrated in FIG. 10, the light blocking film 58 may be formed so as to cover up to the side surfaces of the gate electrode SG and the gate electrode CG. By this means, it is possible to further suppress a light leakage into the first charge accumulation portion 30.

Also, even for other capacitor structures than the capacitor structure in FIG. 5B, by a similar method, it is possible to suppress a light leakage into the first charge accumulation portion 30 and the second charge accumulation portion 40.

(Method of Suppressing Leakage Current from Charge Accumulation Portion)

Next, with reference to FIG. 11 to FIG. 17, a method of suppressing a leakage current (more accurately, gate leakage current) from the second charge accumulation portion 40 will be explained.

Figure 11:
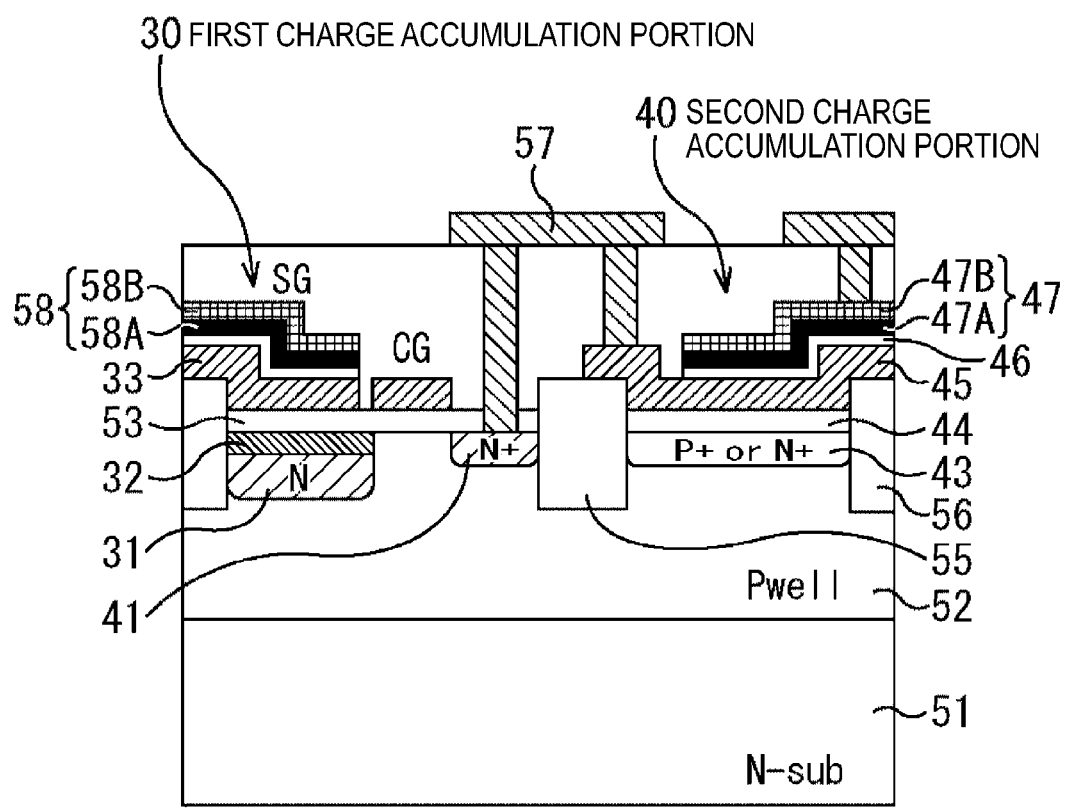
FIG. 11 is a cross-sectional view (version 4) illustrating another configuration example of multiple capacitor structures.

FIG. 11 illustrates a capacitor structure example in which a leakage current from the second charge accumulation portion 40 is suppressed with respect to the capacitor structure in FIG. 8 (or FIG. 5B).

The capacitor structure in FIG. 11 differs from the capacitor structure in FIG. 8 in that the upper electrode 47 and the light blocking film 58 have a two-layer structure.

A first layer 47A adjacent to the capacity insulating film 46 of the upper electrode 47 is formed with a metal film having a higher work function (WF) and lower blocking effect than a second layer 47B. By contrast, the second layer 47B is formed with a metal film having a lower work function and higher blocking effect than the first layer 47A. To be more specific, for example, the first layer 47A is formed with TiN and the second layer 47B is formed with W.

Figure 12:
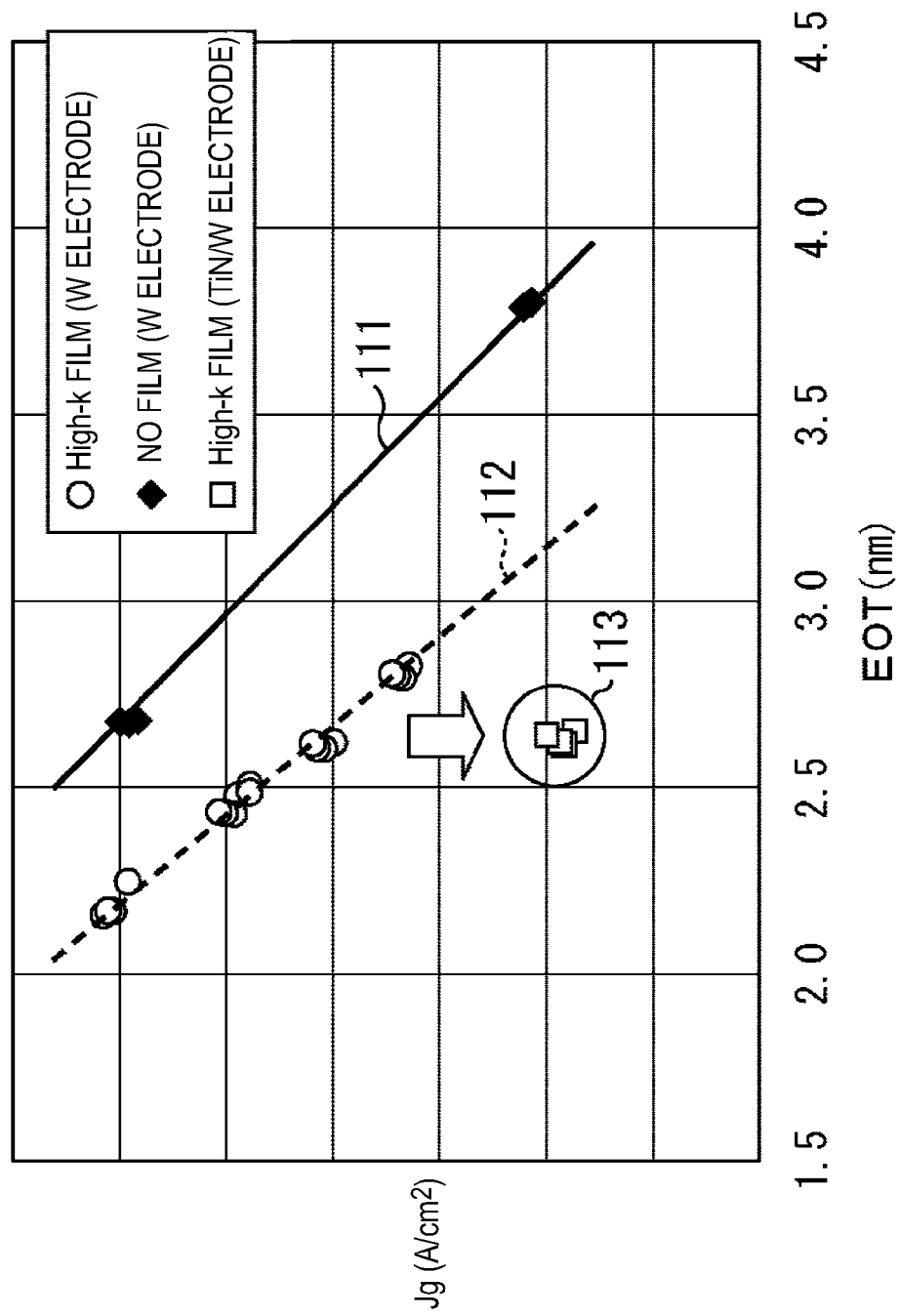
FIG. 12 is a view illustrating a measurement result example of EOT-Jg characteristics with respect to materials forming a capacitor electrode and capacity insulating film.
Figure 13:
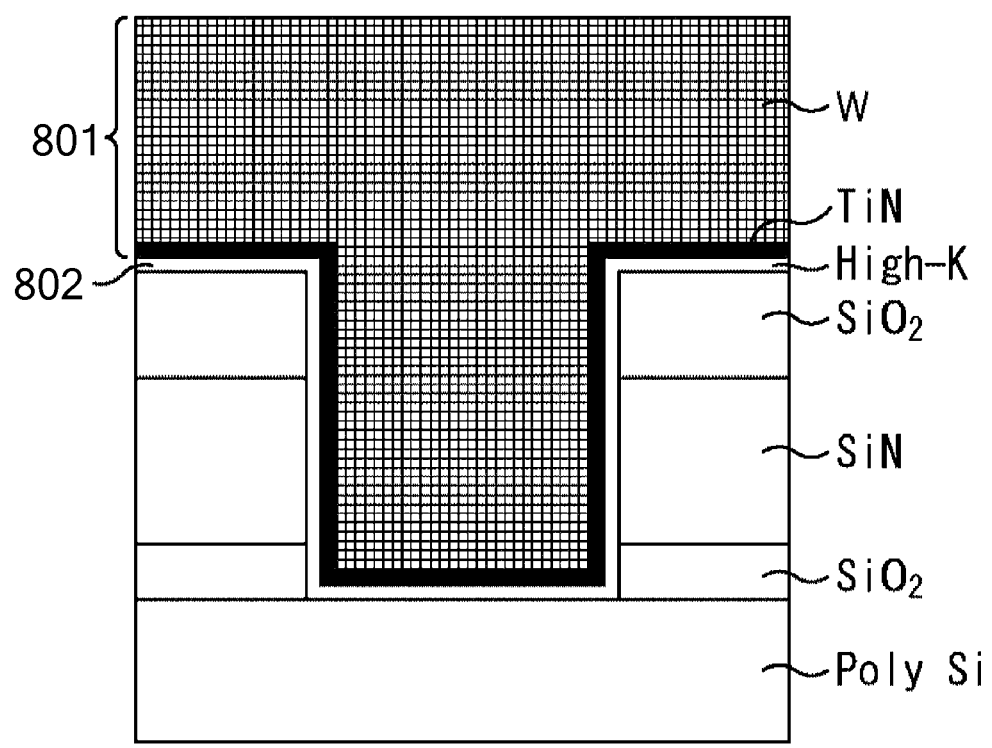
FIG. 13 is a view illustrating a capacitor structure used to measure the EOT-Jg characteristics in FIG. 12.

FIG. 12 illustrates a measurement result example of EOT (Equivalent Oxide Thickness)-Jg characteristics at the time of changing the materials of the electrode 801 and the capacity insulating film 802 the capacitor structure illustrated in FIG. 13.

A characteristic 111 in FIG. 12 indicates an EOT-Jg characteristic in a case where the electrode 801 is formed with a metal film of W and the capacity insulating film 802 is formed with a NO (Nitric Oxide) film. A characteristic 112 indicates an EOT-Jg characteristic in a case where the electrode 801 is formed with a metal film of W and the capacity insulating film 802 formed with a High-k (high electric permittivity gate insulating film). A characteristic 113 indicates an EOT-jg characteristic in a case where, as illustrated in FIG. 13, similar to the upper electrode 47 in FIG. 11, the electrode 801 is formed with a metal film having a two-layer structure of TiN and W and the capacity insulating film 802 is formed with High-k.

From this measurement result of EOT-Jg characteristics, it is found that the leakage current becomes smaller in the case of forming the capacity insulating film 802 with High-k instead of the NO film. Further, it is found that the leakage current becomes smaller in the case of forming the electrode 801 in a two-layer structure of TiN and W instead of a one-layer structure of W.

Here, with reference to FIG. 14, an explanation will be given to a reason why the leakage current is reduced by forming the electrode 801 in the two-layer structure of TiN and W.

Figure 14:
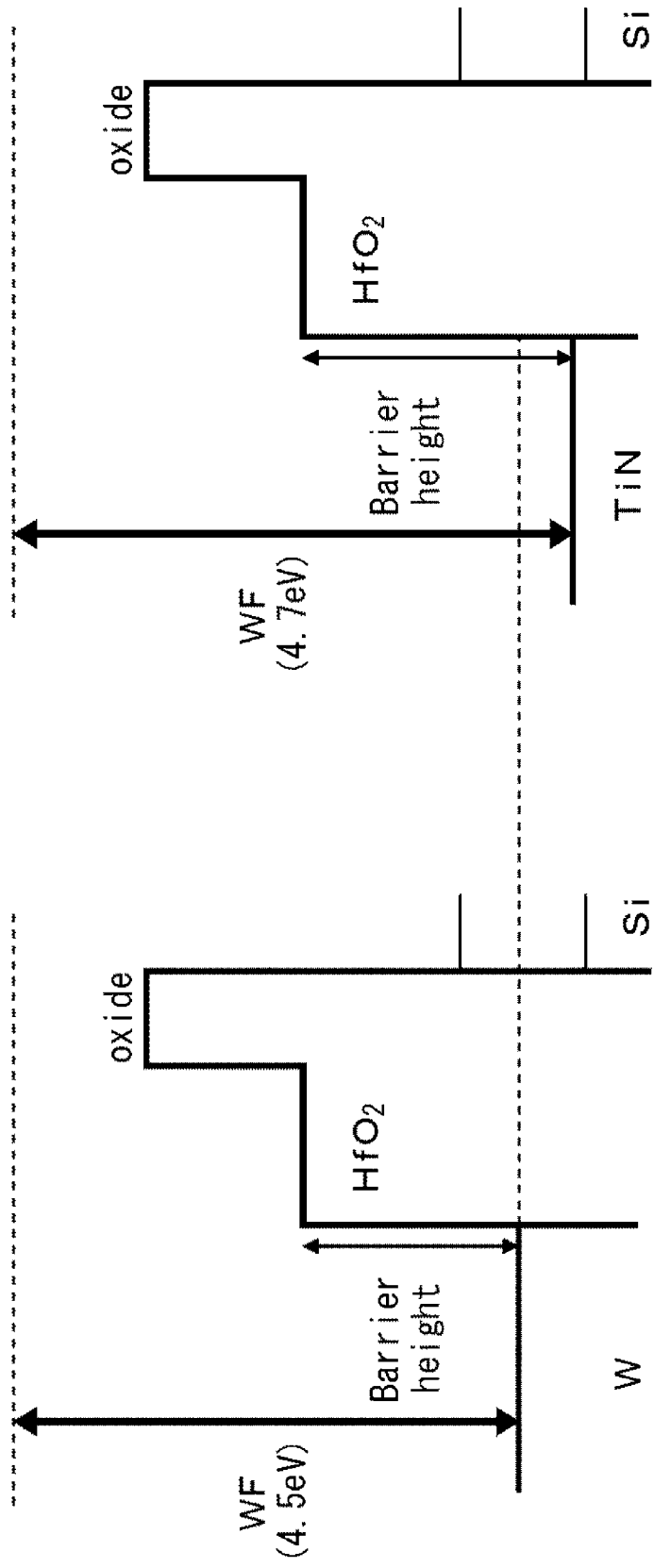
FIG. 14 is a view for explaining a reason why a leakage current is reduced by forming an electrode in a two-layer structure of TiN and W.

FIG. 14 illustrates potential views between the electrode 801 and a silicon substrate in the case of forming the electrode 801 in the one-layer structure of W and forming the electrode 10 in the two-layer structure of TiN and W. The left side illustrates a potential view in the case of forming the electrode 801 in the one-layer structure of W and the right side illustrates a potential view in the case of forming the electrode 10 in the two-layer structure of TiN and W. Also, this example is provided using $H_fO_2$ as the capacity insulating film 802.

For the work function (WF), while W is 4.5 eV, TiN is 4.7 eV, which is higher than W. Therefore, as illustrated in FIG. 14, a barrier between TiN and $H_fO_2$ is higher than a barrier between W and $H_fO_2$. By this means, a movable charge amount between the electrode 801 and the silicon substrate through the capacity insulating film 802 becomes smaller in the case of forming the electrode 801 in the two-layer structure of TiN and W than the case of forming the electrode 801 in the one-layer structure of W, which reduces the leakage current.

Therefore, as illustrated in FIG. 11, by forming the upper electrode 47 of the second charge accumulation portion 40 in the two-layer structure of the first layer 47A of TiN and the second layer 47B of W, it is possible to suppress the leakage current from the second charge accumulation portion 40.

Also, as the first layer 47A becomes thicker, the leakage current decreases while the light quantity leaked in the second charge accumulation portion 40 increases. Therefore, the thickness of the first layer 47A is determined taking into account the trade-off between the leakage current and the light leakage quantity, and set to, for example, 2 to 50 nm.

Similar to the upper electrode 47, the light blocking film 58 is formed with a first layer 58A of TiN and a second layer 58B of W. Here, the light blocking film 58 is not requested to be formed in the second-layer structure.

Figure 15:
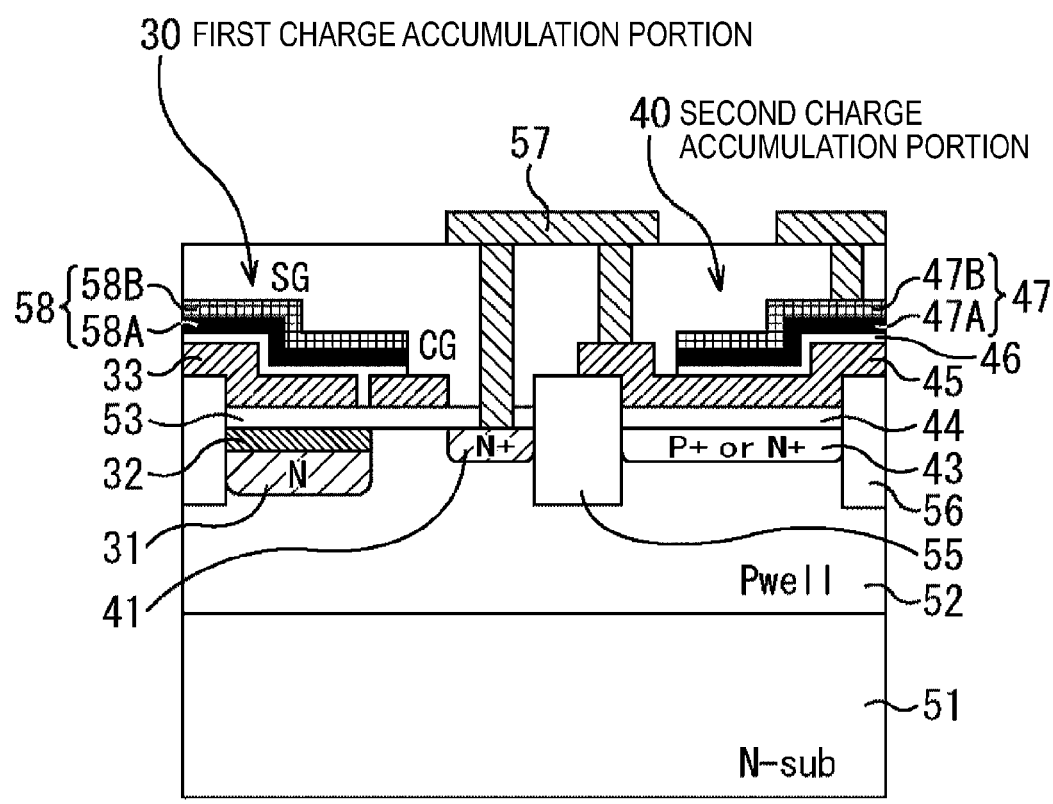
FIG. 15 is a cross-sectional view (version 5) illustrating another configuration example of multiple capacitor structures.
Figure 16:
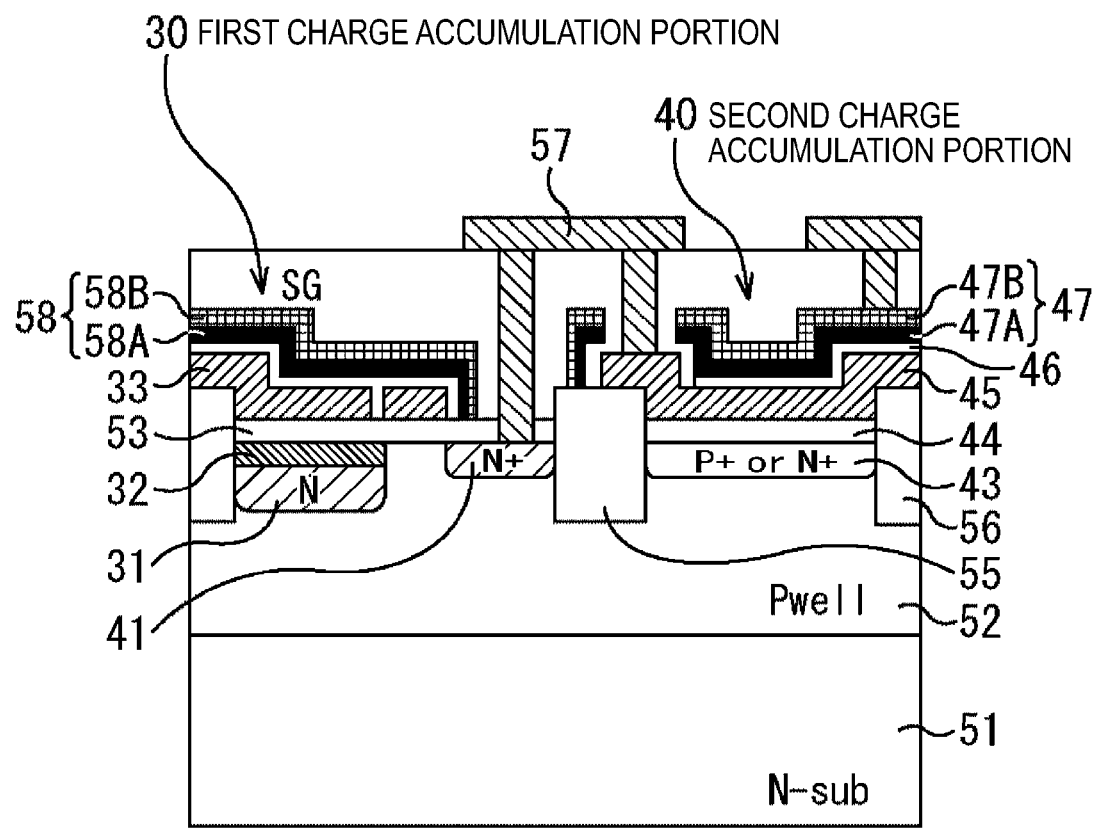
FIG. 16 is a cross-sectional view (version 6) illustrating another configuration example of multiple capacitor structures.

Also, as illustrated in FIG. 15, similar to the capacitor structure in FIG. 9, the upper electrode 47 and the light blocking film 58 may be formed in the two-layer structure. Further, as illustrated in FIG. 16, similar to the capacity structure in FIG. 10, the upper electrode 47 and the light blocking film 58 may be formed in the two-layer structure.

Figure 17:
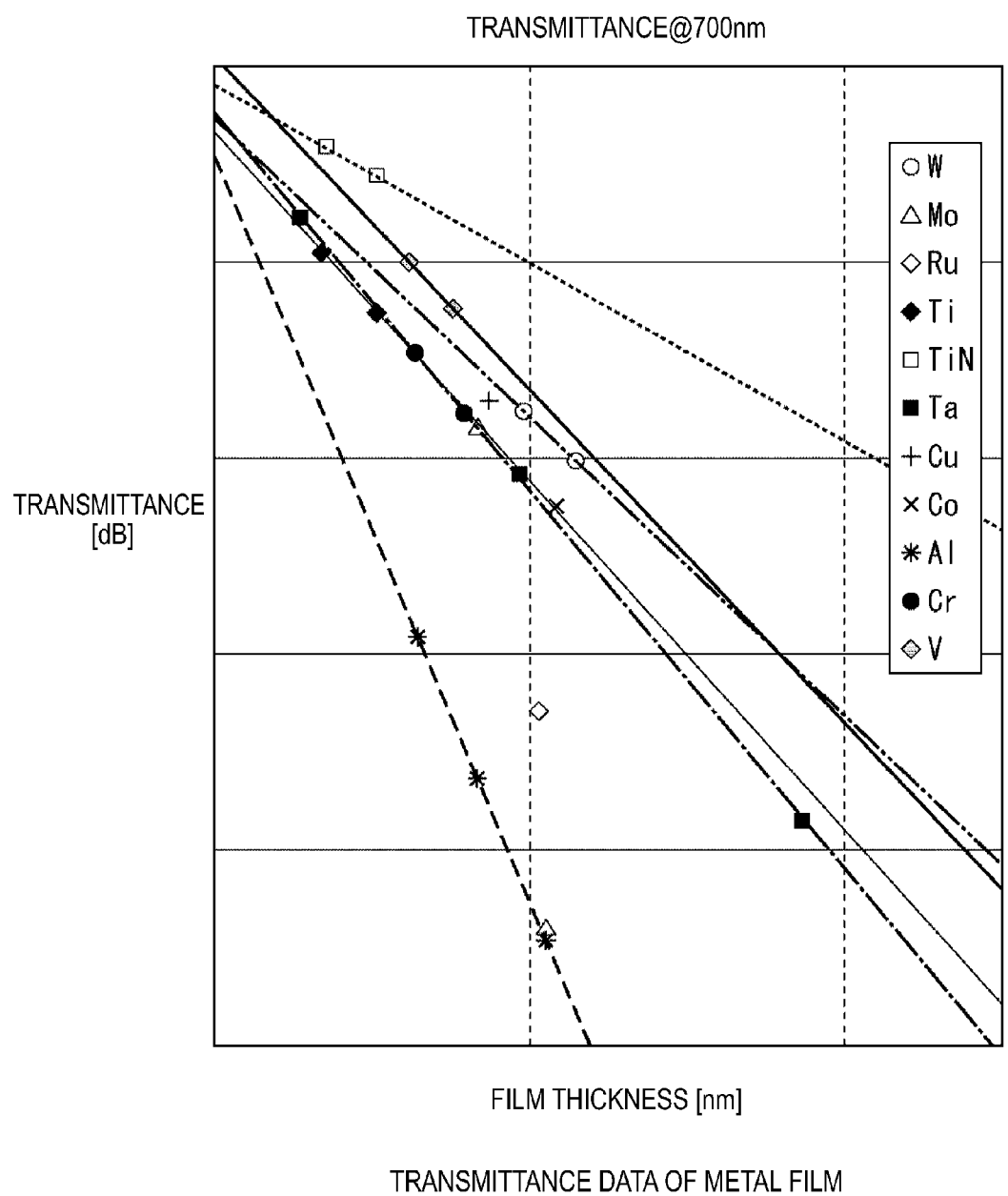
FIG. 17 illustrates data acquired by measuring the metal film transmittance of each material.

FIG. 17 illustrates data acquired by measuring the metal film transmittance of each material with respect to light with a wavelength of 700 nm, as a reference. The horizontal axis represents a film thickness (using nm as a unit) and the vertical axis represents the transmittance (using dB as a unit).

As described above, regarding materials used for the first layer 47A and the second layer 47B of the upper electrode 47, based on the transmittance data and work function data as illustrated in FIG. 17, it is preferable to form the first layer 47A with a metal film having a higher work function and lower blocking effect than the second layer 47B.

Also, even for other capacitor structures than the capacitor structure in FIG. 5B, by a similar method, it is possible to suppress a leakage current from the second charge accumulation portion 40.

2-3. Production Process of Charge Accumulation Portions

Next, with reference to FIG. 18 to FIG. 29, the production process of the first charge accumulation portion 30 and the second charge accumulation portion 40 in FIG. 8 will be explained.

Figure 18:
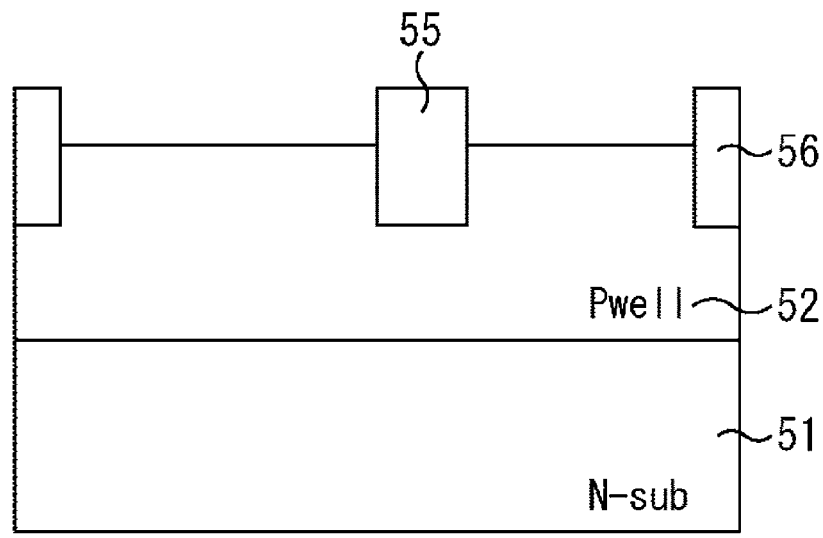
FIG. 18 is an explanatory diagram (version 1) with respect to production process of a first charge accumulation portion and second charge accumulation portion.

First, as illustrated in FIG. 18, an element isolation formation process is performed. By this means, the element isolation insulating films 55 and 56 are formed in the semiconductor substrate (i.e. P-type well 52).

Figure 19:
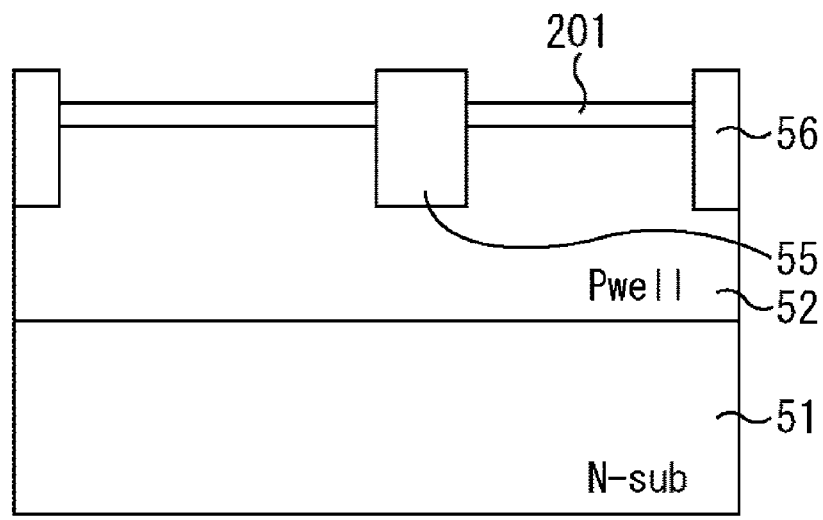
FIG. 19 is an explanatory diagram (version 2) with respect to production process of the first charge accumulation portion and the second charge accumulation portion.

Next, as illustrated in FIG. 19, a sacrificial oxidation process is performed. By this means, a sacrificial oxide film 201 is formed on a surface of the P-type well 52.

Figure 20:
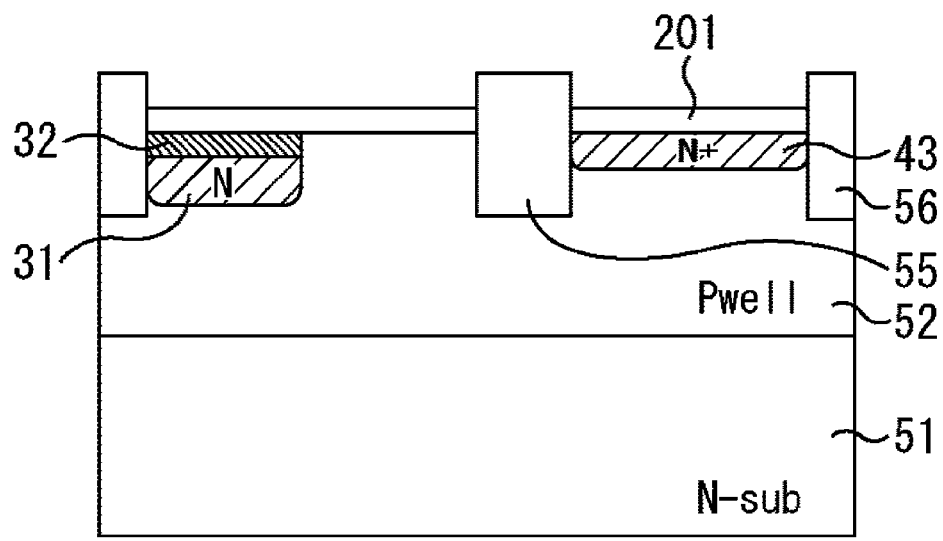
FIG. 20 is an explanatory diagram (version 3) with respect to production process of the first charge accumulation portion and the second charge accumulation portion.

Next, as illustrated in FIG. 20, an ion implant (or ion implantation (I/I)) process before the gate formation is performed. By this means, a two-layer semiconductor area formed with an N-type semiconductor area 31 and P-type semiconductor area 32 is formed on the surface of the P-type well 52. Also, the N+-type semiconductor area 43 is formed on the surface of the P-type well 52.

Figure 21:
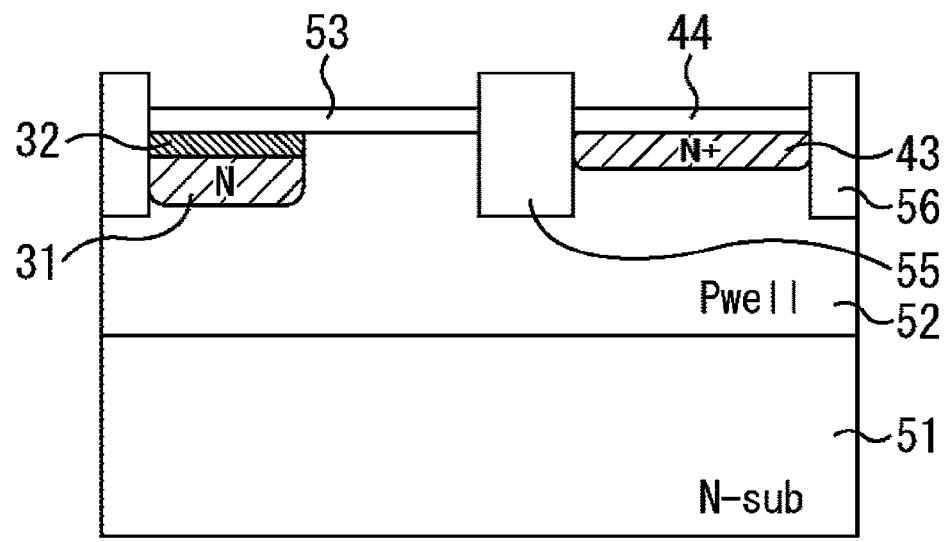
FIG. 21 is an explanatory diagram (version 4) with respect to production process of the first charge accumulation portion and the second charge accumulation portion.

Next, as illustrated in FIG. 21, a gate oxidation process is performed. By this means, the sacrificial oxide film 201 is removed from the surface of the P-type well 52 and the capacity insulating film 44 and the insulating film 53 are formed.

Figure 22:
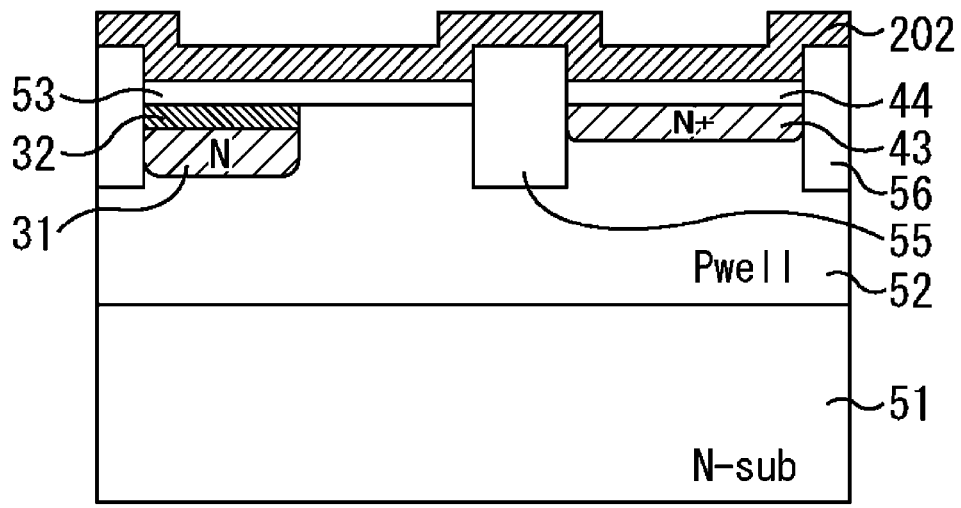
FIG. 22 is an explanatory diagram (version 5) with respect to production process of the first charge accumulation portion and the second charge accumulation portion.

Next, as illustrated in FIG. 22, a gate electrode formation (or deposition) process is performed. By this means, a silicon film 202 to form the gate electrode 33 and the intermediate electrode 45 is formed.

Figure 23:
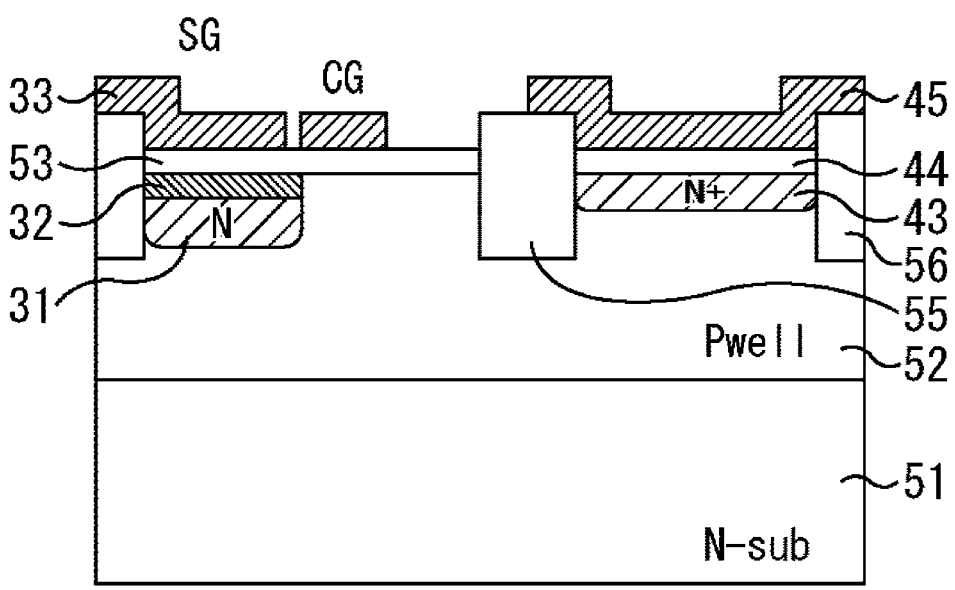
FIG. 23 is an explanatory diagram (version 6) with respect to production process of the first charge accumulation portion and the second charge accumulation portion.

Next, as illustrated in FIG. 23, a gate electrode formation (or etching) process is performed. By this means, the silicon film 202 is processed by etching and the gate electrode 33 and the intermediate electrode 45 are formed.

Figure 24:
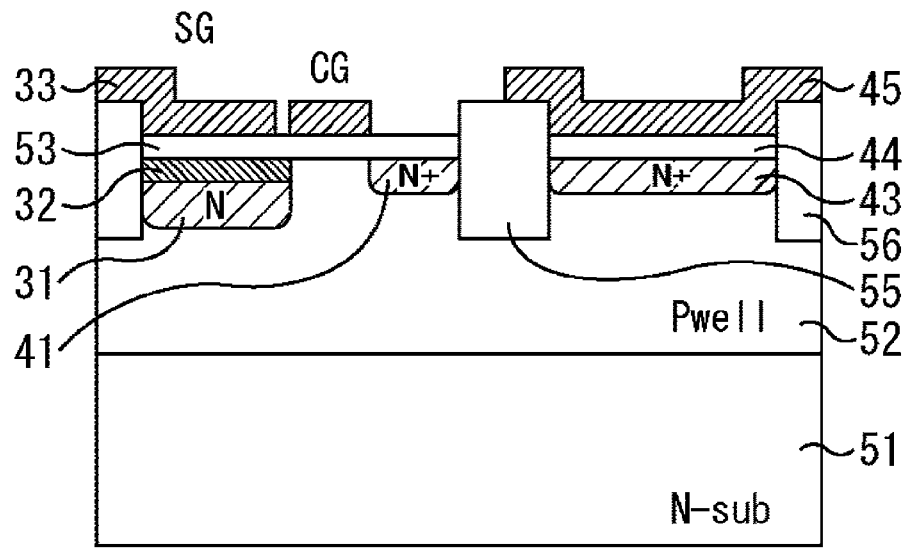
FIG. 24 is an explanatory diagram (version 7) with respect to production process of the first charge accumulation portion and the second charge accumulation portion.

Next, as illustrated in FIG. 24, the ion implantation (I/I) process after the gate formation is performed. By this means, the N+-type semiconductor area 41 is formed on the surface layer part of the P-type well 52.

Figure 25:
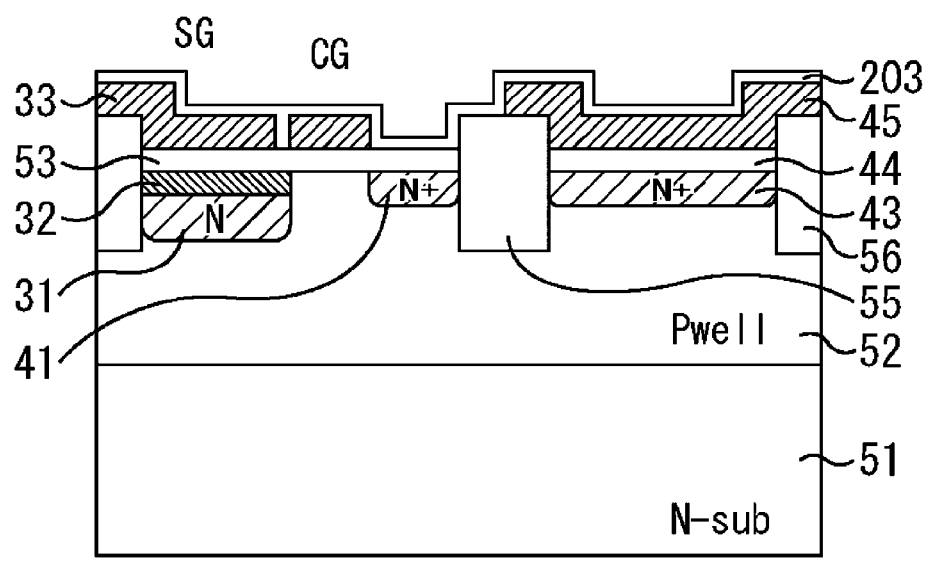
FIG. 25 is an explanatory diagram (version 8) with respect to production process of the first charge accumulation portion and the second charge accumulation portion.

Next, as illustrated in FIG. 25, an insulating film formation (or deposition) process is performed. By this means, an insulating film 203 to form the capacity insulating film 46. The insulating film 203 is formed with, for example, High-k.

Figure 26:
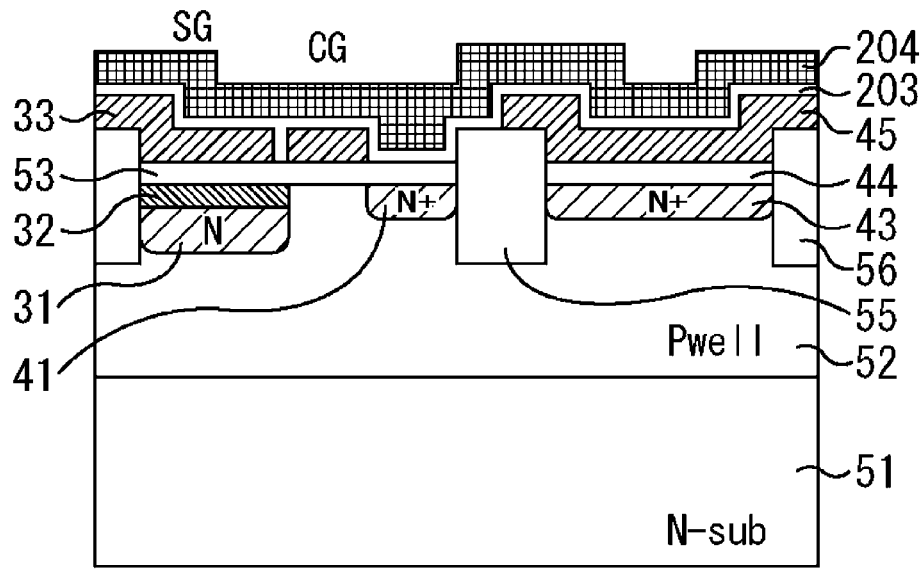
FIG. 26 is an explanatory diagram (version 9) with respect to production process of the first charge accumulation portion and the second charge accumulation portion.

Next, as illustrated in FIG. 26, a light blocking film formation (or deposition) process is performed. By this means, a light blocking film 204 to form the upper electrode 47 and the light blocking film 58 is formed. Also, the light blocking film 58 is formed with a metal film having a light blocking effect such as W, or metal films subjected to barrier metal such as W/TiN/Ti, Al/TiN/Ti and Cu/TaN. Also, in the case of using Cu for the light blocking film 204, it is preferable to set an anti-diffusion film formed with SiN, SiC or SiCN above, below or both above and below the light blocking film 204.

Figure 27:
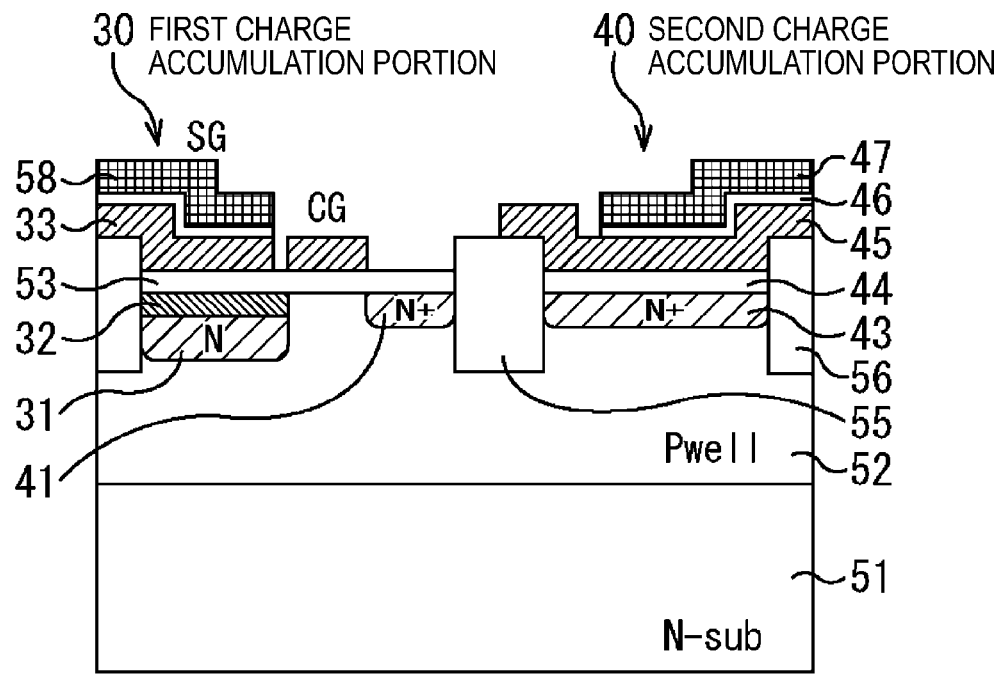
FIG. 27 is an explanatory diagram (version 10) with respect to production process of the first charge accumulation portion and the second charge accumulation portion.

Next, as illustrated in FIG. 27, a light blocking film formation n (or etching) process is performed. By this means, the insulating film 203 and the light blocking film 204 are processed by etching and the capacity insulating film 46, the upper electrode 47 and the light blocking film 58 are formed.

Figure 28:
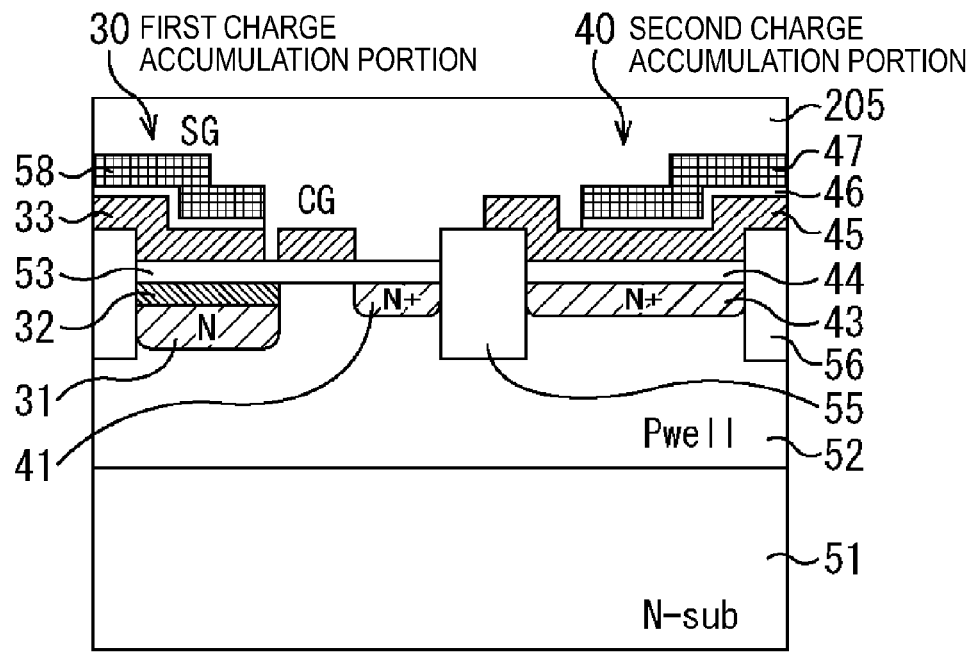
FIG. 28 is an explanatory diagram (version 11) with respect to production process of the first charge accumulation portion and the second charge accumulation portion.

Next, as illustrated in FIG. 28, an interlayer insulating film formation (or deposition) process is performed. By this means, an interlayer insulating film 205 is formed.

Figure 29:
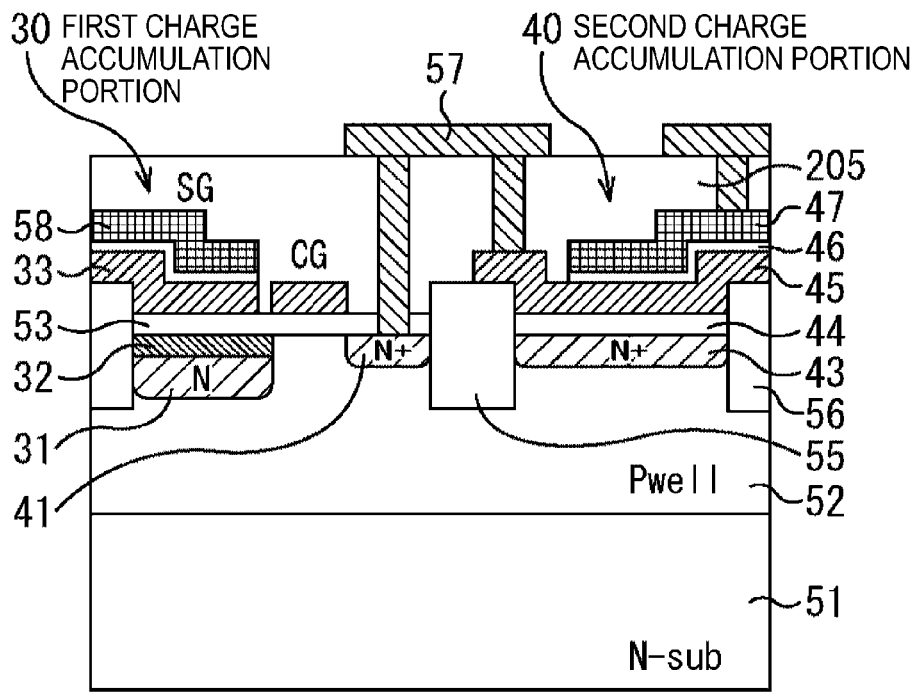
FIG. 29 is an explanatory diagram (version 12) with respect to production process of the first charge accumulation portion and the second charge accumulation portion.

Next, as illustrated in FIG. 29, a wire layer formation process is performed. By this means, after a contact hole is formed on the interlayer insulating film 205, a wire such as a wire 57 is formed. Here, the wire 57 is formed with, for example, Cu, Al or W.

As described above, the first charge accumulation portion 30 and the second charge accumulation portion 40 are formed.

3. EMBODIMENTS

In the following, a specific embodiment of a unit pixel having the first charge accumulation portion 30 and the second charge accumulation portion 40 in a pixel will be explained.

(Circuit Configuration of Unit Pixel 60a)

Figure 30:
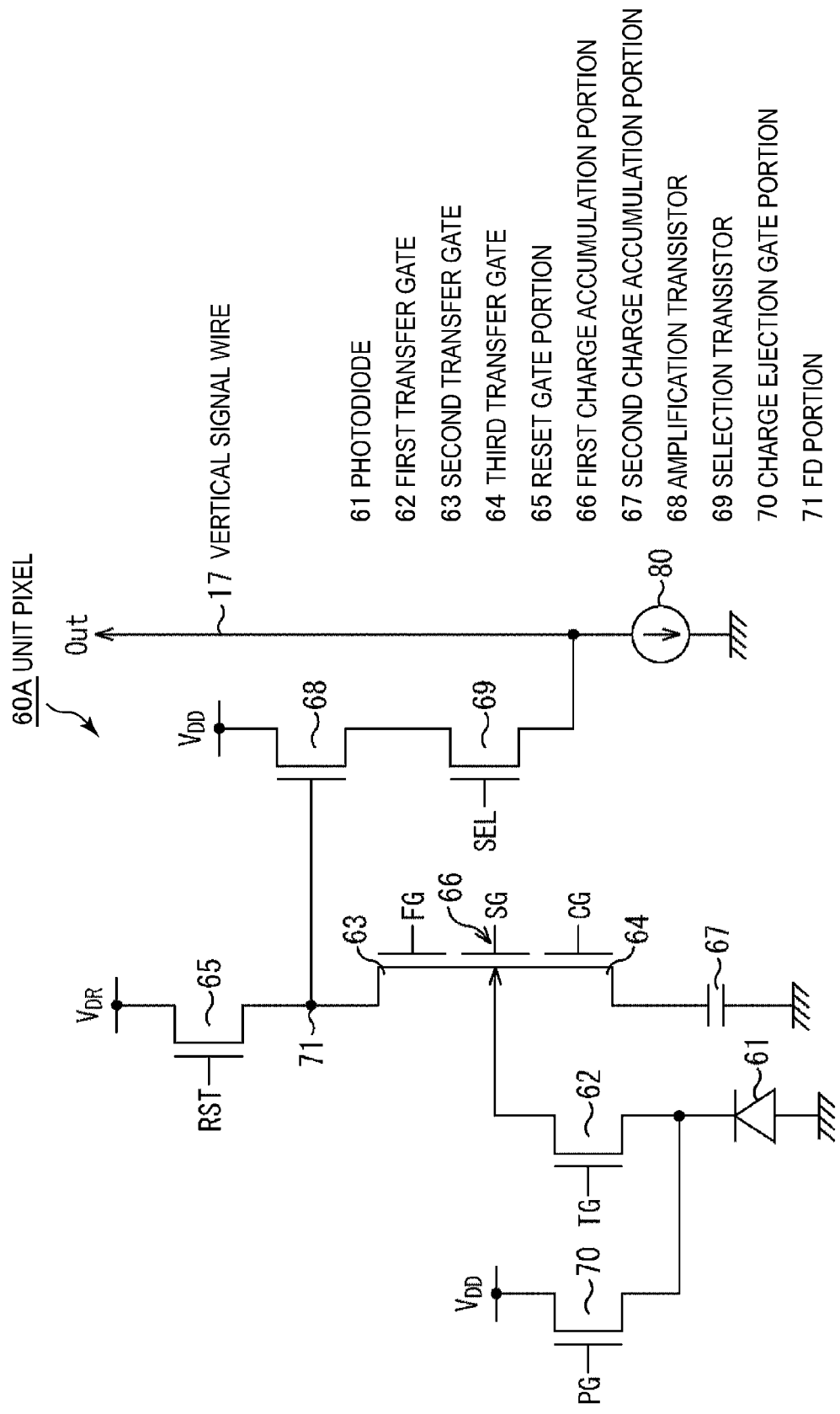
FIG. 30 is a circuit view illustrating a circuit configuration of a unit pixel.

FIG. 30 is a circuit view illustrating a circuit configuration of the unit pixel 60A to which the present disclosure is applied. As illustrated in FIG. 30, the unit pixel 60A has, for example, a p-n junction photodiode 61 as a photoelectric conversion portion that receives light and generates and accumulates light charges. The photodiode 61 generates and accumulates light charges based on a quantity of received light.

Further, for example, the unit pixel 60A includes a first transfer gate portion 62, a second transfer gate portion 63, a third transfer gate portion 64, a reset gate portion 65, a first charge accumulation portion 66 and a second charge accumulation portion 67, an amplification transistor 68, a selection transistor 69 and a charge ejection gate portion 70.

In the unit pixel 60A having the above configuration, the first and second charge accumulation portions 66 and 67 correspond to the first and second charge accumulation portions described above. That is, in a circuit of the first charge accumulation portion 66, a flush-mounted MOS capacitor is set between the first transfer gate portion 62 and the second transfer gate portion 63. A drive signal SG (which may be referred to as "transfer signal SG" below) is applied to a gate electrode of the first charge accumulation portion 66. The second charge accumulation portion 67 is formed with a capacitor of a larger capacity value per unit area than that of the first charge accumulation portion 66. The layouts and cross-sectional surface configurations of the first and second charge accumulation portions 66 and 67 will be described later in detail.

In the unit pixel 60A, a plurality of drive wires are wired every pixel row, for example, as the pixel drive wire 16 in FIG. 1. Also, through the plurality of drive wires of the pixel drive wire 16 from the vertical drive portion 12 in FIG. 1, various drive signals TG, SG, FG, CG, RST, SEL and PG are supplied. Since each transistor is an NMOS transistor in the above configuration, these drive signals TG SG, FG, CG, RST, SEL and PG are pulse signals in which the high-level (for example, source voltage $V_{DD}$) state is an active state and the low-level state (for example, negative potential) is an inactive state.

The drive signal TG is applied to a gate electrode of the first transfer gate portion 62 as a transfer signal. In the circuit, the first transfer gate portion 62 is connected between the photodiode 61 and the first charge accumulation portion 66. When the drive signal TG (which may be referred to as "transfer signal TG" below) gets in an active state, in response to this, the first transfer gate portion 62 gets in a conduction state. By this means, light charges accumulated in the photodiode 61 are transferred to the first charge accumulation portion 66. The light charges transferred by the first transfer gate portion 62 are temporarily accumulated in the first charge accumulation portion 66.

The drive signal FG is applied to a gate electrode of the second transfer gate portion 63 as a transfer signal. In the circuit, the second transfer gate portion 63 is connected between the first charge accumulation portion 66 and a floating diffusion portion (hereinafter referred to as "FD portion") 71 to which a gate electrode of the amplification transistor 68 is connected. The FD portion 71 converts light charges into electric signals such as voltage signals and outputs these. When the drive signal FG (which may be referred to as "transfer signal FG" below) gets in an active state, in response to this, the second transfer gate portion 63 gets in a conduction state. By this means, the light charges accumulated in the first charge accumulation portion 66 are transferred to the FD portion 71.

The drive signal CG is applied to a gate electrode of the third transfer gate portion 64 as a transfer signal. In the circuit, the third transfer gate portion 64 is connected between the first charge accumulation portion 66 and the second charge accumulation portion 67. When the drive signal CG (which may be referred to as "transfer signal CG" below) gets in an active state, in response to this, the third transfer gate portion 64 gets in a conduction state. By this means, the potentials of the first charge accumulation portion 66 and the second charge accumulation portion 67 are combined.

The drive signal RST is applied to a gate electrode of the reset gate portion 65 as a reset signal. In the reset gate portion 65 in the circuit, one source/drain area is connected to the reset voltage $V_{DR}$ and the other source/drain area is connected to the FD portion 71. When the drive signal RST (which may be referred to as "reset signal RST" below) gets in an active state, in response to this, the reset gate portion 65 gets in a conduction state. By this means, the potential of the FD portion 71 is reset to the level of the reset voltage $V_{DR}$.

In the amplification transistor 68 in the circuit, the gate electrode is connected to the FD portion 71 and the drain electrode is connected to the source voltage $V_{DD}$, so as to be an input portion of a reading circuit which reads light charges acquired by the photoelectric conversion in the photodiode 61 and which is a so-called source follower circuit. That is, in the amplification transistor 68, the source electrode is connected to the vertical signal wire 17 via the selection transistor 69 such that the amplification transistor 68 and a constant current source 80 connected to one end of the vertical signal wire 17 form a source follower circuit.

The drive signal SEL is applied to a gate electrode of the selection transistor 69 as a selection signal. In the circuit, the selection transistor 69 is connected between the source electrode of the amplification transistor 68 and the vertical signal wire 17. Also, when the drive signal SEL (which may be referred to as "selection signal SEL" below) gets in an active state, in response to this, the selection transistor 69 gets in a conduction state. By this means, with the unit pixel 60A as a selection state, a pixel signal output from the amplification transistor 68 is connected to the vertical signal wire 17.

The drive signal PG is applied to a gate electrode of the charge ejection gate portion 70 as a charge ejection control signal. In the circuit, the charge ejection gate portion 70 is connected between the photodiode 61 and a charge ejection portion (for example, source voltage $V_{DD}$). When the drive signal PG (which may be referred to as "charge ejection control signal PG" below) gets in an active state, in response to this, the charge ejection gate portion 70 gets in a conduction state. By this means, a predetermined amount of light charges defined in advance from the photodiode 61 or all light charges accumulated in the photodiode 61 are selectively ejected to the charge ejection portion.

The charge ejection gate portion 70 is provided for the following purpose. By making the charge ejection gate portion 70 get in a conduction state in a period in which light charges are not accumulated, it is possible to prevent charges over the saturated charge amount of the photodiode 61 from overflowing into the first charge accumulation portion 66, the second charge accumulation portion 66 and peripheral pixels.

(Pixel Configuration of Unit Pixel 60A)

Figure 31:
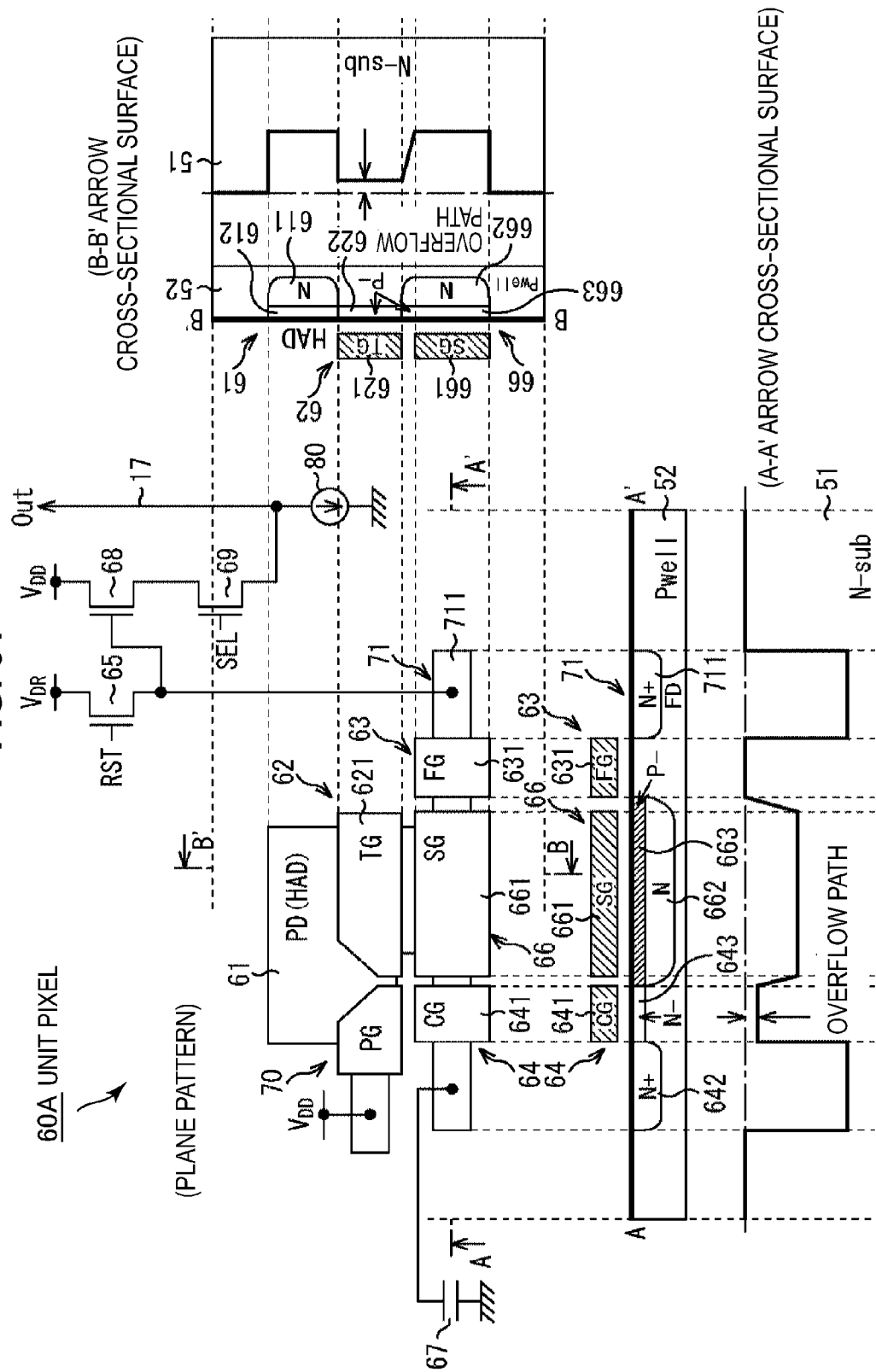
FIG. 31 is a schematic view illustrating a pixel configuration of a unit pixel.

FIG. 31 is a schematic view illustrating a pixel configuration of the unit pixel 60A, and, in the figure, the same reference numerals are assigned to the same components as in FIG. 30. Also, FIG. 31 illustrates a plane pattern illustrating a pixel layout and an A-A' arrow cross-sectional surface and B-B' arrow cross-sectional surface in the plane pattern.

In FIG. 31, as clear from the B-B' arrow cross-sectional view, the photodiode (PD) 61 has a PN-junction diode configuration in which an N-type semiconductor area 611 is formed in the P-type well 52 on the semiconductor substrate 51. A P-type semiconductor area 612 is formed on the surface layer part of this photodiode 61, so as to be a flush-mounted photodiode in which the depletion end is separated from an interface (so-called HAD (Hole Accumulation Diode) sensor configuration).

The first transfer gate portion 62 includes a gate electrode 621 arranged on the substrate surface through the intermediary of a gate insulating film (not illustrated) and has a configuration in which a P-type semiconductor area 622 is formed on the substrate surface layer part. Compared to a case where the P-type semiconductor area 622 is not formed, this semiconductor area 622 slightly deepens the potential below the gate electrode 621. By this means, as clear from the B-B' arrow cross-sectional view, the P-type semiconductor area 622 forms an overflow path to transfer light charges equal to or larger than a predetermined amount overflown from the photodiode 61, specifically, light charges over the saturated charge amount of the photodiode 61 to the first charge accumulation portion 66.

The first charge accumulation portion 66 includes a gate electrode 661 arranged on the substrate surface through the intermediary of a gate insulating film (not illustrated) and is formed below the gate electrode 661 as a flush-mounted MOS capacitor. That is, the first charge accumulation portion 66 is formed with a flush-type MOS capacitor including: the N-type semiconductor area 662 formed in the P-type well 52 below the gate electrode 661; and the P-type semiconductor 663 formed on the surface layer part of the N-type semiconductor area 662.

The second transfer gate portion 63 includes a gate electrode 631 arranged on the substrate surface through the intermediary of a gate insulating film (not illustrated). In the second transfer gate portion 63, the N-type semiconductor area 662 of the first charge accumulation portion 66 is one source/drain area and an N+-type semiconductor area 711 as the FD portion 71 is the other source/drain area.

Therefore, the unit pixel 60A has a pixel configuration in which the first charge accumulation portion 66 is formed as the flush-mounted MOS capacitor below the gate electrode 661 formed adjacent to the first and second transfer gate portions 62 and 63.

The third transfer gate portion 64 includes a gate electrode 641 arranged on the substrate surface through the intermediary of a gate insulating film (not illustrated). In the third transfer gate portion 64, the N-type semiconductor area 662 of the first charge accumulation portion 66 is one source/drain area and an N+-type semiconductor area 642 formed on the substrate surface layer part is the other source/drain area.

One end of the second charge accumulation portion 67 is electrically connected to the N+-type semiconductor area 642 of the third transfer gate portion 64. The other end of the second charge accumulation portion 67 is connected to the negative-side power source (for example, ground).

Subsequently, the second transfer gate portion 63, the gate electrode 661 of the first charge accumulation portion 66 and the third transfer gate portion 64 have operations to combine or divide the potentials of the FD portion 71, the first charge accumulation portion 66 and the second charge accumulation portion 67.

Also, the third transfer gate portion 64 has a configuration in which the N-type semiconductor area 643 is formed on the surface layer part of a channel portion. Compared to a case where the N-type semiconductor area 643 is not formed, this semiconductor area 643 slightly deepens the potential below the gate electrode 641. By this means, as clear from the A-A' arrow cross-sectional view, the N-type semiconductor area 643 forms an overflow path to transfer light charges over the saturated charge amount of the first charge accumulation portion 66 to the second charge accumulation portion 67.

Here, it is important that the overflow paths formed below the first and third transfer gate portions 62 and 64 are formed such that light charges accumulated in the first charge accumulation portion 66 are transferred to the second charge accumulation portion 67 without being leaked in the photodiode 61.

Thus, in the unit pixel 60A, by providing the overflow path below the gate electrode 641 of the third transfer gate portion 64, it is possible to accumulate light charges overflown from the photodiode 61 at high illumination even in the second charge accumulation portion 67. To be more specific, even when the third transfer gate portion 64 is in a non-conduction state, it is possible to transfer light charges equal to or larger than a predetermined amount, which are overflown from the first charge accumulation portion 66, to the second charge accumulation portion 67 and accumulate the light charges in the second charge accumulation portion 67. By this means, it is possible to set the saturated charge amount of the first charge accumulation portion to be smaller than the saturated charge amount of the photodiode 61.

(Circuit Operations of Unit Pixel 60*a*)

Next, with reference to the timing chart in FIG. 32 and the potential views in FIG. 33 to FIG. 40, circuit operations of the unit pixel 60A will be explained.

Figure 32:
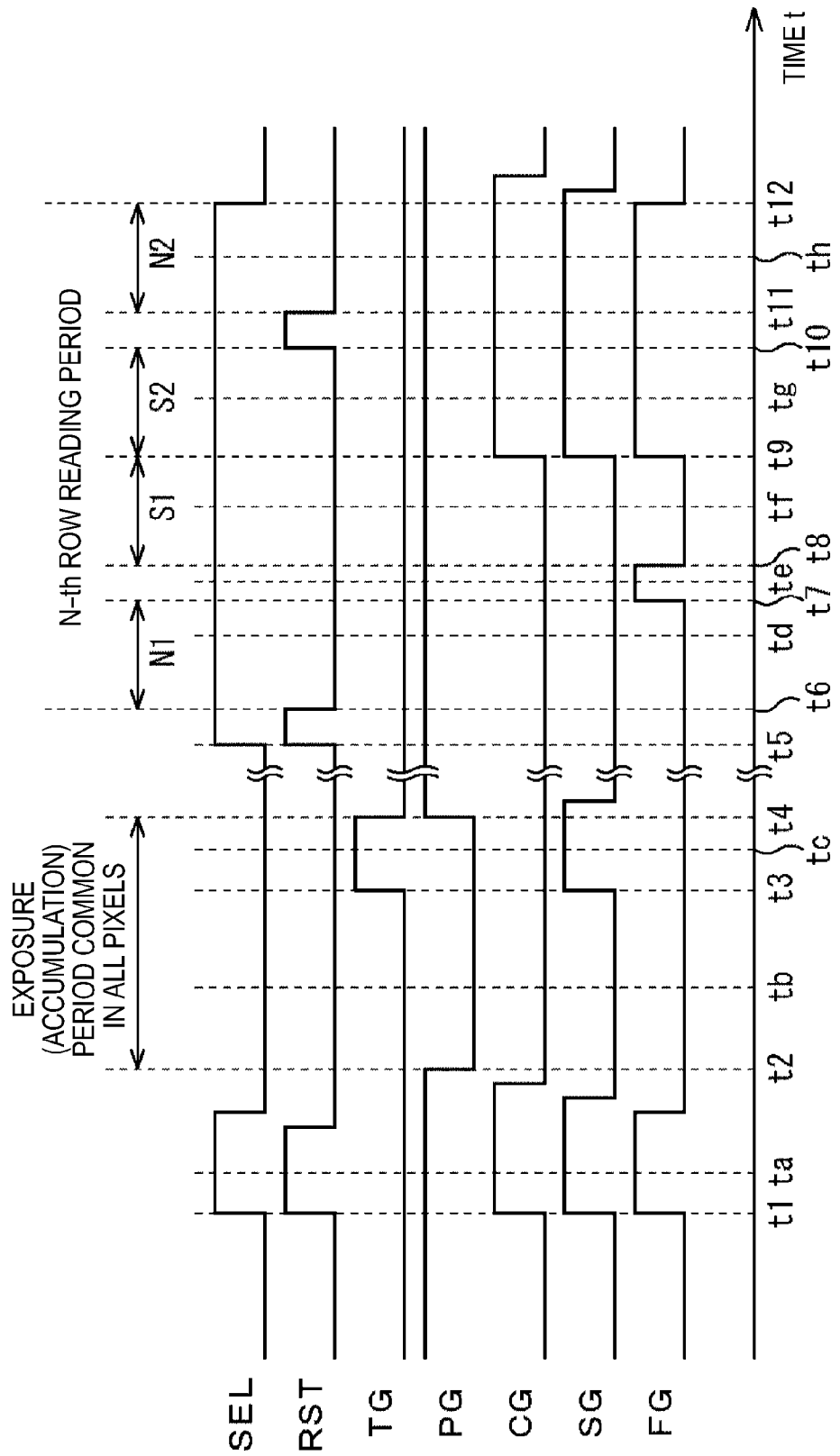
FIG. 32 is a timing chart provided for explaining circuit operations of a unit pixel.

FIG. 32 illustrates the timing chart of the selection signal SEL, the reset signal RST, the transfer signal TG, the charge ejection control signal PG, the transfer signal CG the transfer signal SG and the transfer signal FG of the unit pixel 60A. Also, FIG. 33 to FIG. 40 illustrate potential states of the unit pixel 60A in the N-th row at times ta to th in the timing chart of FIG. 32.

First, at time t1, the charge ejection control signal PG is in an active state, while the selection signal SEL, the reset signal RST, the transfer signal CG the transfer signal SG and the transfer signal FG get in an active state in all pixels at the same time. By this means, the selection transistor 69, the reset gate portion 65, the third transfer gate portion 64, the gate electrode 661 of the first charge accumulation portion 66, the second transfer gate portion 63 and the charge ejection gate portion 70 get in a conduction state.

Figure 33:
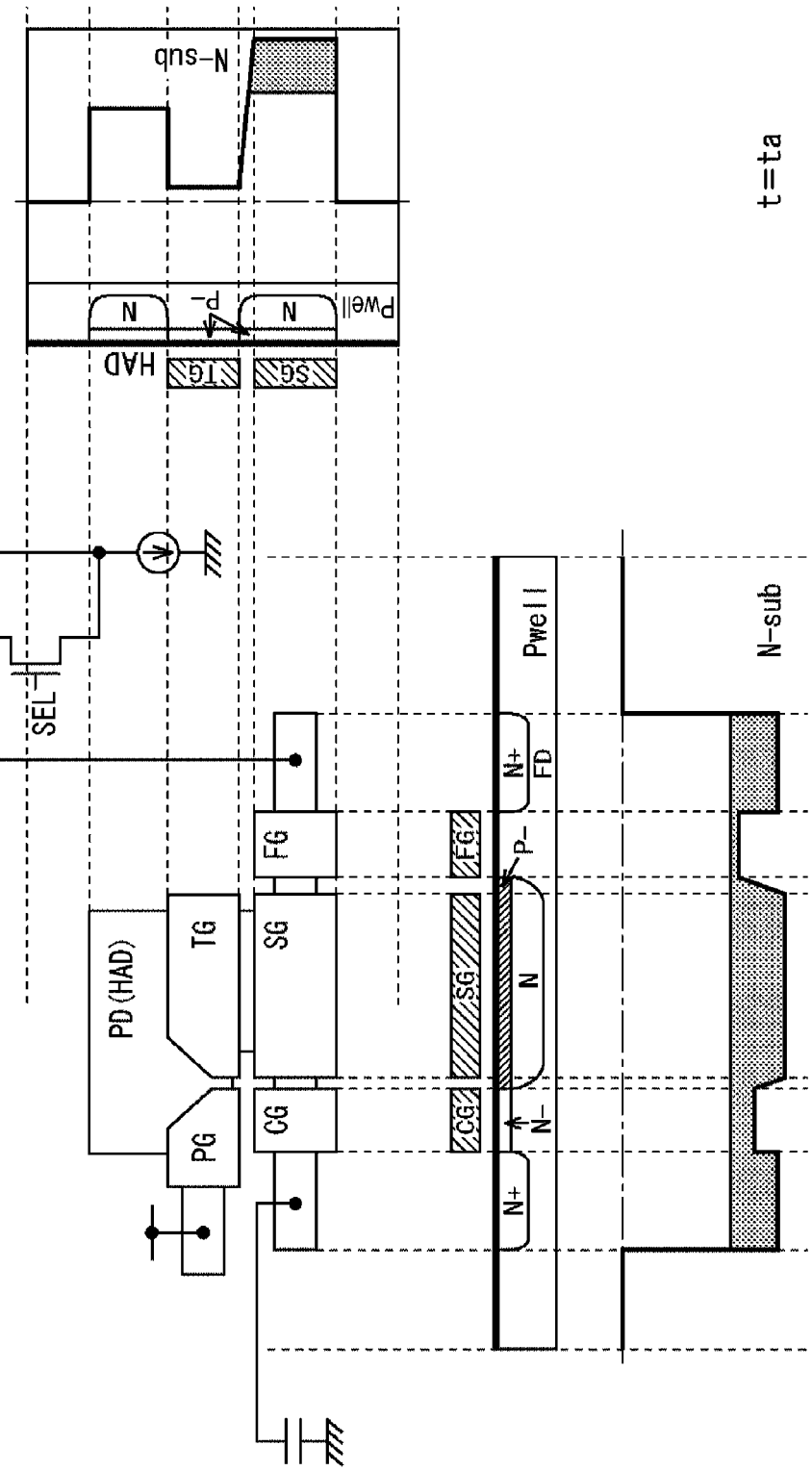
FIG. 33 is a potential view (version 1) provided for explaining circuit operations of a unit pixel.

FIG. 33 illustrates a potential state of the unit pixel 60A at time to between time t1 and time t2. Thus, the potentials of the FD portion 71, the first charge accumulation portion 66 and the second charge accumulation portion 67 are combined and the combined area is reset.

After that, all pixels simultaneously get in an inactive state in the order from the reset signal RST, the selection signal SEL and the transfer signal FG, the transfer signal SG to the transfer signal CG. Subsequently, at time t2, the charge ejection control signal PG gets in an inactive state in all pixels at the same time. By this means, an exposure period common in all pixels is set.

Figure 34:
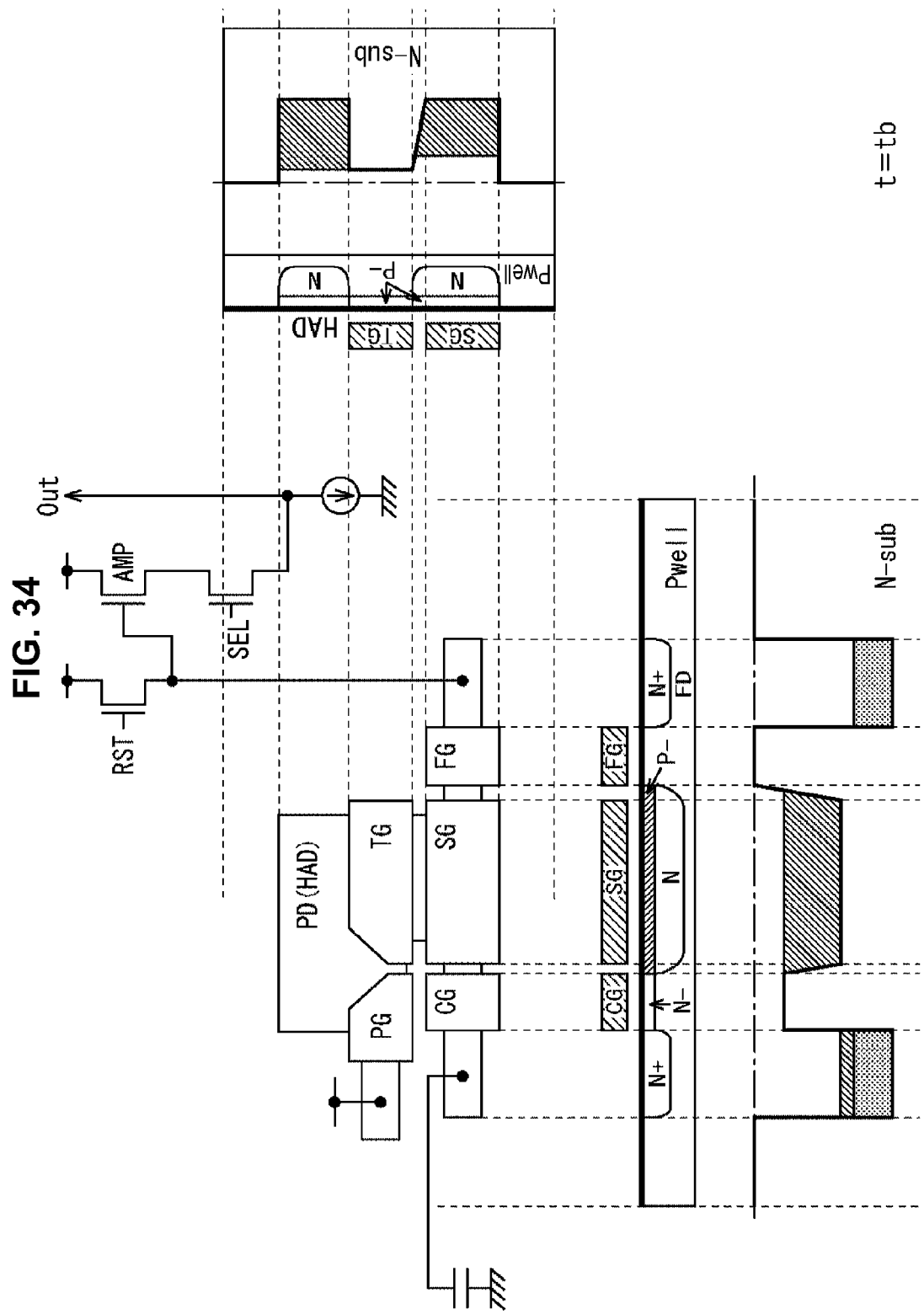
FIG. 34 is a potential view (version 2) provided for explaining circuit operations of a unit pixel.

FIG. 34 illustrates a potential state of the unit pixel 60A at time tb between time t2 and t3. Thus, when light charges are accumulated in the photodiode 61, in the case of high illumination, light charges overflown from the photodiode 61 are accumulated in the first charge accumulation portion 66 via the overflow path of the first transfer gate portion 62. Further, when the first charge accumulation portion 66 is saturated, light charges overflown from the first charge accumulation portion 66 are accumulated in the second charge accumulation portion 67 via the overflow path of the third transfer gate portion 64. Also, in the case of low illumination, light charges are accumulated only in the photodiode 61.

Next, at time t3, the transfer signal TG and the transfer signal SG get in an active state and the first transfer gate portion 62 and the gate electrode 661 of the first charge accumulation portion 66 get in a conduction state.

Figure 35:
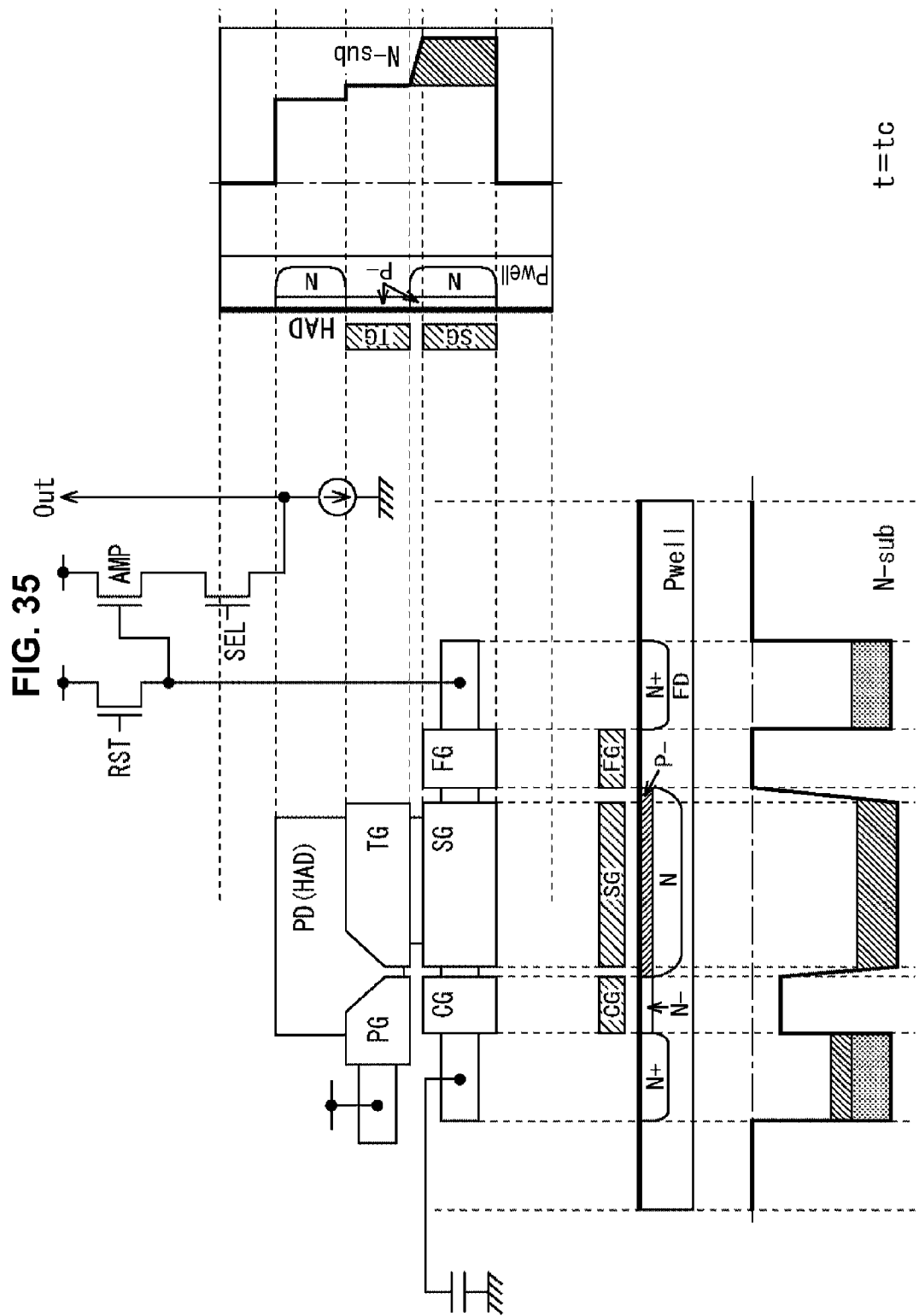
FIG. 35 is a potential view (version 3) provided for explaining circuit operations of a unit pixel.

FIG. 35 illustrates a potential state of the unit pixel 60A at time tc between time t3 and time t4. Thus, the light charges accumulated in the photodiode 61 are transferred to the first charge accumulation portion 66 and accumulated in the first charge accumulation portion 66.

Next, at time t4, the transfer signal TG gets in an inactive state in all pixels at the same time while the charge ejection control signal PG gets in an active state. Also, while the first transfer gate portion 62 gets in a non-conduction state, the charge ejection gate portion 70 gets in a conduction state. By this means, the exposure period common in all pixels is finished.

After that, the transfer signal SG gets in an inactive state, the gate electrode 661 of the first charge accumulation portion 66 gets in a non-conduction state and the potential of the first charge accumulation portion 66 returns to the original. At this time, when the accumulation charge amount of the first charge accumulation portion 66 is over the saturated charge amount, light charges overflown from the first charge accumulation portion 66 are transferred to the second charge accumulation portion 67 via the overflow path of the third transfer gate portion 64.

Subsequently, after the exposure period common in all pixels is finished, accumulated light charges are read every row in order.

To be more specific, at time t5, the selection signal SEL in the N-th row gets in an active state, the selection transistor 69 in the N-th row gets in a conduction state and therefore the unit pixel 60A in the N-th row gets in a selection state. At the same time, the reset signal RST gets in an active state, the reset gate portion 65 gets in a conduction state and therefore the FD portion 71 is reset. Subsequently, at time t6, the reset signal RST gets in an inactive state.

Figure 36:
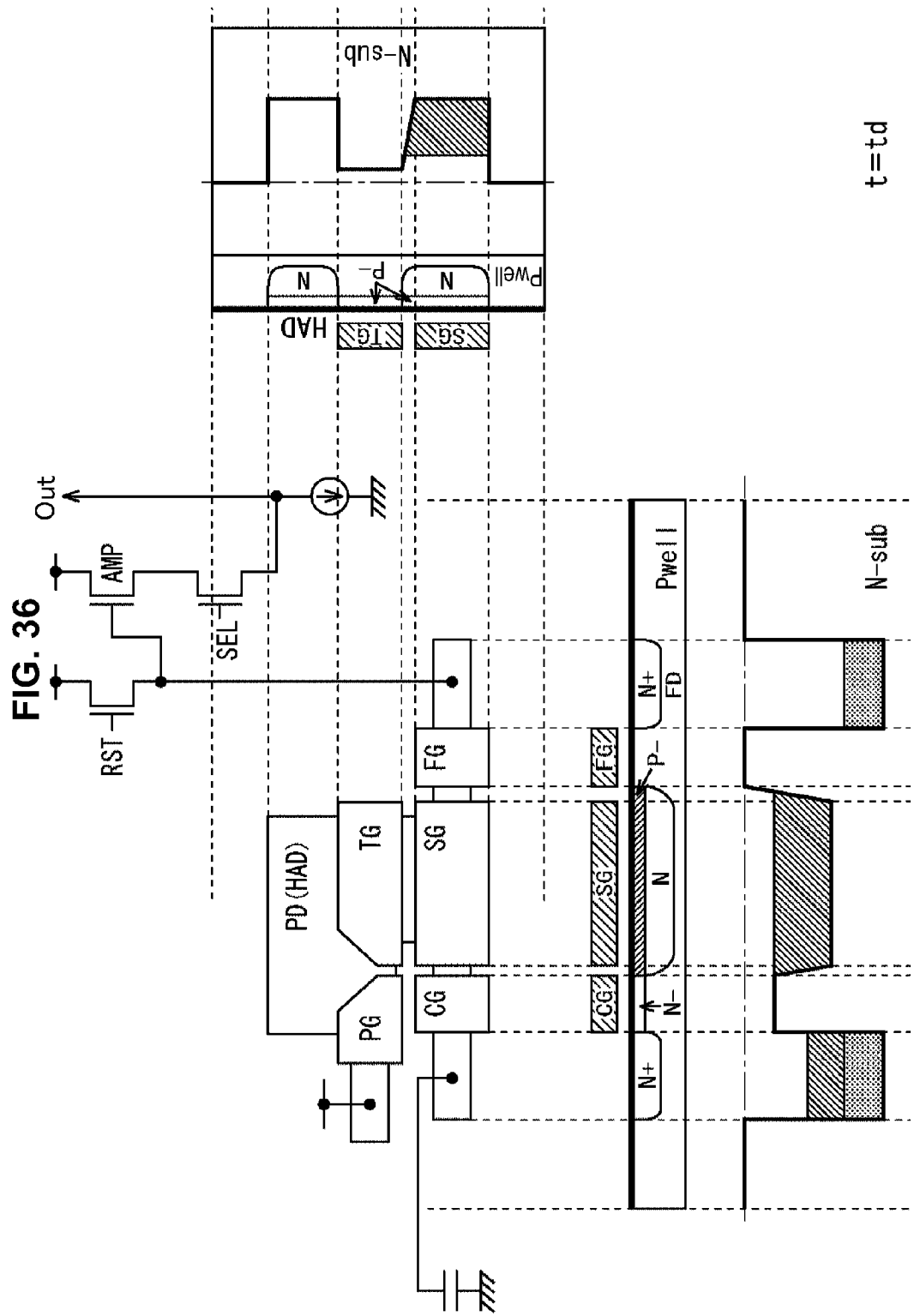
FIG. 36 is a potential view (version 4) provided for explaining circuit operations of a unit pixel.

FIG. 36 illustrates a potential state of the unit pixel 60A at time td between time t6 and time t7. The potential of the FD portion 71 in this state is output as first reset level N1 to the vertical signal wire 17 through the amplification transistor 68 and the selection transistor 69.

Next, when the transfer signal FG gets in an active state at time t7, the second transfer gate portion 63 gets in a conduction state.

Figure 37:
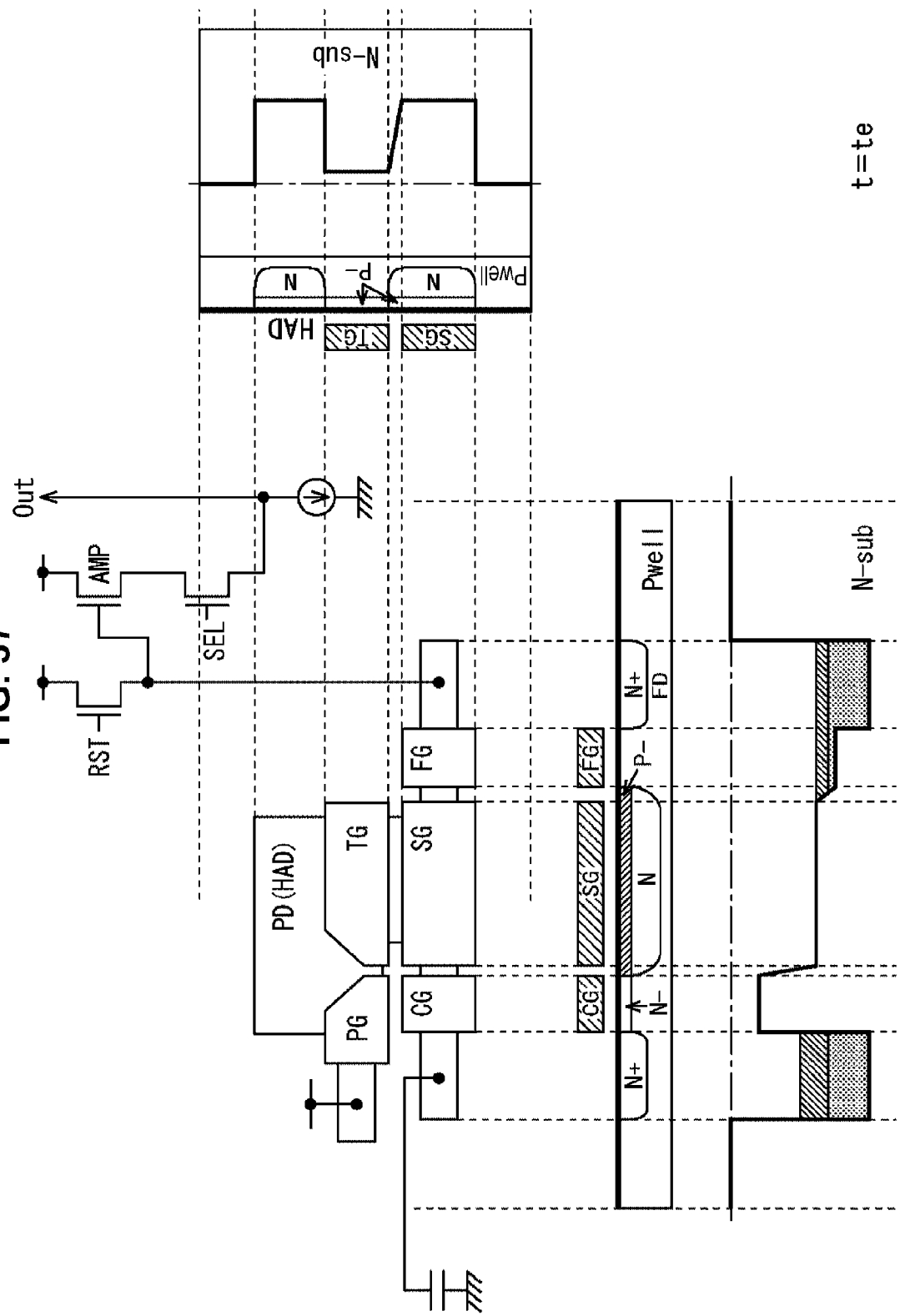
FIG. 37 is a potential view (version 5) provided for explaining circuit operations of a unit pixel.

FIG. 37 illustrates a potential state of the unit pixel 60A at time to between time t7 and time t8. Thus, light charges accumulated in the first charge accumulation portion 66 are transferred to the FD portion 71.

Next, at time t8, the transfer signal FG gets in an inactive state and the second transfer gate portion 63 gets in a non-conduction state.

Figure 38:
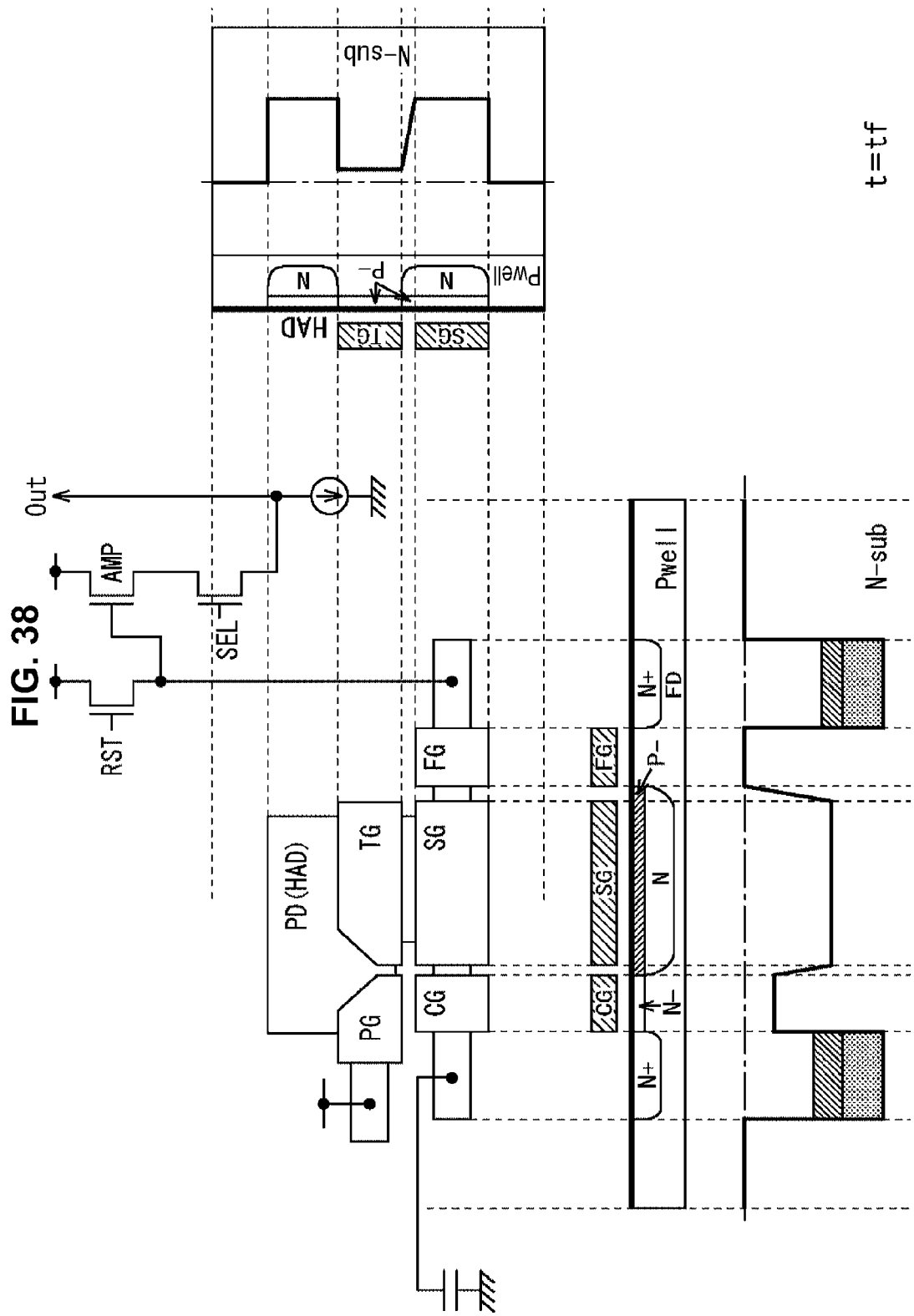
FIG. 38 is a potential view (version 6) provided for explaining circuit operations of a unit pixel.

FIG. 38 illustrates a potential state of the unit pixel 60A at time tf between time t8 and time t9. As the first signal level S1 based on the accumulated charge amount of the first charge accumulation portion 66, the potential of the FD portion 71 in this state is output to the vertical signal wire 17 through the amplification transistor 68 and the selection transistor 69.

Next, at time t9, the transfer signals CG SG and FG get in an active state at the same time and the third transfer gate portion 64, the gate electrode 661 of the first charge accumulation portion 66 and the second transfer gate portion 63 get in a conduction state.

Figure 39:
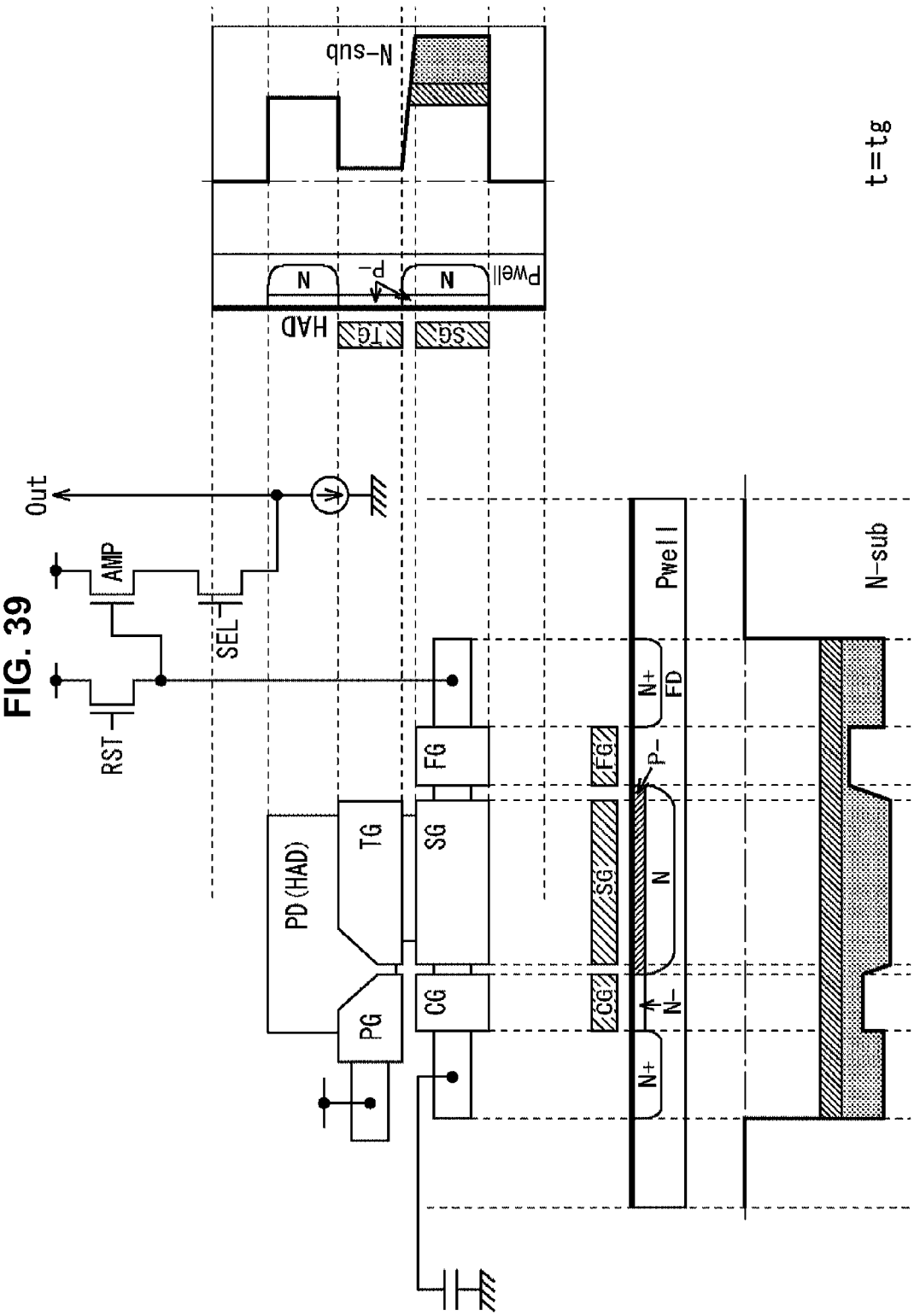
FIG. 39 is a potential view (version 7) provided for explaining circuit operations of a unit pixel.

FIG. 39 illustrates a potential state of the unit pixel 60A at time tg between time t9 and time t10. Thus, the potentials of the FD portion 71, the first charge accumulation portion 66 and the second charge accumulation portion 67 are combined and light charges are accumulated in the overall combined area. Also, these light charges are output as a second signal level S2 to the vertical signal wire 17 through the amplification transistor 68 and the selection transistor 69.

Next, at time t10, the reset signal RST gets in an active state and the reset gate portion 65 gets in a conduction state. By this means, the area combining the potentials of the FD portion 71, the first charge accumulation portion 66 and the second charge accumulation portion 67 is reset.

Next, at time t11, the reset signal gets in an active state and the reset gate portion 65 gets in a non-conduction state.

Figure 40:
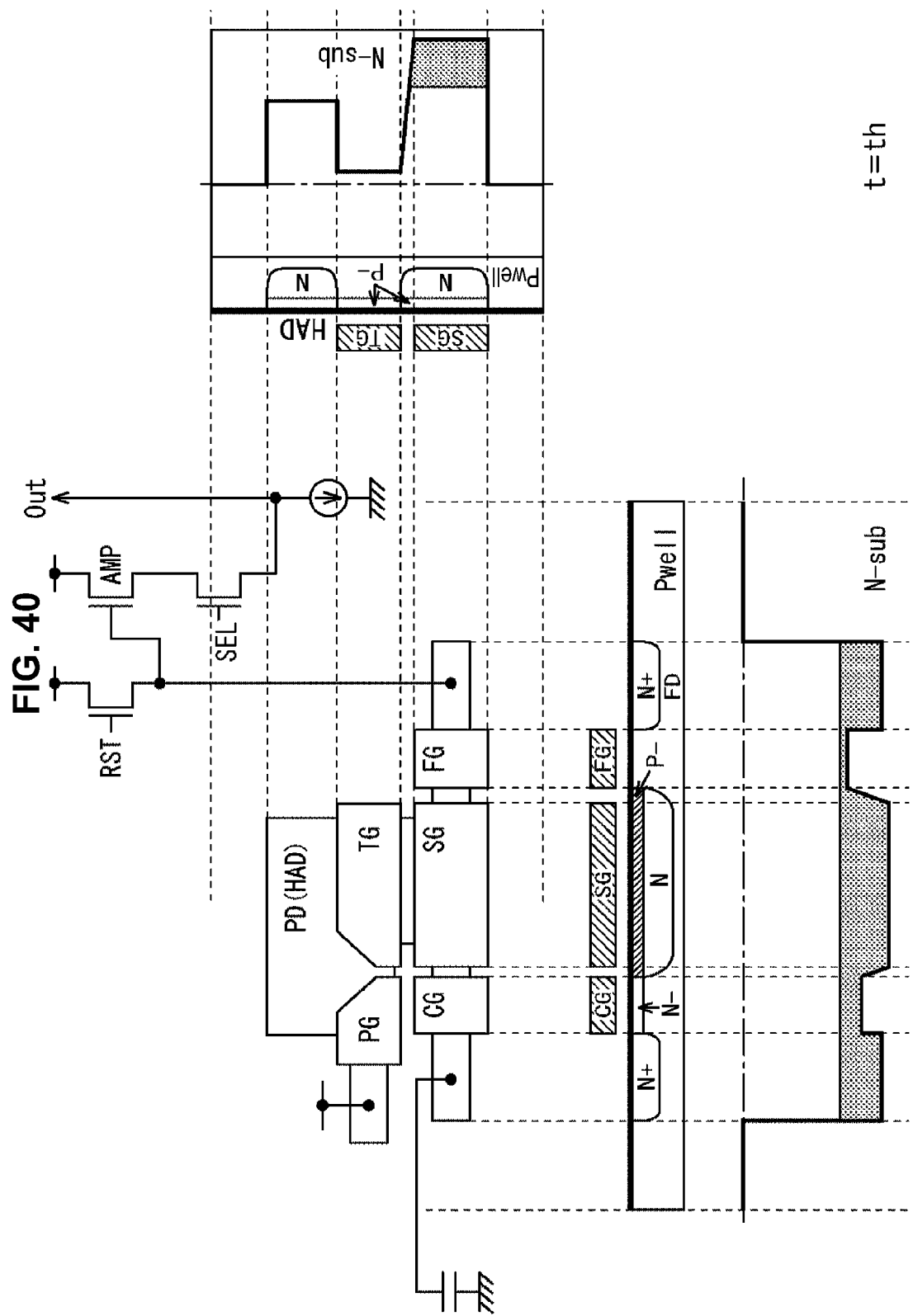
FIG. 40 is a potential view (version 8) provided for explaining circuit operations of a unit pixel.

FIG. 40 illustrates a potential state of the unit pixel 60A at time th between time t11 and time t12. The potential of the area combining the potentials in this state is output as a second reset level N2 to the vertical signal wire 17 through the amplification transistor 68 and the selection transistor 69.

Next, at time t12, the selection signal SEL in the N-th row gets in an inactive state, the selection transistor 69 in the N-th row gets in a non-conduction state and therefore the unit pixel 60A in the N-th row gets in a non-selection state.

After that, the transfer signal FG the transfer signal SG and the transfer signal CG are caused to get in an inactive state in this order, and the second transfer gate portion 63, the gate electrode 661 of the first charge accumulation portion 66 and the third transfer gate portion 64 are caused to get in a non-conduction state.

Here, the transfer signal FG, the transfer signal SG and the transfer signal CG are caused to get in an inactive state in this order, such that, when the gate electrode 661 of the first charge accumulation portion 66 is in a conduction state, channel charges accumulated in the substrate surface are accumulated in the second charge accumulation portion 67. Unlike the FD portion 71, the reset is not performed only by the second charge accumulation portion 67, and therefore there is no concern that an offset is caused in pixel signals by the reset of the channel charges.

By the above series of circuit operations, the first reset level N1, the first signal level S1, the second signal level S2 and the second reset level N2 are sequentially output from the unit pixel 60A to the vertical signal wire 17. The first reset level N1, the first signal level S1, the second signal level S2 and the second reset level N2 sequentially output in this way are subjected to predetermined signal processing in a signal processing portion in a subsequent stage. The signal processing will be described later in detail.

As described above, according to the unit pixel 60A, by using the flush-mounted MOS capacitor as the first charge accumulation portion 66 and the capacitor of a larger capacity value per unit area than that of the first charge accumulation portion 66 as the second charge accumulation portion 67, it is possible to maintain a larger saturated charge amount. By contrast, in a case where the equivalent saturated charge amount is acceptable, it is possible to reduce the unit pixel size by the saved space.

Further, at the time of simultaneously reading all pixels, light charges at low illumination are accumulated in the first charge accumulation portion 66 of good dark-situation characteristics, while light charges at high illumination are accumulated in the second charge accumulation portion 67 of poor dark-situation characteristics. Therefore, compared to the related art that realizes the global exposure, image quality of taken images at dark situation or low illumination is not degraded.

(Variation 1)

Figure 41:
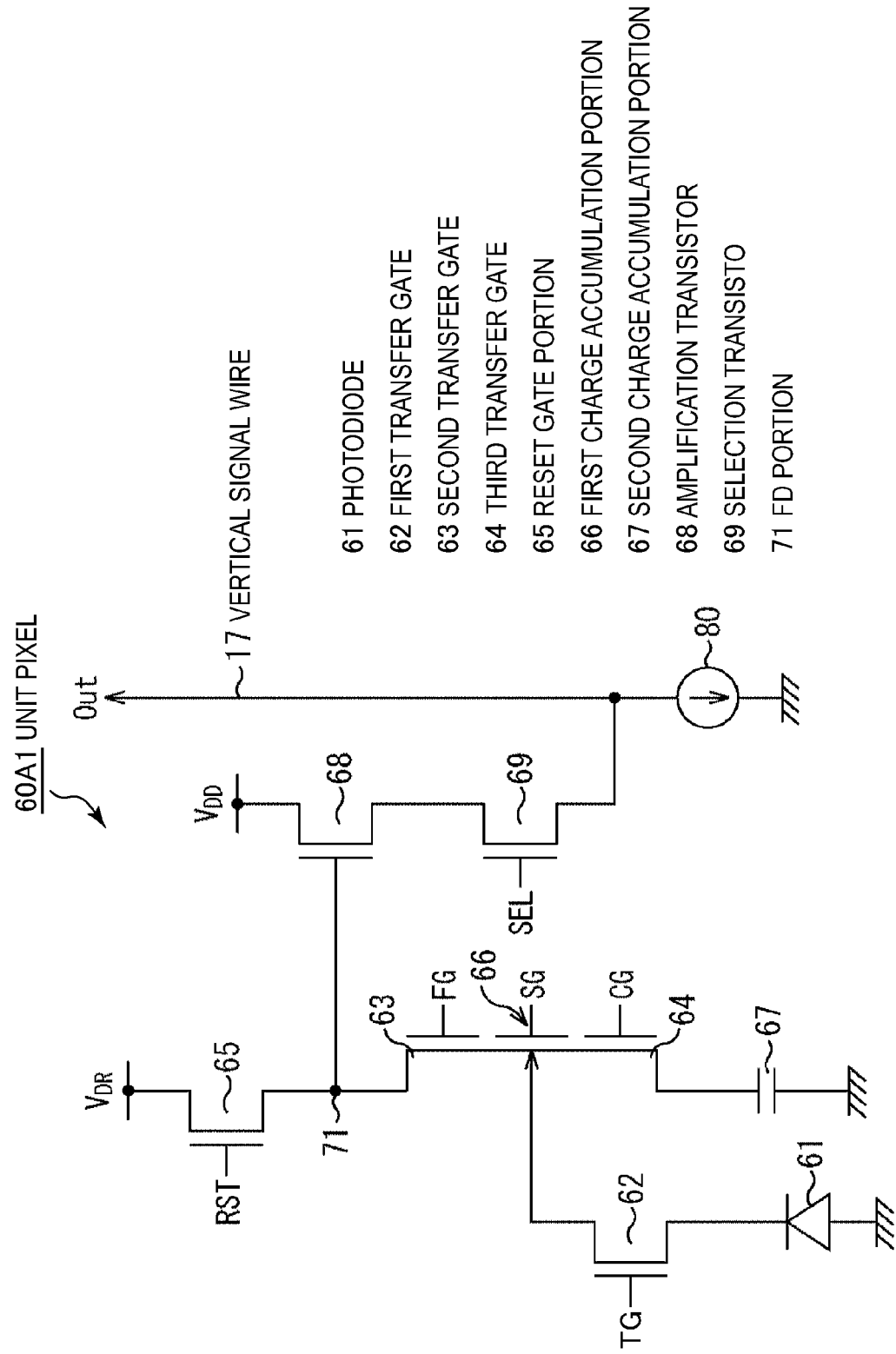
FIG. 41 is a circuit view illustrating a circuit configuration of variation example 1 of a unit pixel.

FIG. 41 is a circuit view illustrating a circuit configuration of the unit pixel 60A1 according to variation example 1 of the unit pixel 60A, and, in the figure, the same reference numerals are assigned to the same components as in FIG. 30.

The unit pixel 60A1 according to this variation example 1 differs from the unit pixel 60A in that the charge ejection gate portion 70 is omitted.

For example, in a period in which light charges are not accumulated, in a case where other methods are used to prevent the photodiode 61 from being saturated or there is no concern that the photodiode 61 is saturated by light charges, it is possible to omit the charge ejection gate portion 70 as above.

Variation Example 2

Figure 42:
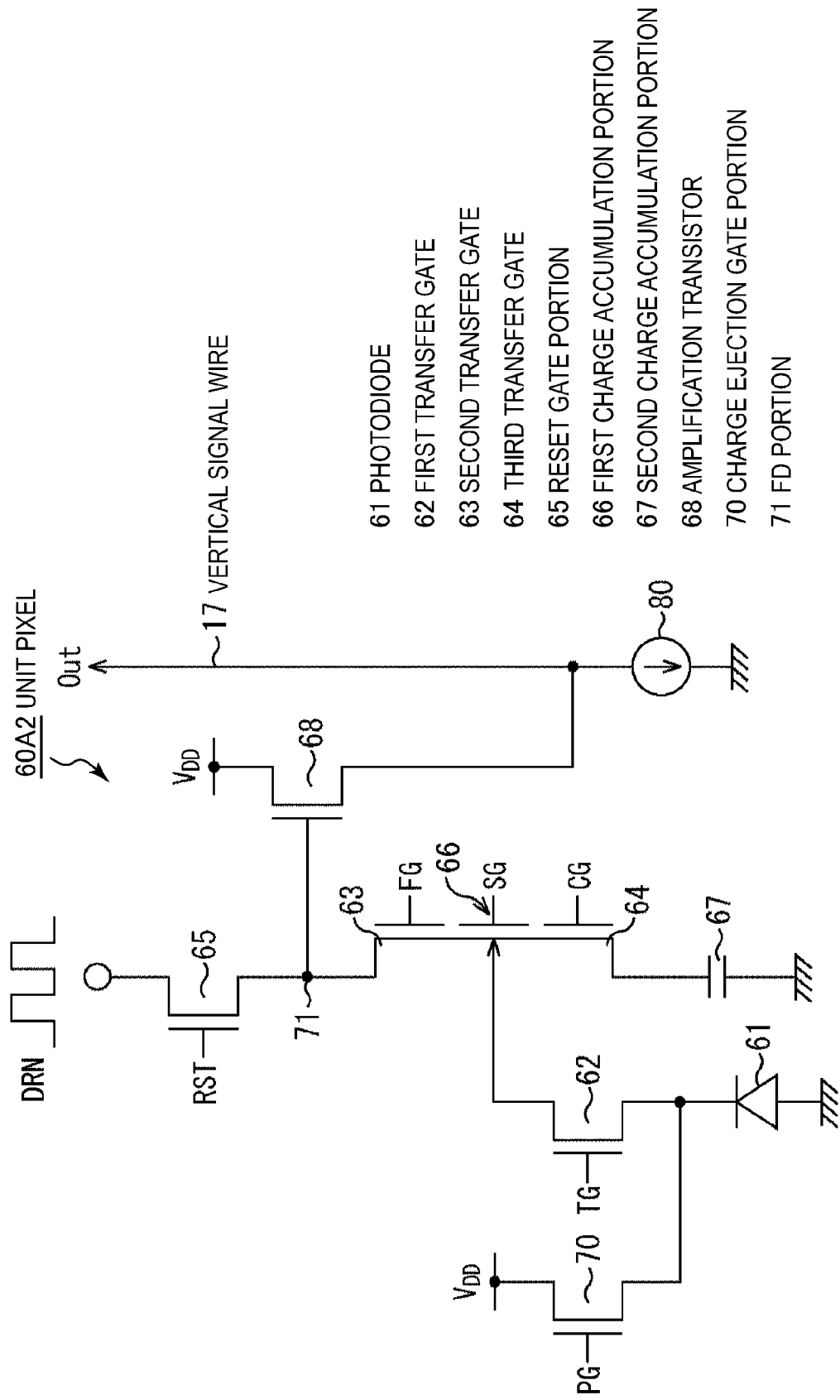
FIG. 42 is a circuit view illustrating a circuit configuration of variation example 2 of a unit pixel.

FIG. 42 is a circuit view illustrating a circuit configuration of the unit pixel 60A2 according to variation example 2 of the unit pixel 60A, and, in the figure, the same reference numerals are assigned to the same components as in FIG. 30.

The unit pixel 60A2 according to this variation example 2 differs from the unit pixel 60A in that the selection transistor 69 is omitted. Also, in the unit pixel 60A2, a function of pixel selection by the selection transistor 69 is realized by varying the drain voltage DRN applied to the drain electrode of the reset gate portion 65.

To be more specific, by applying a high voltage to the drain electrode of the reset gate portion 65 as the drain voltage DRN, the amplification transistor 68 gets in an activation state to perform signal output operations. That is, the amplification transistor 68 operates as a selection transistor in cooperation with a switching operation of the drain voltage DRN. By omitting the selection transistor 69, there is an advantage that it is possible to reduce one circuit element forming the unit pixel 60 every pixel.

Figure 43:
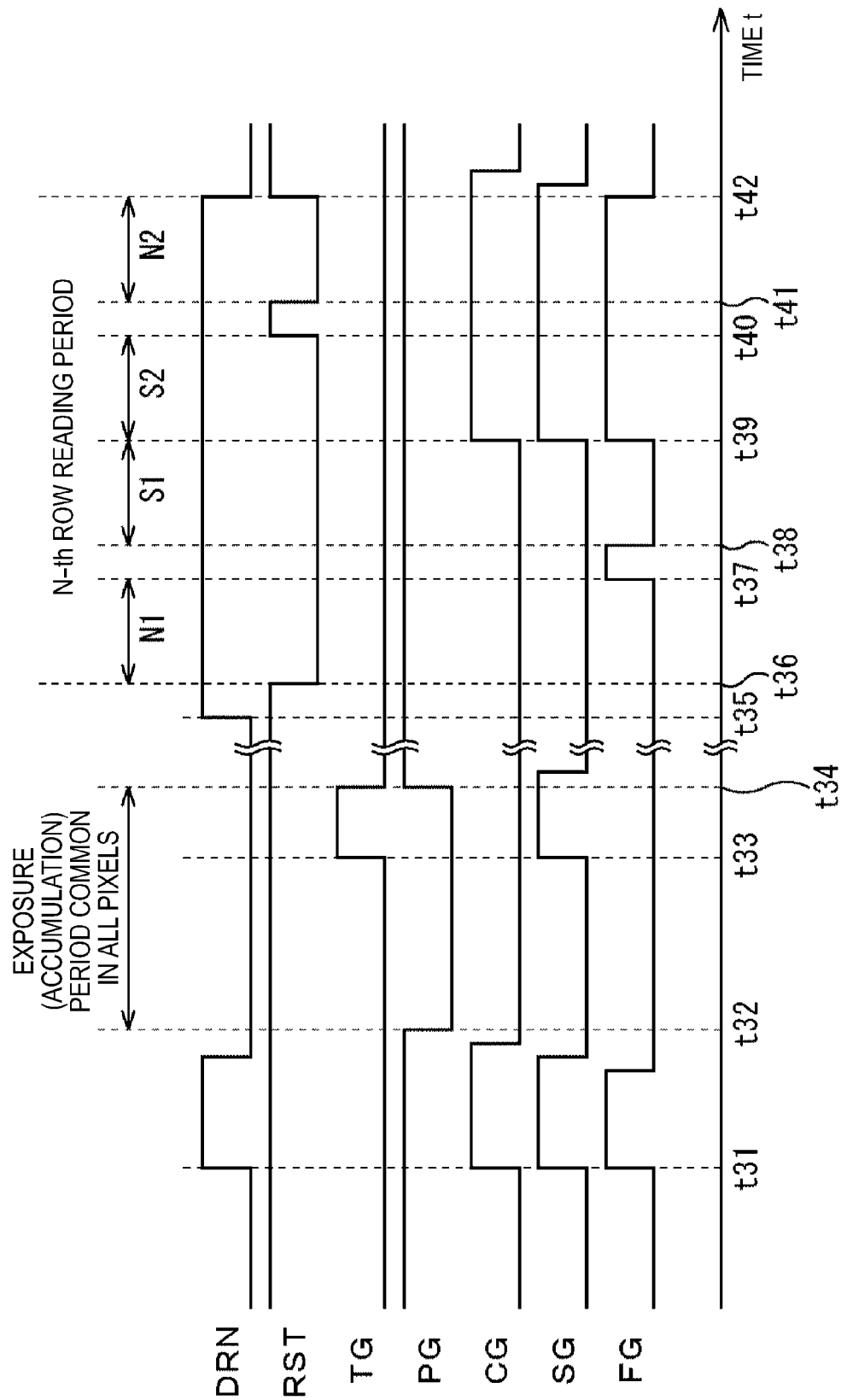
FIG. 43 is a timing chart provided for explaining circuit operations of variation example 2 of the unit pixel.

Similar to FIG. 32, regarding circuit operations of the unit pixel 60A2, FIG. 43 is a timing chart illustrating each signal state.

The circuit operations and the circuit operations of the unit pixel 60A are different only in the timing of the reset signal RST and are basically the same.

(Pixel Share)

In the unit pixels 60A, 60A1 and 60A2, circuit elements forming a pixel can be shared between a plurality of pixels.

Figure 44:
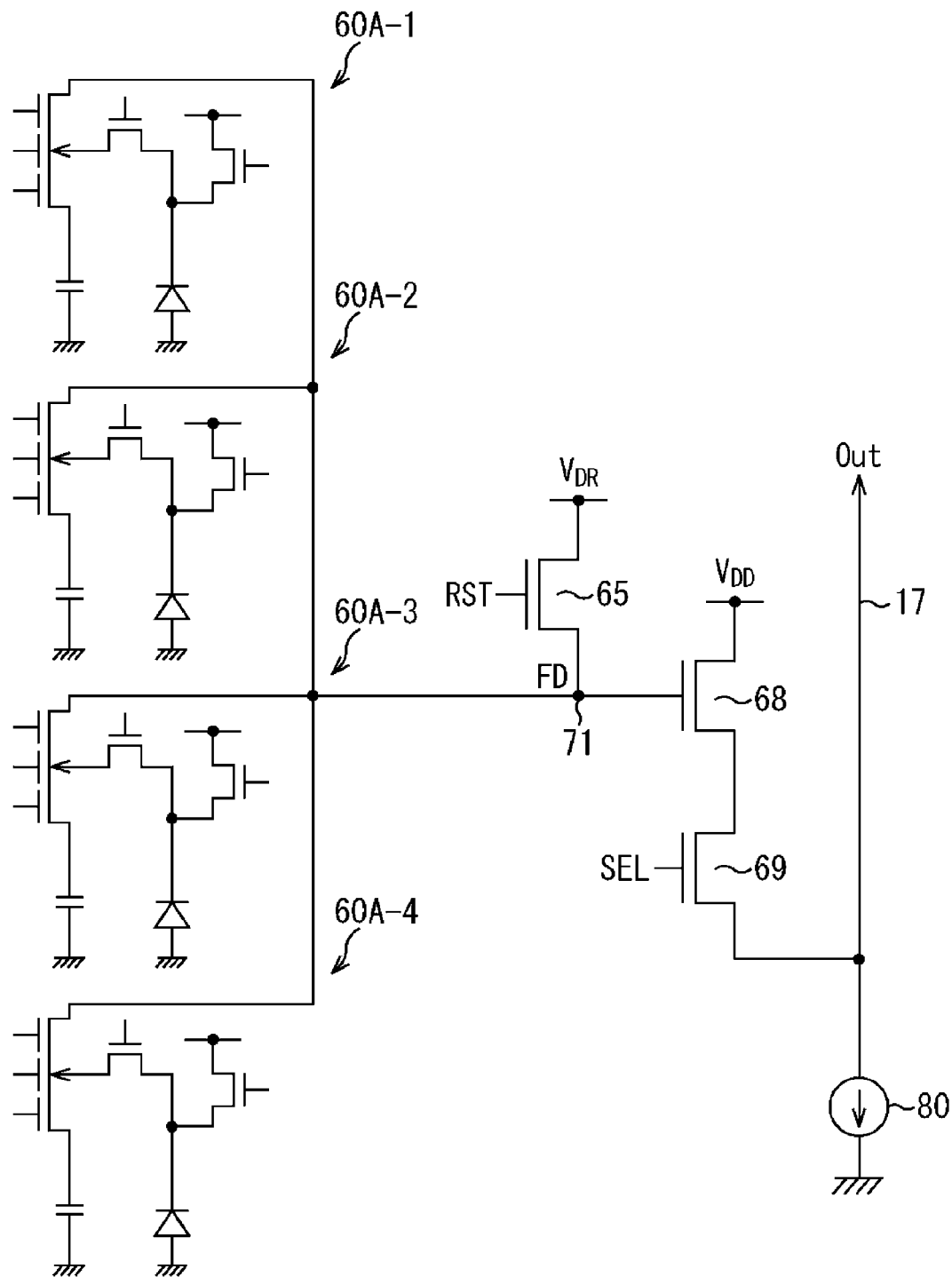
FIG. 44 is a circuit view illustrating a circuit configuration of specific example 1 common in pixels.

FIG. 44 is a circuit view illustrating a circuit configuration according to specific example 1 of the pixel share. Here, it provides an example case where part of pixel configuration elements is shared between four adjacent pixels 60A-1 to 60A-4. However, the number of sharing pixels is not limited to 4 pixels. Also, as relationships between the four adjacent pixels 60A-1 to 60A-4, for example, the sharing may be performed in four pixels of two pixels in the row direction and two pixels in the column direction or in four pixels in the column direction.

Specific example 1 provides a pixel share example in the case of the pixel configuration of the unit pixel 60A. Also, circuit elements including the reset gate portion 65 after the FD portion 71, that is, three circuit elements of the reset gate portion 65, the amplification transistor 68 and the selection transistor 69 are shared between four pixels.

Figure 45:
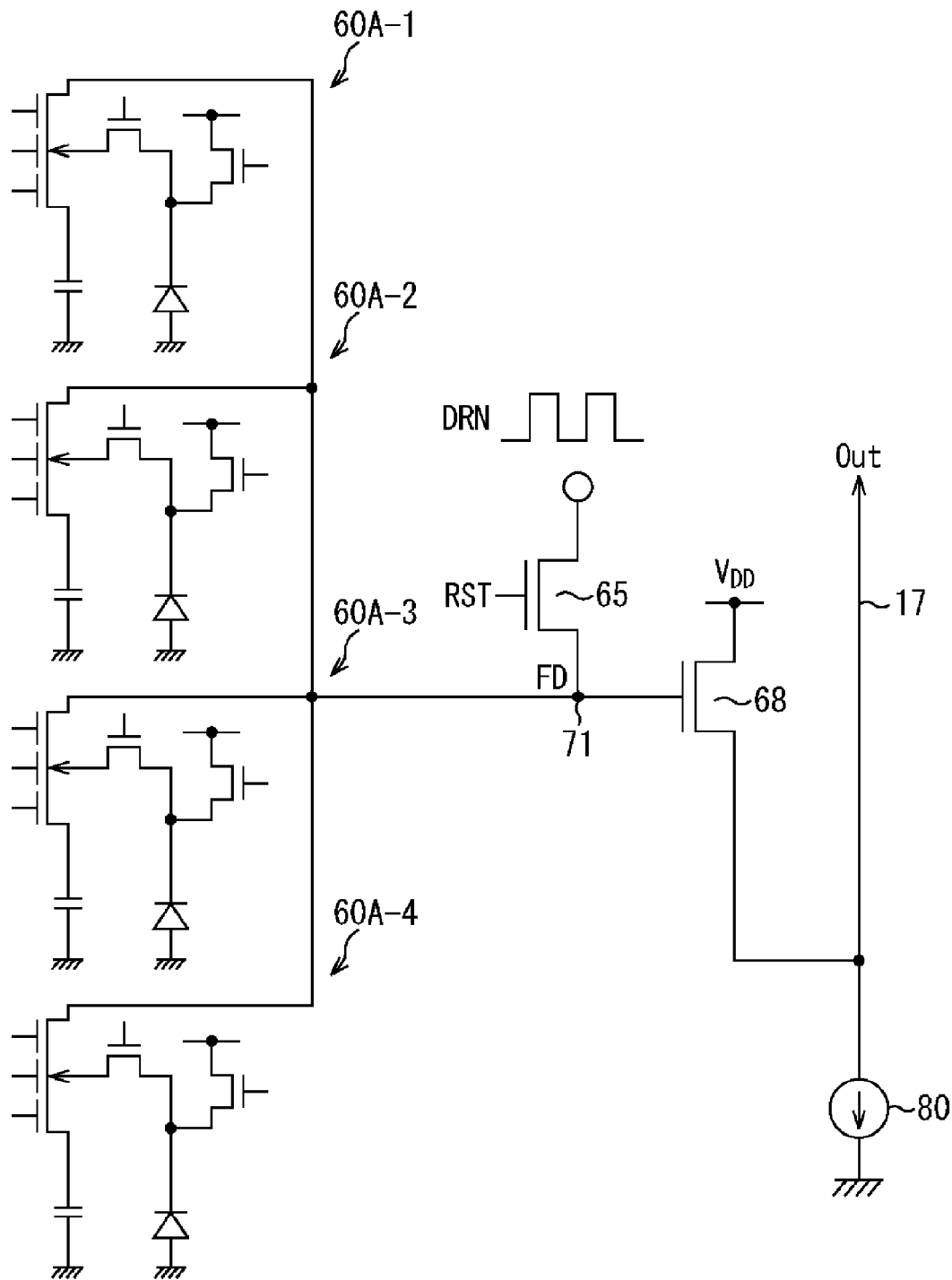
FIG. 45 is a circuit view illustrating a circuit configuration of specific example 2 common in pixels.

FIG. 45 is a circuit view illustrating a circuit configuration according to specific example 2 of pixel share. Similar to the above, an example case is provided where part of pixel configuration elements is shared between four adjacent pixels 60A-1 to 60A-4. However, the number of sharing pixels is not limited to four pixels. Also, as relationships between the four adjacent pixels 60A-1 to 60A-4, for example, the sharing may be performed in four pixels of two pixels in the row direction and two pixels in the column direction or in four pixels in the column direction.

Specific example 2 provides a pixel share example in the case of the pixel configuration of the unit pixel 60A2 according to variation example 2. Also, circuit elements including the reset gate portion 65 after the FD portion 71, that is, two circuit elements of the reset gate portion 65 and the amplification transistor 68 are shared between four pixels.

Thus, by using a technique of sharing circuit elements between a plurality of pixels, it is possible to acquire a similar operational effect to that of the unit pixel 60A and further save the space of the unit pixel size. Subsequently, it is possible to maintain a larger saturated charge amount by the saved space. By contrast, in a case where the equivalent saturated charge amount is acceptable, it is possible to reduce the unit pixel size by the saved space.

Figure 46:
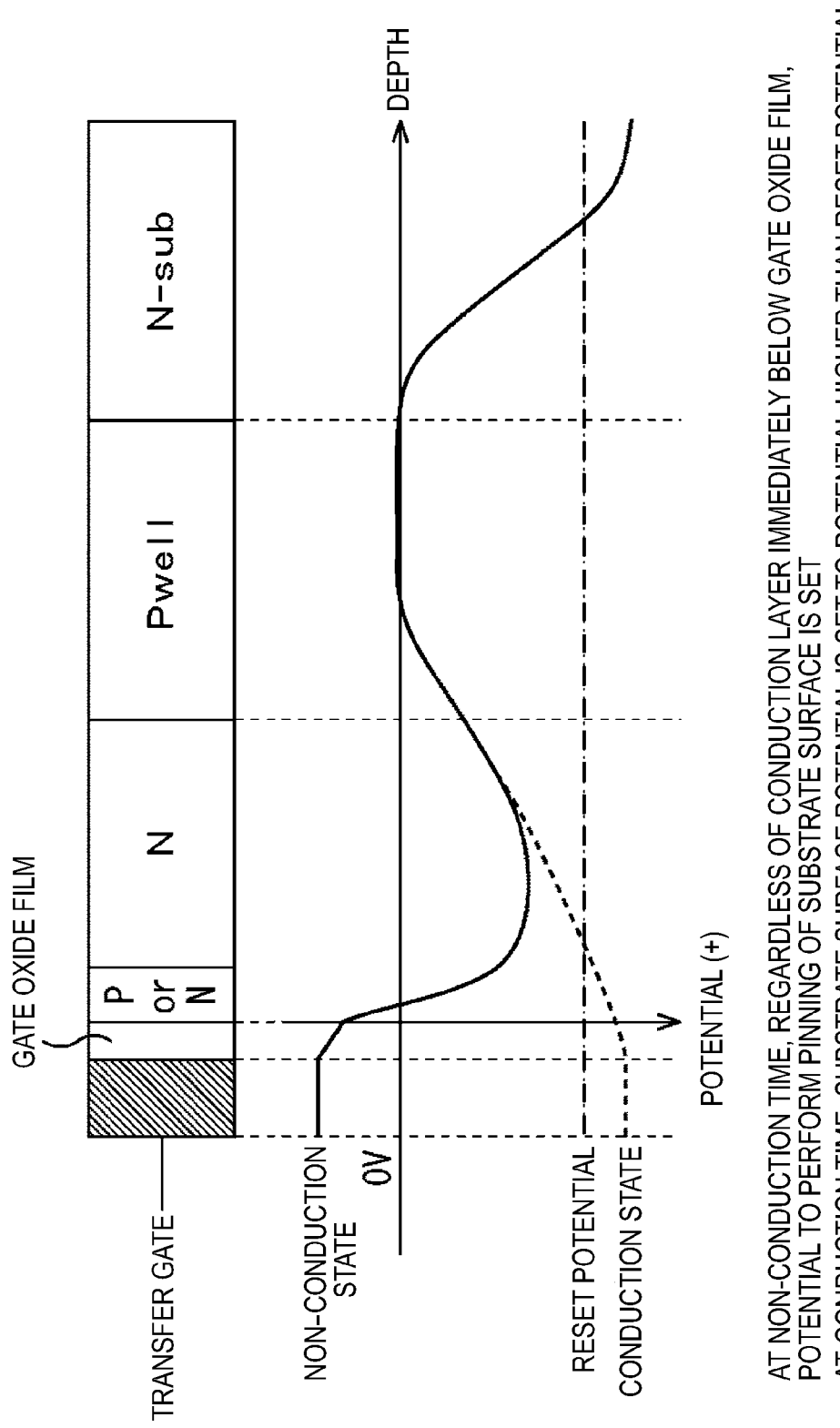
FIG. 46 is a potential view in the substrate depth direction provided for explaining requirements to perform pinning of a substrate surface and combine the potentials of an FD portion, first charge accumulation portion and second charge accumulation portion.

Here, each potential of the first to third transfer gate portions 62 to 64 and the gate electrode 661 of the first charge accumulation portion 66 will be explained. FIG. 46 is a potential view in the substrate depth direction provided for explaining requirements to perform pinning of the substrate surface and combine the potentials of the FD portion 71, the first charge accumulation portion 66 and the second charge accumulation portion 67.

Regarding the potentials of the first to third transfer gate portions 62 to 64 and the gate electrode 661 of the first charge accumulation portion 66 in a non-conduction state, regardless of a conductive layer immediately below a gate oxide film, they are set to a potential (for example, negative potential) to make the substrate surface get in a pinning state. By this means, it is possible to make the substrate surface get in a pinning state, and acquire an improvement effect of dark-situation characteristics such as a dark current and white spot.

The substrate surface potentials of the second and third transfer gate portions 63 and 64 and the gate electrode 661 of the first charge accumulation portion 66 in a conduction state are set to a potential higher than the reset voltage $V_{DR}$, that is, a potential applied to the drain of the reset gate portion 65. By this means, it is possible to combine the potentials of the FD portion 71, the first charge accumulation portion 66 and the second charge accumulation portion 67.

4. CONFIGURATION EXAMPLE OF SECOND CHARGE ACCUMULATION PORTION 67

Although some configuration examples of the second charge accumulation portion 67 have been illustrated in FIG. 5 to FIG. 7, furthermore, a configuration example of the second charge accumulation portion 67 will be explained in more detail below.

Figure 47:
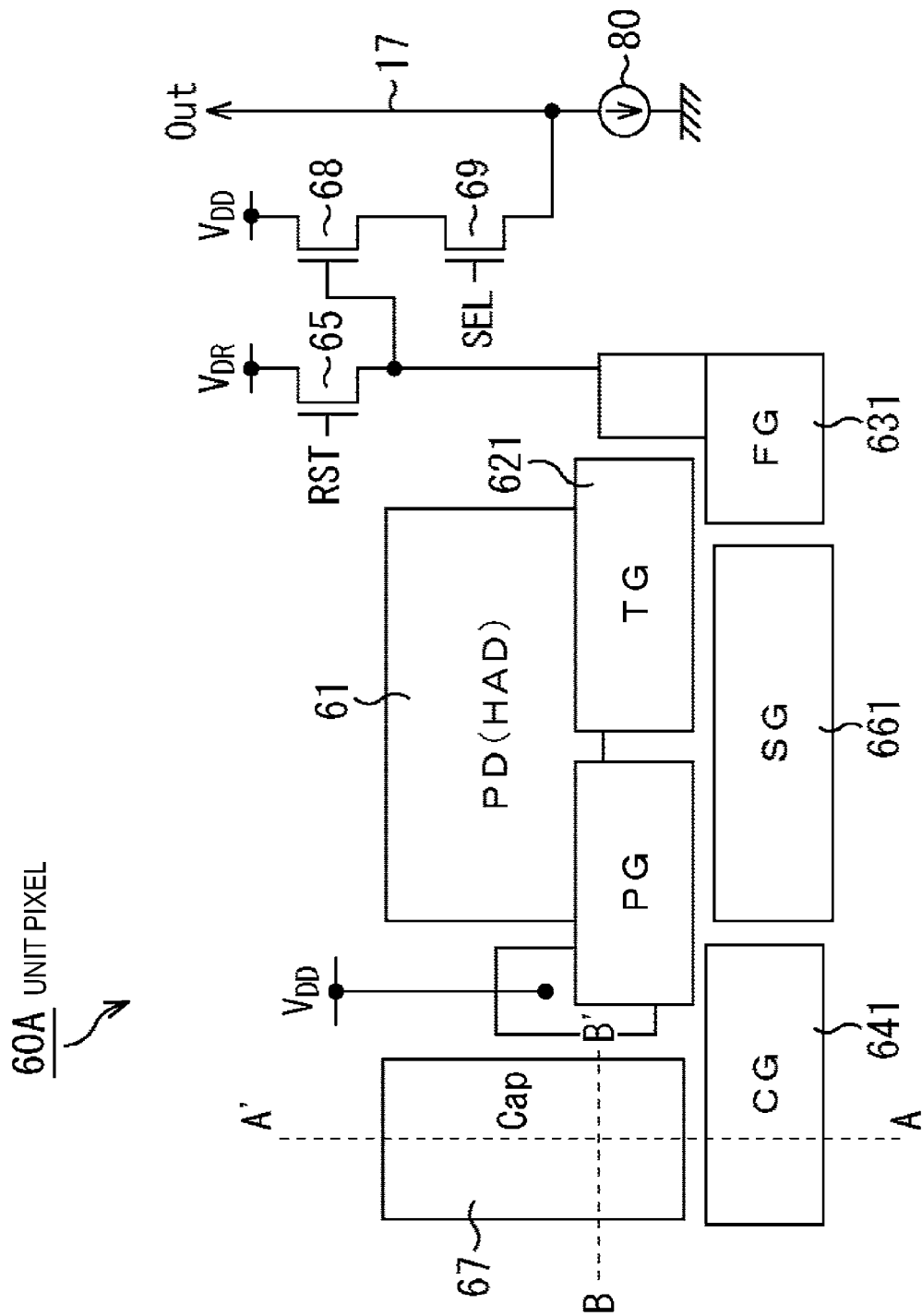
FIG. 47 is a schematic view illustrating a variation example of a pixel configuration of a unit pixel.

FIG. 47 illustrates a variation example of a pixel configuration of a unit pixel of a plane pattern illustrating a pixel layout of the unit pixel 60A described with reference to FIG. 9. Here, in the figure, the same reference numerals are assigned to the components corresponding to those in FIG. 9.

The plane pattern of the unit pixel 60A in FIG. 47 and the plane pattern of the unit pixel 60A in FIG. 9 are substantially the same but are largely different in that a position of the second charge accumulation portion (Cap) 67 is illustrated.

4-1. Configuration Example of Second Charge Accumulation Portion 67A

Figure 48:
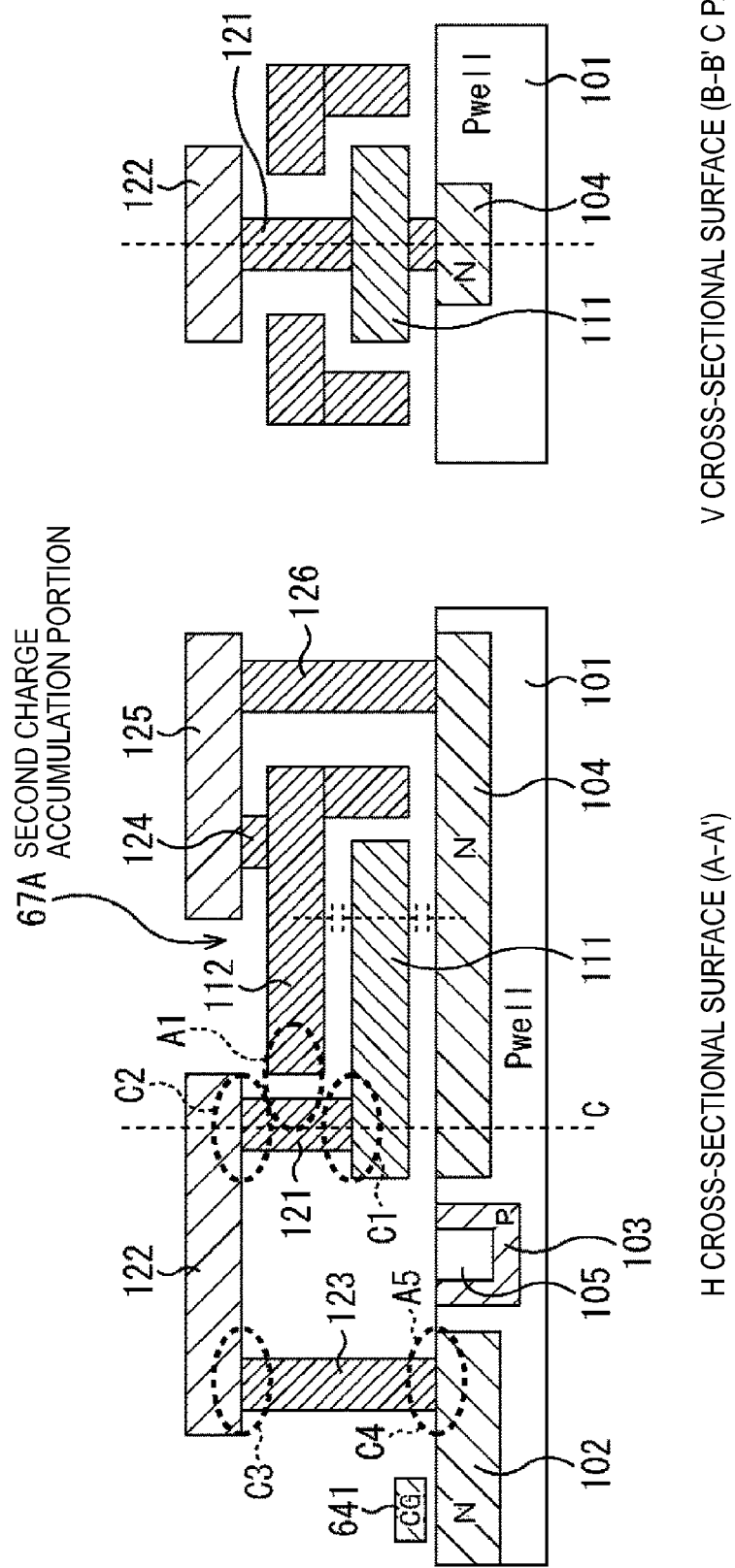
FIG. 48 is a cross-sectional view (version 1) illustrating a configuration example of the second charge accumulation portion.
Figure 49:
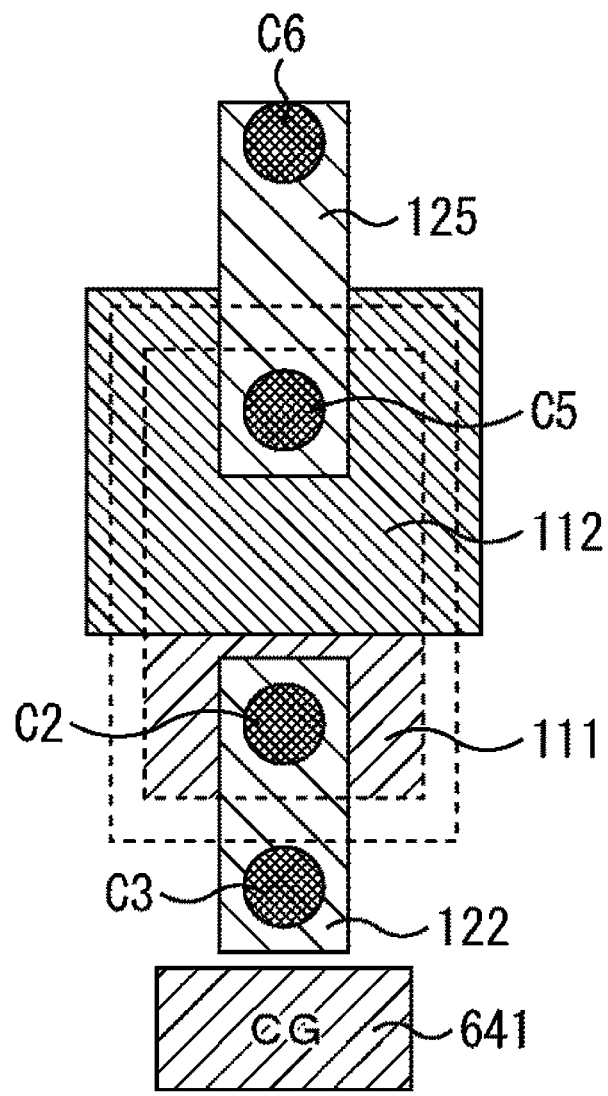
FIG. 49 is a plane view (version 1) illustrating a configuration example of the second charge accumulation portion.

FIG. 48 and FIG. 49 are schematic views illustrating configuration examples of the second charge accumulation portion 67A. FIG. 48 illustrates an A-A' arrow cross-sectional surface in the plane pattern of the unit pixel 60A in FIG. 47 and a B-B' arrow cross-sectional surface in the C part of the A-A arrow cross-sectional view. Also, in FIG. 48, illustration of the N-type semiconductor substrate 51 in FIG. 5 and a part corresponding to the insulating film is omitted. Also, FIG. 49 illustrates a plane view of the periphery of the second charge accumulation portion 67A.

As illustrated in FIG. 48, an N-type semiconductor area 102, a P-type semiconductor area 103 having a U-shaped cross-sectional surface and an N-type semiconductor area 104 are formed on the surface layer part of a P-type semiconductor area 101 corresponding to the P-type well 52 in FIG. 5. Also, an element isolation insulating film 105 is formed on the concave part of the P-type semiconductor area 103. Also, one of the N-type semiconductor area 102 and the N-type semiconductor area 104 is connected to a power source and the other is connected to a ground.

An intermediate electrode 111 including polysilicon is formed, as an accumulation node, above the N-type semiconductor area 104 as a lower electrode through the intermediary of a capacity insulating film (not illustrated). The intermediate electrode 111 is electrically connected to the N-type semiconductor area 102 by wires 121 to 123. Also, a planar-type MOS capacitor (hereinafter referred to as "first capacitor") is formed between the intermediate electrode 111 and the N-type semiconductor area 104.

Also, for example, the wire 121 and the wire 123 have a three-layer structure of W (Wolfram), TiN (Titanium Nitride) and Ti (Titanium). Among these, the TiN layer is a barrier layer and the Ti layer is a contact layer. Also, for example, an upper layer wire 122 has a three-layer structure of Cu (Cuprum), TaN (Tantalum Nitride) and Ta (Tantalum). Among these, the TaN layer is a barrier layer and the Ta layer is a contact layer.

An upper electrode 112 is formed above the intermediate electrode 111 through the intermediary of a capacity insulating film (not illustrated) so as to cover part of the upper and side surfaces of the intermediate electrode 111. The upper electrode 112 is connected to the N-type semiconductor area 104 by wires 124 to 126. Subsequently, a stack-type capacitor (hereinafter referred to as "second capacitor") is formed between the intermediate electrode 111 and the upper electrode 112 so as to be connected to the first capacitor in parallel. The second charge accumulation portion 67A is formed with these first capacitor and second capacitor.

Also, for the upper electrode 112, for example, wolfram is used, which is used as a light blocking material in an image sensor such as a CCD (Charge Coupled Device) image sensor and has a high extinction coefficient and high optical absorption. Also, similar to the wires 121 and 123, the wires 124 and 126 have a three-layer structure of W, TiN and Ti, for example. Further, similar to the upper layer wire 122, an upper layer wire 125 has a three-layer structure of Cu, TaN and Ta, for example.

Meanwhile, in the second charge accumulation portion 67A, as illustrated in FIG. 48 and FIG. 49, there is an exposed part, which is not covered by the upper electrode 112 having a light blocking effect, in the upper and side surfaces of the intermediate electrode 111, as seen from the top. Therefore, for example, light enters the intermediate electrode 111 from an interspace in an area A1 in FIG. 48 and charges are generated by photoelectric conversion, which is an occurrence cause of false signals (or false images).

Also, in contacts (i.e. junction parts) C1 to C4 between the intermediate electrode 111 and the N-type semiconductor area 102, materials of largely different work functions are joined. Also, an electric field is generated by work function differences in the contacts C1 to C4, and, by this electric field, electrons are likely to be excited from the defect level of the junction parts or their periphery, which is an occurrence cause of dark current.

In the following, a contact to which materials of largely different work functions are joined is referred to as different-material junction part. Also, in FIG. 49, the contact C5 represents a contact between the upper layer wire 125 and the wire 124, and the contact C6 represents a contact between the upper layer wire 125 and the wire 126, where these are different-type junction parts.

4-2. Configuration Example of Second Charge Accumulation Portion 67B

Figure 50:
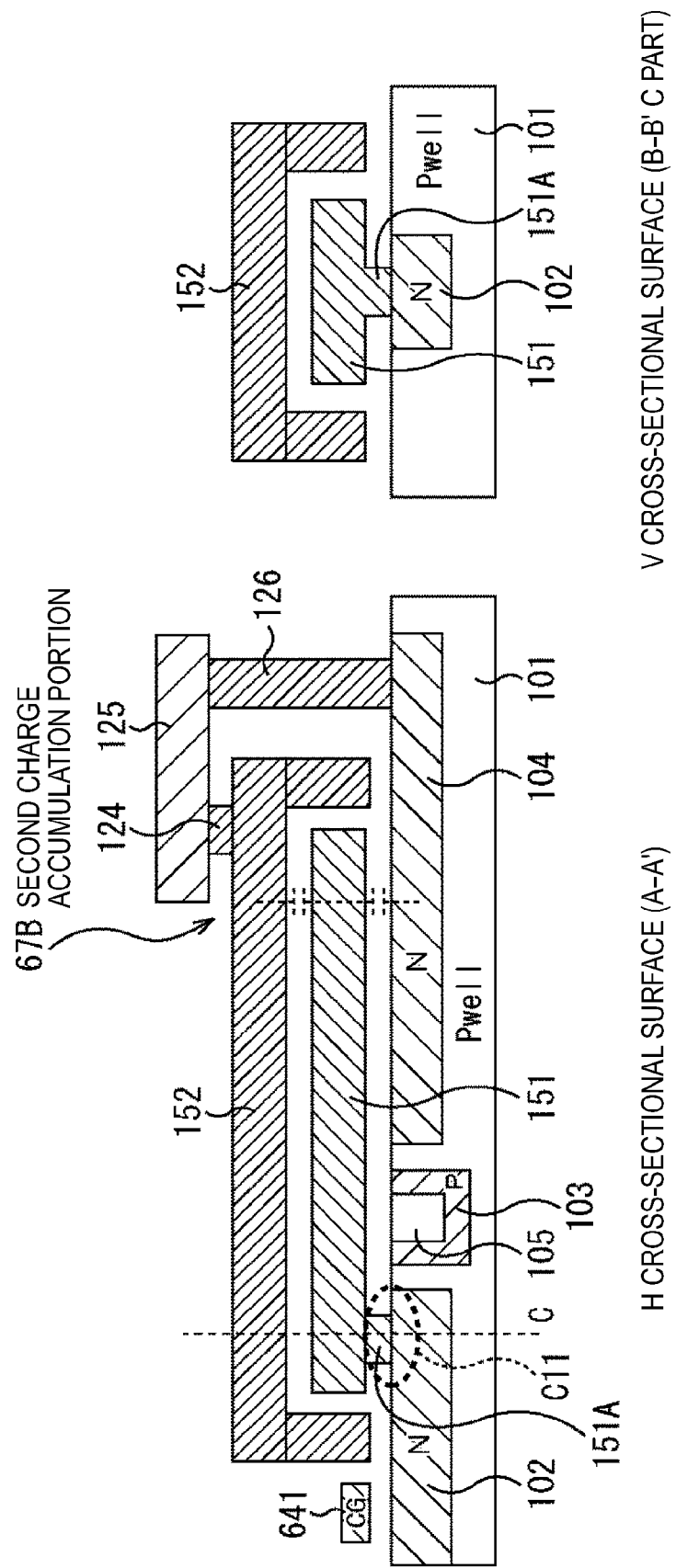
FIG. 50 is a cross-sectional view (version 2) illustrating a configuration example of the second charge accumulation portion.
Figure 51:
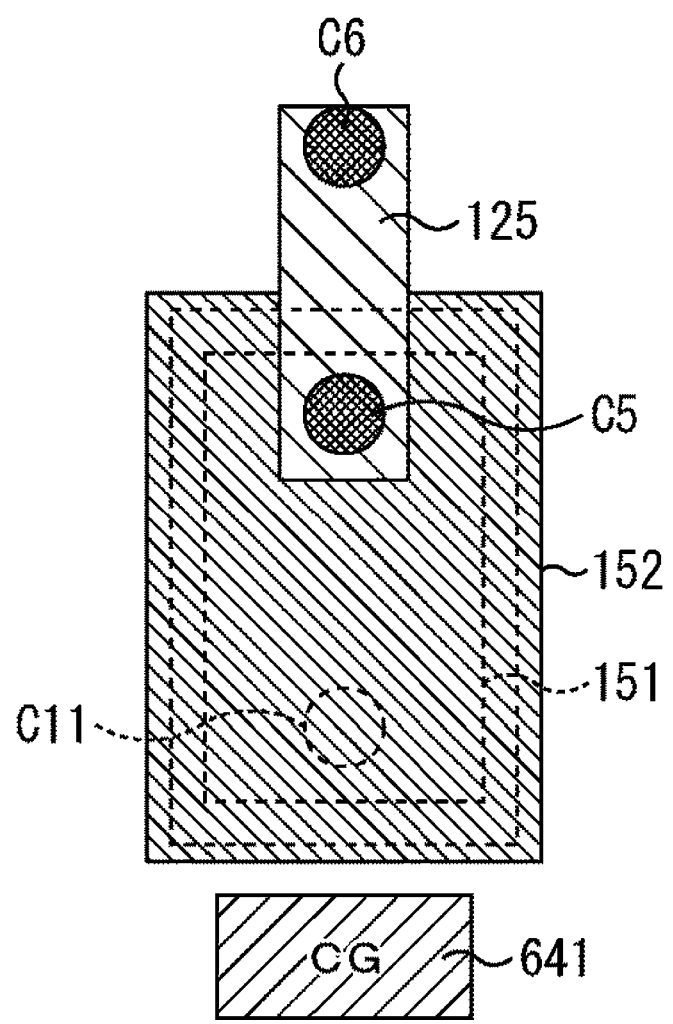
FIG. 51 is a plane view (version 2) illustrating a configuration example of the second charge accumulation portion.

FIG. 50 and FIG. 51 are schematic views illustrating configuration examples of the second charge accumulation portion 67B. The second charge accumulation portion 67B suppresses a false signal and dark current caused in the second charge accumulation portion 67A described above.

Similar to FIG. 48, FIG. 50 illustrates an A-A' arrow cross-sectional surface in the plane pattern of the unit pixel 60A in FIG. 47 and a B-B' arrow cross-sectional surface in the C part of the A-A' arrow cross-sectional view. Here, in FIG. 50, illustration of the N-type semiconductor substrate 51 in FIG. 5 and a part corresponding to the insulating film is omitted. Also, similar to FIG. 49, FIG. 51 illustrates a plane view of the periphery of the second charge accumulation portion 67B. Here, in the figure, the same reference numerals are assigned to the components corresponding to those in FIG. 48 or FIG. 49.

As illustrated in FIG. 50, an intermediate electrode 151 including polysilicon is formed, as an accumulation node, above the N-type semiconductor area 104 as a lower electrode through the intermediary of a capacity insulating film (not illustrated). A connection portion 151A is formed in the intermediate electrode 151 and is directly connected to the N-type semiconductor area 102 in an electrical manner. Also, a planar-type MOS capacitor (hereinafter referred to as "first capacitor") is formed between the intermediate electrode 151 and the N-type semiconductor area 104.

An upper electrode 152 is formed above the intermediate electrode 151 through the intermediary of a capacity insulating film (not illustrated) so as to cover the entire upper and side surfaces of the intermediate electrode 151. The upper electrode 152 is connected to the N-type semiconductor area 104 by the wires 124 to 126. Subsequently, a stack-type capacitor (hereinafter referred to as "second capacitor") is formed between the intermediate electrode 151 and the upper electrode 152 so as to be connected to the first capacitor in parallel. The second charge accumulation portion 67B is formed with these first capacitor and second capacitor.

For the upper electrode 152, for example, similar to the upper electrode 112 of the second charge accumulation portion 67A, wolfram having a high extinction coefficient is used. Also, for the upper electrode 152, other metal materials can be used as long as they unite light-blocking performance and performance as the upper electrode of the second capacitor. For example, it is possible to use a material such as titanium and titanium nitride alone or use layered materials. However, it is desirable to use a material of a high extinction coefficient such as wolfram, so as to be able to block incident light form the outside more reliably. Also, in the case of using wolfram as the upper electrode 112, with a thickness of around 200 nm, it is possible to dim light by around −100 dB.

As illustrated in FIG. 50 and FIG. 51, in the second charge accumulation portion 67B, as seen from the top, the upper and side surfaces of the intermediate electrode 151 are covered by the upper electrode 152 having a light blocking effect and incident light into the intermediate electrode 151 is blocked. Therefore, an occurrence of false signals (or false images) by photoelectric conversion in the intermediate electrode 151 is suppressed.

Also, the intermediate electrode 151 is formed with polysilicon of the same type as the N-type semiconductor area 102 (i.e. silicon substrate) and directly connected to the N-type semiconductor area 102. By this means, only the contact C11 having a small work function difference is present as a contact between the N-type semiconductor area 102 and the intermediate electrode 151, and therefore it is possible to remove different-type material junction parts. As a result, a field occurrence by work function differences is reduced and an occurrence of dark current is suppressed.

Further, it is possible to delete the wires 121 to 123 and make part of the height of the second charge accumulation portion 67B lower than the second charge accumulation portion 67A. As a result, it makes it easier to lead light to the photodiode 61 of the unit pixel 60A and it is possible to improve light sensitivity.

Also, for the intermediate electrode 151, in addition to polysilicon, it is possible to use a material which is lattice-matched to silicon and has a small work function difference with respect to the silicon. For example, the compound of polysilicon chalcopyrite, zinc sulfur and gallium phosphide can be used for the intermediate electrode 151.

Also, for example, a result of forming silicon by epitaxial growth so as to be lattice-matched to the N-type semiconductor area 102, can be used for the intermediate electrode 151. By this means, it is possible to reduce the defect of an interface of the contact C11 and further suppress an occurrence of dark current.

4-3. Configuration Example of Second Charge Accumulation Portion 67C

Figure 52:
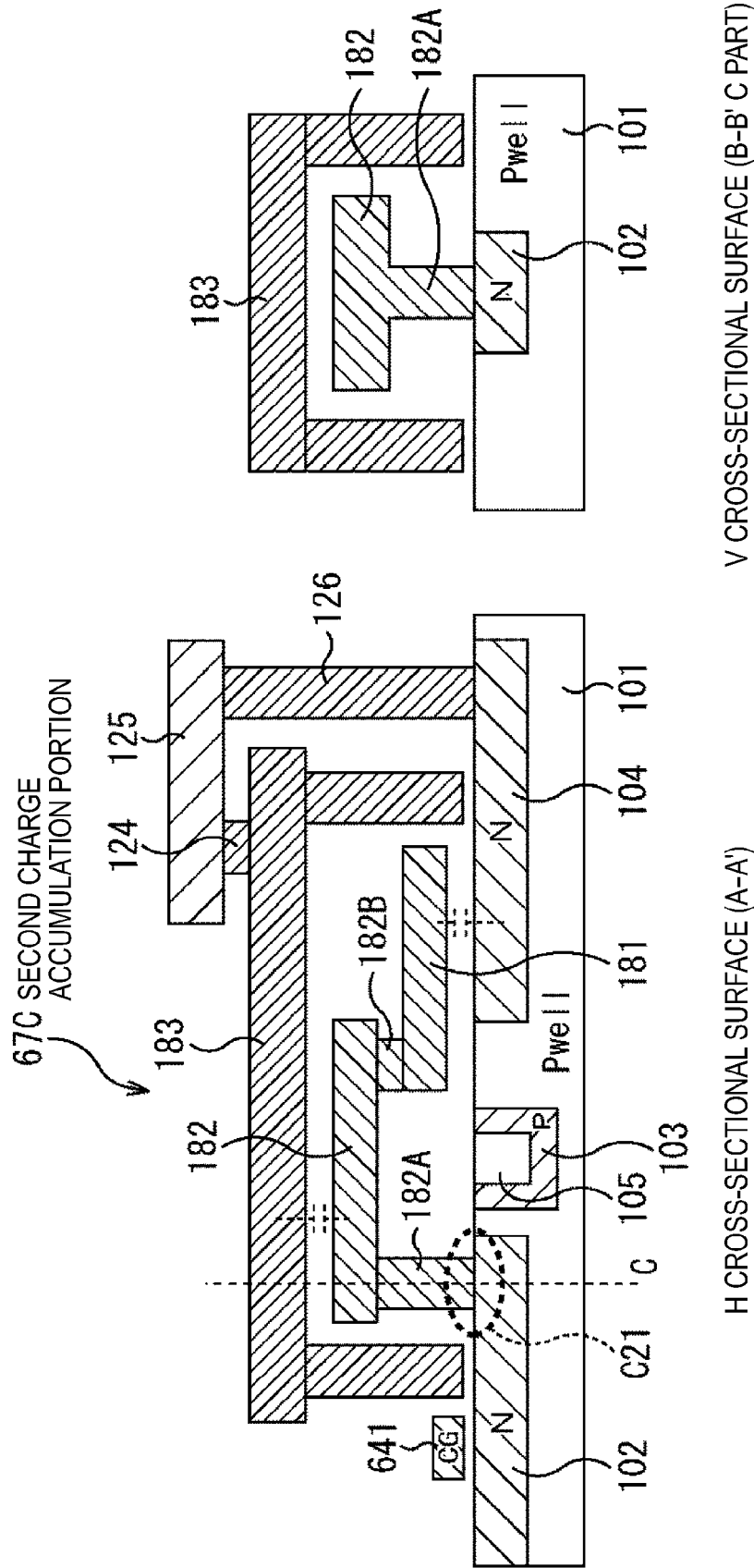
FIG. 52 is a cross-sectional view (version 3) illustrating a configuration example of the second charge accumulation portion.
Figure 53:
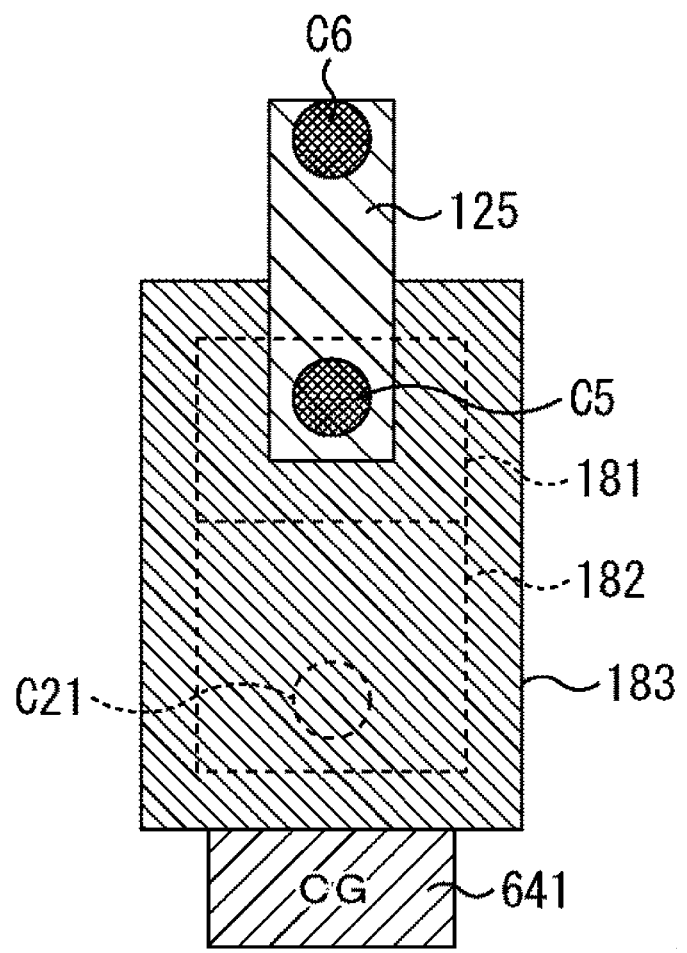
FIG. 53 is a plane view (version 3) illustrating a configuration example of the second charge accumulation portion.

FIG. 52 and FIG. 53 are schematic views illustrating configuration examples of the second charge accumulation portion 67C. When the second charge accumulation portion 67C and the second charge accumulation portion 67B are compared, there is a difference that the intermediate electrode has a two-layer configuration.

Similar to FIG. 48, FIG. 52 illustrates an A-A' arrow cross-sectional surface in the plane pattern of the unit pixel 60A in FIG. 29 and a B-B' arrow cross-sectional surface in the C part of the A-A' arrow cross-sectional view. Here, in FIG. 52, illustration of the N-type semiconductor substrate 51 in FIG. 5 and a part corresponding to the insulating film is omitted. Also, similar to FIG. 49, FIG. 53 illustrates a plane view of the periphery of the second charge accumulation portion 67C. Here, in the figure, the same reference numerals are assigned to the components corresponding to those in FIG. 50 or FIG. 51.

As illustrated in FIG. 52, an intermediate electrode 181 including polysilicon is formed, as an accumulation node, above the N-type semiconductor area 104 as a lower electrode through the intermediary of a capacity insulating film (not illustrated). Also, a planar-type MOS capacitor (hereinafter referred to as first capacitor) is formed between the intermediate electrode 181 and the N-type semiconductor area 104.

An intermediate electrode 182 including polysilicon is formed, as an accumulation node, above the intermediate electrode 181 so as to partially overlap the intermediate electrode 181, seen from the above. A connection portion 182A is formed in the intermediate electrode 182 and directly connected to the N-type semiconductor area 102 in an electrical manner. Also, a connection portion 182B is formed in the intermediate electrode 182 and directly connected to the intermediate electrode 181 in an electrical manner.

An upper electrode 183 is formed above the intermediate electrodes 181 and 182 through the intermediary of a capacity insulating film (not illustrated) so as to cover the entire upper and side surfaces of the intermediate electrodes 181 and 182. The upper electrode 183 is connected to the N-type semiconductor area 104 by the wires 124 to 126. Subsequently, a stack-type capacitor (hereinafter referred to as second capacitor) is formed between the intermediate electrode 182 and the upper electrode 183 so as to be connected to the first capacitor in parallel. The second charge accumulation portion 67C is formed with these first capacitor and second capacitor.

Also, for the upper electrode 183, it is possible to use the same material as that of the upper electrode 152 of the second charge accumulation portion 67B.

As illustrated in FIG. 52 and FIG. 53, in the second charge accumulation portion 67C, as seen from the top, the upper and side surfaces of the intermediate electrodes 181 and 182 are covered by the upper electrode 183 having a light blocking effect and incident light into the intermediate electrodes 181 and 182 is blocked. Therefore, an occurrence of false signals (or false images) by photoelectric conversion in the intermediate electrodes 181 and 182 is suppressed.

Also, the intermediate electrode 182 is formed with polysilicon of the same type as the N-type semiconductor area 102 (i.e. silicon substrate) and directly connected to the N-type semiconductor area 102. By this means, only a contact C21 having a small work function difference is present as a contact between the N-type semiconductor area 102 and the intermediate electrode 181, and therefore it is possible to remove different-type material junction parts. As a result, a field occurrence by work function differences is reduced and an occurrence of dark current is suppressed.

Further, the intermediate electrode has a two-layer configuration such that, compared to the intermediate electrode 151 of the second charge accumulation portion 67B, the intermediate electrode 182 is formed in a higher position. By this means, even if element isolation formed with the P-type semiconductor area 103 and the element isolation insulating film 105 is performed in a shallow and thin manner, a channel is formed on a silicon substrate below the element separation by the potential of the intermediate electrode 182 and therefore the N-type semiconductor area 104 as a lower electrode and the N-type semiconductor area 102 as a contact part of the intermediate electrode 182 are prevented from being shorted out. Here, if the element isolation is formed with diffusion layer isolation by P-type impurities instead of physical isolation such as STI (Shallow Trench Isolation), it is possible to acquire the same effect.

Also, for the intermediate electrodes 181 and 182, similar to the intermediate electrode 151 if the second charge accumulation portion 67B, in addition to polysilicon, it is possible to use a material which is lattice-matched to silicon and has a small work function difference with respect to the silicon.

4-4. Configuration Example of Second Charge Accumulation Portion 67D

Figure 54:
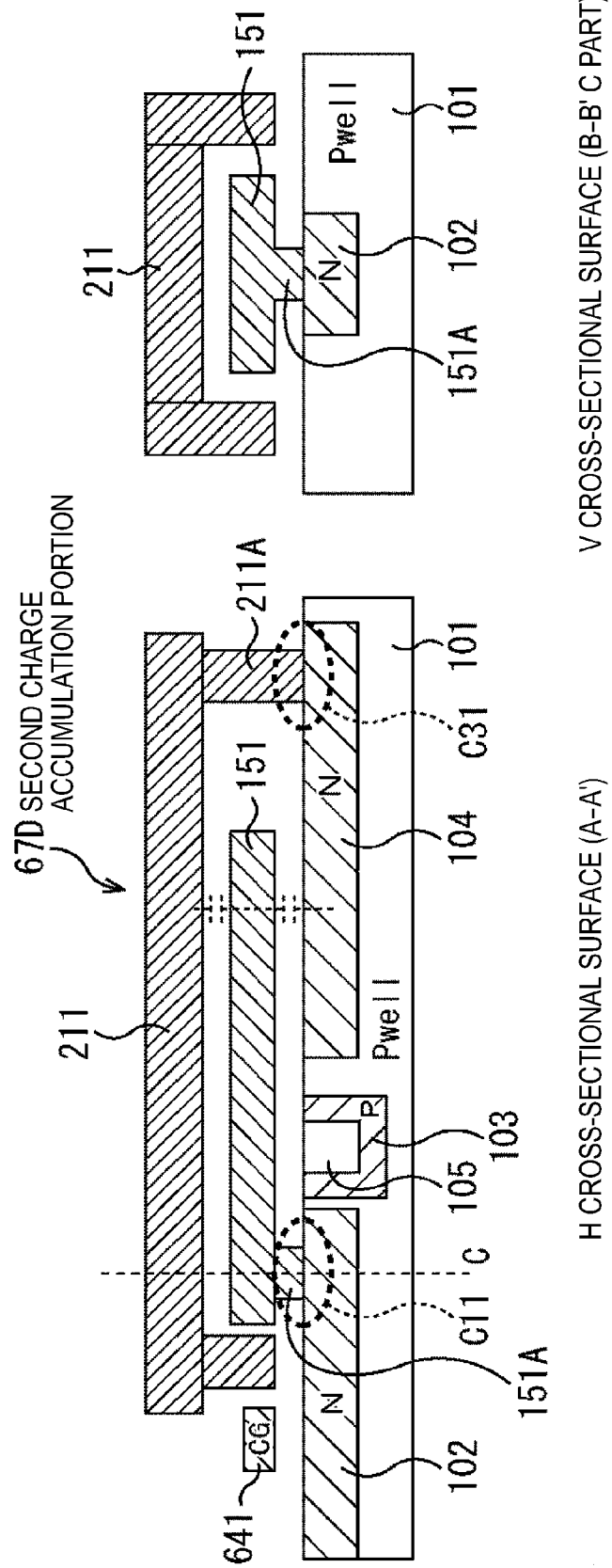
FIG. 54 is a cross-sectional view (version 4) illustrating a configuration example of the second charge accumulation portion.
Figure 55:
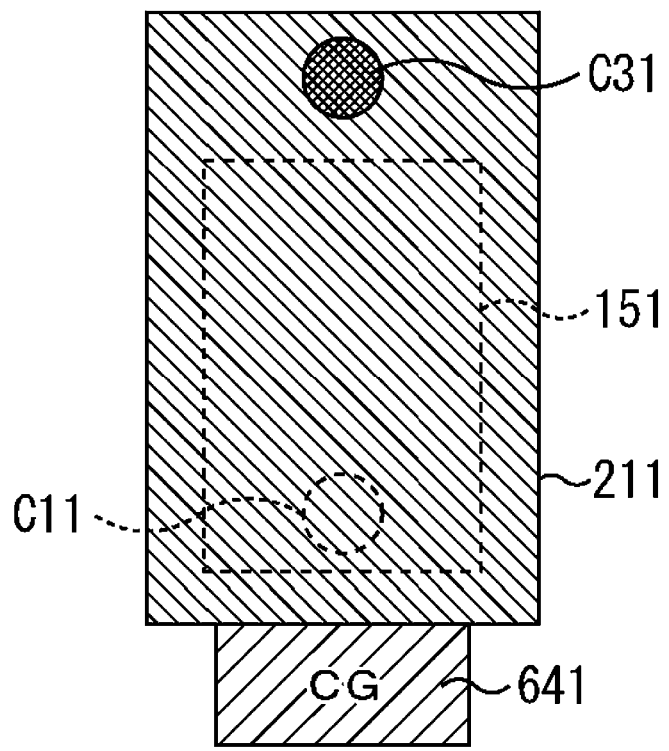
FIG. 55 is a plane view (version 4) illustrating a configuration example of the second charge accumulation portion.

FIG. 54 and FIG. 55 are schematic views illustrating configuration examples of the second charge accumulation portion 67D. When the second charge accumulation portion 67D and the second charge accumulation portion 67B are compared, there is a difference that the upper electrode is directly connected to the N-type semiconductor area 104.

Similar to FIG. 48, FIG. 54 illustrates an A-A' arrow cross-sectional surface in the plane pattern of the unit pixel 60A in FIG. 47 and a B-B' arrow cross-sectional surface in the C part of the A-A' arrow cross-sectional view. Here, in FIG. 54, illustration of the N-type semiconductor substrate 51 in FIG. 5 and a part corresponding to the insulating film is omitted. Also, similar to FIG. 49, FIG. 55 illustrates a plane view of the periphery of the second charge accumulation portion 67D. Here, in the figure, the same reference numerals are assigned to the components corresponding to those in FIG. 50 or FIG. 51.

As illustrated in FIG. 54, an upper electrode 211 is formed above the intermediate electrode 151 through the intermediary of a capacity insulating film (not illustrated) so as to cover the entire upper and side surfaces of the intermediate electrode 151. A connection portion 211A is formed in the upper electrode 211 and directly connected to the N-type semiconductor area 104 in an electrical manner. Subsequently, a stack-type capacitor (hereinafter referred to as second capacitor) is formed between the intermediate electrode 151 and the upper electrode 211 so as to be connected in parallel to the first capacitor between the intermediate electrode 151 and the N-type semiconductor area 104. The second charge accumulation portion 67D is formed with these first capacitor and second capacitor.

For the upper electrode 211, for example, it is possible to use the same material as that of the upper electrode 152 of the second charge accumulation portion 67B. However, for example, in a case where the upper electrode 152 is formed with wolfram, a three-layer structure of W, TiN and Ti is employed in at least the vicinity of the contact C31 with respect to the N-type semiconductor area 104.

In the second charge accumulation portion 67D, similar to the second charge accumulation portion 67B, it is possible to suppress an occurrence of false signals (or false images) by photoelectric conversion in the intermediate electrode 151 and an occurrence of dark current in the junction part C11 between the N-type semiconductor area 102 and the intermediate electrode 151.

Also, it is possible to simplify the upper wire layout and make the entire height of the second charge accumulation portion 67D lower than the second charge accumulation portion 67B. As a result, it makes it easier to lead light to the photodiode 61 of the unit pixel 60A and it is possible to improve light sensitivity.

4-5. Configuration Example of Second Charge Accumulation Portion 67E

Figure 56:
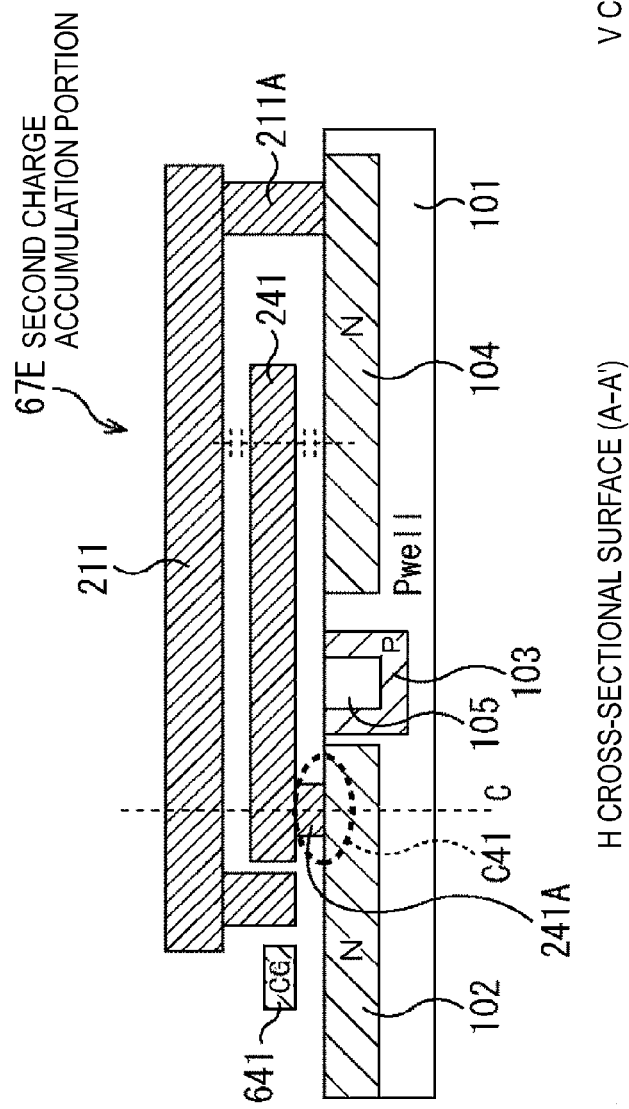
FIG. 56 is a cross-sectional view (version 5) illustrating a configuration example of the second charge accumulation portion.

FIG. 56 is a schematic view illustrating a configuration example of the second charge accumulation portion 67E. When the second charge accumulation portion 67E and the second charge accumulation portion 67D are compared, there is a difference that a metal material is used for the intermediate electrode instead of polysilicon.

Similar to FIG. 48, FIG. 56 illustrates an A-A' arrow cross-sectional surface in the plane pattern of the unit pixel 60A in FIG. 47 and a B-B' arrow cross-sectional surface in the C part of the A-A' arrow cross-sectional view. Here, in the figure, the same reference numerals are assigned to the components corresponding to those in FIG. 54.

Figure 57:
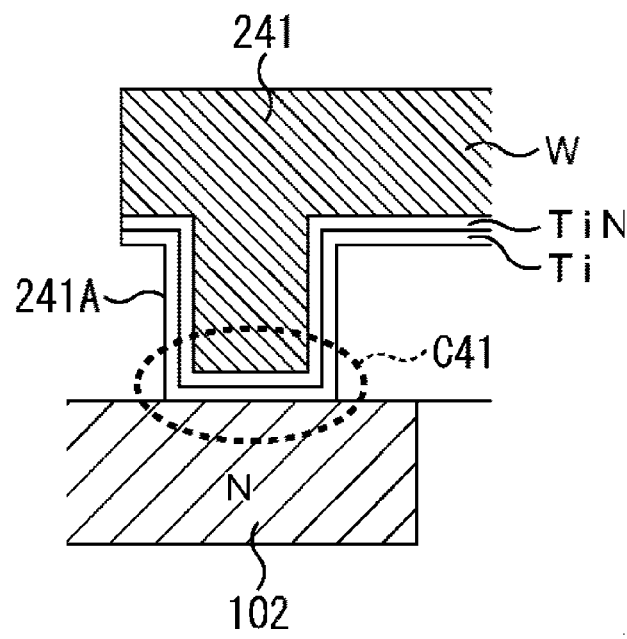
FIG. 57 is a view illustrating the contact vicinity of an intermediate electrode and N-type semiconductor area.

The intermediate electrode 241 has a similar shape to the intermediate electrode 151 of the second charge accumulation portion 67D but differs from the intermediate electrode 151 in that it is formed with a metal material such as titanium and wolfram. Also, in a case where the intermediate electrode 241 is formed with wolfram, as illustrated in FIG. 57, a three-layer structure of W, TiN and Ti is employed at least in the vicinity of the contact C41 with respect to the N-type semiconductor area 102.

Thus, even if a metal material is used for the intermediate electrode 241, compared to the second charge accumulation portion 67A, it is possible to reduce the number of different-type material junction parts between the intermediate electrode 241 and the N-type semiconductor area 102. Therefore, in the second charge accumulation portion 67E, compared to the second charge accumulation portion 67A, it is possible to suppress an occurrence of dark current in different-type junction parts.

4-6. Configuration Example of Second Charge Accumulation Portion 67F

Figure 58:
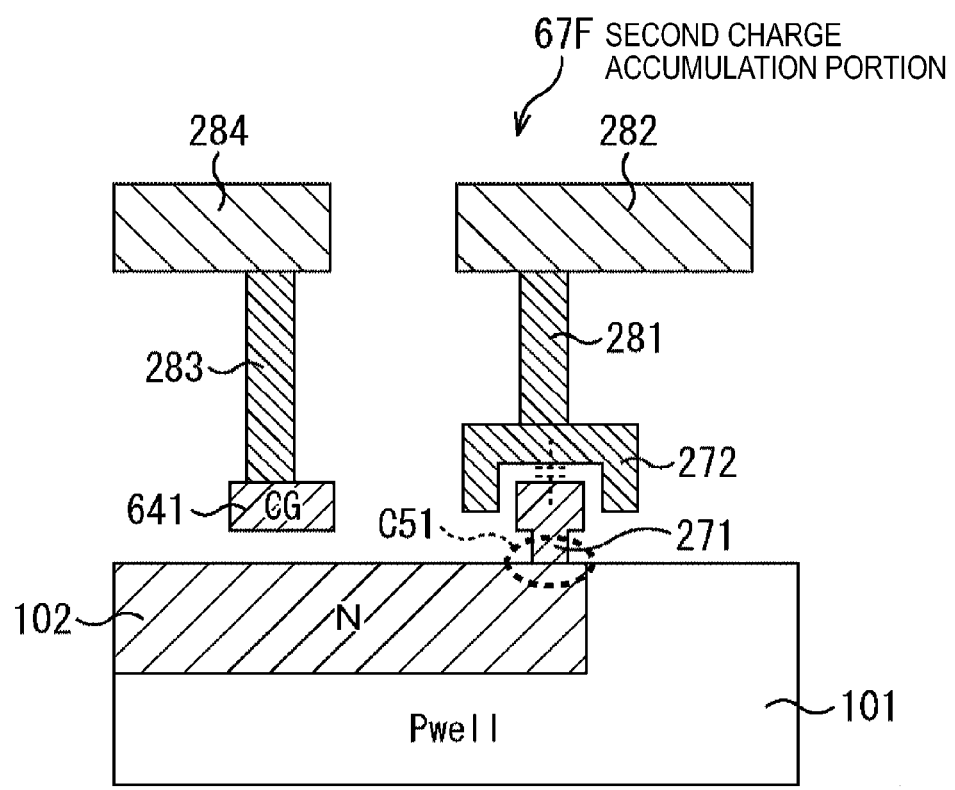
FIG. 58 is a cross-sectional view (version 6) illustrating a configuration example of the second charge accumulation portion.

FIG. 58 is a schematic view illustrating a configuration example of the second charge accumulation portion 67F. In this embodiment, the second charge accumulation portion 67F is formed with a cylinder-type capacitor.

Similar to FIG. 48, FIG. 58 illustrates an A-A' arrow cross-sectional surface in the plane pattern of the unit pixel 60A in FIG. 47. Here, in the figure, the same reference numerals are assigned to the components corresponding to those in FIG. 48.

In the second charge accumulation portion 67F, a T-shaped lower electrode 271 including polysilicon is formed on the N-type semiconductor area 102 as an accumulation node so as to be directly connected to the N-type semiconductor area 102 in an electrical manner.

An upper electrode 272 is formed above the lower electrode 271 through the intermediary of a capacity insulating film (not illustrated) so as to cover the entire upper surface of the lower electrode 271 and substantially the entire side surface of the lower electrode 271. The upper electrode 272 is connected to an upper layer wire 282 by a wire 281. By these wire 281 and upper layer wire 282, the upper electrode 152 is set to a predetermined potential. Also, a cylinder-type capacitor is formed between the lower electrode 271 and the upper electrode 272. The second charge accumulation portion 67F is formed with this cylinder-type capacitor. Also, the gate electrode 641 is connected to the upper layer wire 284 via the wire 283.

As a material of the upper electrode 272, it is possible to use the same material as that of the upper electrode 152 of the second charge accumulation portion 67B. Also, for example, the wires 281 and 283 have a three-layer structure of W, TiN and Ti. Further, for example, the upper layer wire 282 and the upper layer wire 284 have a three-layer structure of Cu, TaN and Ta.

As illustrated in FIG. 58, in the second charge accumulation portion 67F, as seen from the top, the entire upper side surface of the lower electrode 271 and substantially the entire side of the lower electrode 271 are covered by the upper electrode 272 having a light blocking effect and incident light into the lower electrode 271 is blocked. Therefore, an occurrence of false signals (or false images) by photoelectric conversion in the lower electrode 271 is suppressed.

Also, the lower electrode 271 is formed with polysilicon of the same type as the N-type semiconductor area 102 (i.e. silicon substrate) and directly connected to the N-type semiconductor area 102. Accordingly, only a contact C51 having a small work function difference is present as a contact between the N-type semiconductor area 102 and the lower electrode 271, and therefore it is possible to remove different-type material conjunction portions. As a result, a field occurrence by work function differences is reduced and an occurrence of dark current is suppressed.

Also, for the lower electrode 271, similar to the intermediate electrode 151 of the second charge accumulation portion 67B, in addition to polysilicon, it is possible to use a material which is lattice-matched to silicon and has a small work function difference with respect to the silicon.

Also, for the lower electrode 271, similar to the intermediate electrode 241 of the second charge accumulation portion 67E, it is possible to use a metal material such as titanium and wolfram. In this case, although the work function difference in the contact C51 is large, compared to the second charge accumulation portion 67A, it is possible to reduce the number of different-type material conjunction parts and suppress an occurrence of dark current.

4-7. Configuration Example of Second Charge Accumulation Portion 67G

Figure 59:
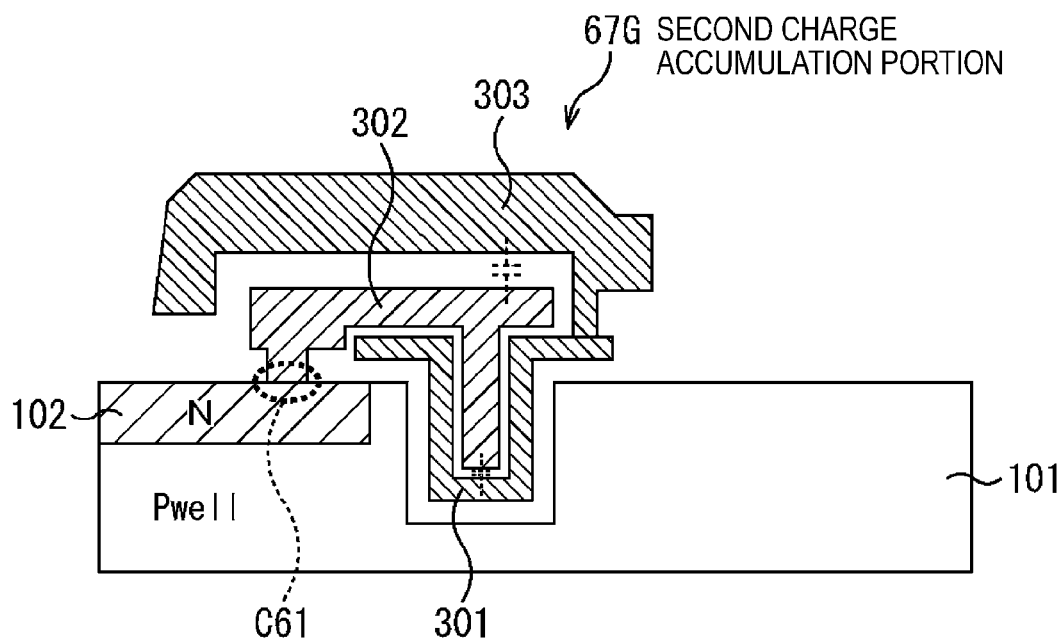
FIG. 59 is a cross-sectional view (version 7) illustrating a configuration example of the second charge accumulation portion.

FIG. 59 is a schematic view illustrating a configuration example of the second charge accumulation portion 67G. In this embodiment, the second charge accumulation portion 67G is formed with a trench-type capacitor.

Similar to FIG. 48, FIG. 59 illustrates an A-A' arrow cross-sectional surface in the plane pattern of the unit pixel 60A in FIG. 47. Here, in the figure, the same reference numerals are assigned to the components corresponding to those in FIG. 48.

In the second charge accumulation portion 67G, a trench is formed in the P-type semiconductor area 101 and a trench-type lower electrode 301 is formed in the trench through the intermediary of a capacity insulating film (not illustrated).

For the lower electrode 301, it is desirable to use a material having a higher light blocking effect, and, for example, a material having a high extinction coefficient such as wolfram and aluminum is used. Also, it is possible to use other metal materials or alloy of multiple materials.

In a groove of the lower electrode 301, an intermediate electrode 302 including polysilicon is formed as an accumulation node through the intermediary of a capacity insulating film (not illustrated). Also, the intermediate electrode 302 is directly connected to the N-type semiconductor area 102 in an electrical manner. Subsequently, the first capacitor is formed between the intermediate electrode 302 and the lower electrode 301.

An upper electrode 303 is formed above the intermediate electrode 302 through the intermediary of a capacity insulating film (not illustrated) so as to cover the entire upper surface of the intermediate electrode 302 and substantially the entire side surface of the intermediate electrode 302. The upper electrode 303 is directly connected to the lower electrode 301 in an electrical manner. Subsequently, the second capacitor is formed between the intermediate electrode 302 and the upper electrode 303 so as to be connected to the first capacitor in parallel. The second charge accumulation portion 67G is formed with these first capacitor and second capacitor.

For the upper electrode 303, for example, it is possible to use the same material as that of the lower electrode 301. For example, the lower electrode 301 and the upper electrode 303 have a three-layer structure of W, TiN and Ti.

As illustrated in FIG. 59, in the second charge accumulation portion 67G, as seen from the top, the entire upper surface of the intermediate electrode 302 and substantially the entire side surface of the intermediate electrode 302 are covered by those lower electrode 301 and upper electrode 303 having a light blocking effect, and incident light into the intermediate electrode 302 is blocked. Therefore, an occurrence of false signals (or false images) by photoelectric conversion in the intermediate electrode 302 is suppressed.

Also, the intermediate electrode 302 is formed with polysilicon of the same type as the N-type semiconductor area 102 (i.e. silicon substrate) and directly connected to the N-type semiconductor area 102. By this means, only a contact C61 having a small work function difference is present as a contact between the N-type semiconductor area 102 and the intermediate electrode 302, and therefore it is possible to remove different-type material conjunction portions. As a result, a field occurrence by work function differences is reduced and an occurrence of dark current is suppressed.

Also, for the intermediate electrode 302, similar to the intermediate electrode 151 of the second charge accumulation portion 67B, in addition to polysilicon, it is possible to use a material which is lattice-matched to silicon and has a small work function difference with respect to the silicon.

Also, for the intermediate electrode 302, similar to the intermediate electrode 241 of the second charge accumulation portion 67E, it is possible to use a metal material such as titanium and wolfram. In this case, although the work function difference in the contact C61 is large, compared to the second charge accumulation portion 67A, it is possible to reduce the number of different-type material conjunction parts and suppress an occurrence of dark current.

Further, for example, in the case of applying the second charge accumulation portion 67G to a unit pixel of a back-illuminated solid-state image sensor, it is possible to block incident light into the intermediate electrode 302 by the lower electrode 301 or the like and suppress an occurrence of false signals (or false images).

Also, in the above explanation, although an example has been described where the second charge accumulation portions 67A to 67E and the second charge accumulation portion 67G are formed with two capacitors of the first capacitor and the second capacitor, it is possible to form them with one of two capacitors.

Also, for example, in a case where a semiconductor substrate is formed with a semiconductor different from silicon such as an organic semiconductor, similarly, an electrode connected to the N-type semiconductor area 102 may be formed with a material which is lattice-matched to a material of the semiconductor substrate and has a small work function difference with respect to this material.

5. PRODUCTION PROCESS OF SECOND CHARGE ACCUMULATION PORTION 67

Next, the production process of some configuration examples of the second charge accumulation portion 67 described above will be explained.

5-1. Production Process of Second Charge Accumulation Portion 67A

First, with reference to FIG. 60 to FIG. 67, the production process of the second charge accumulation portion 67A will be explained.

Also, although illustration is omitted, the P-type semiconductor area 101 is formed on the semiconductor substrate including silicon, and the N-type semiconductor area 102 and the N-type semiconductor area 104 are formed by injecting N-type impurities into the P-type semiconductor area 101. Also, a trench is formed and P-type impurities are injected in a gap between the N-type semiconductor area 102 and the N-type semiconductor area 104 to form an element isolation including the P-type semiconductor area 103 and the element isolation insulating film 105.

Figure 60:
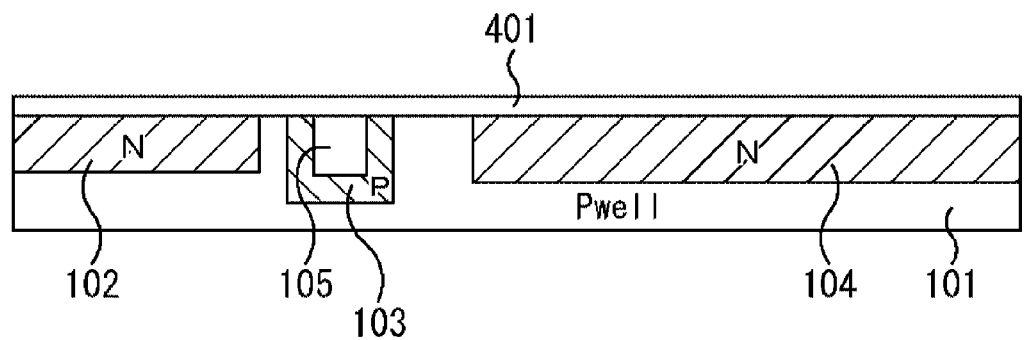
FIG. 60 is an explanatory diagram (version 1) with respect to production process of the second charge accumulation portion (version 2)

Subsequently, as illustrated in FIG. 60, an insulating film 401 by an oxide film is formed on the surface of the semiconductor substrate.

Figure 61:
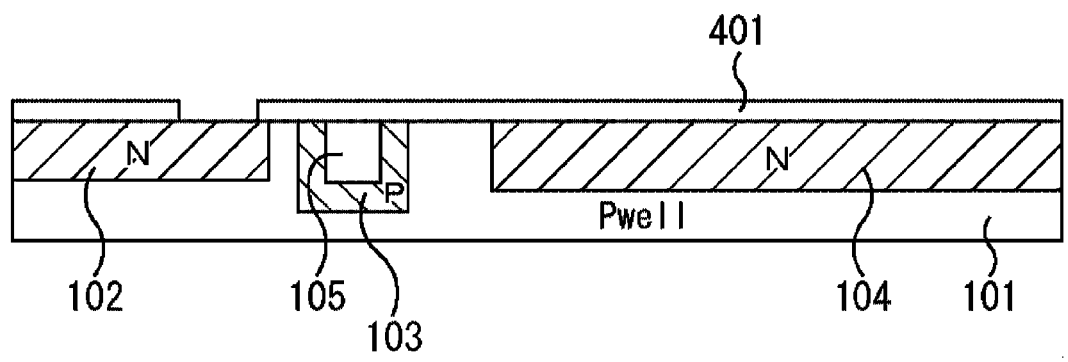
FIG. 61 is an explanatory diagram (version 2) with respect to production process of the second charge accumulation portion (version 2)

Next, as illustrated in FIG. 61, patterning by lithography method is performed to remove the insulating film 401 and form a contact hole to connect the N-type semiconductor area 102 and the intermediate electrode 151. At this time, by using a medical solution such as DHF (Dilute Hydrofluoric Acid) instead of a dry etching method, it is possible to mitigate damage to the semiconductor substrate and suppress an occurrence of defection. As a result, it is possible to reduce an occurrence of dark current.

Figure 62:
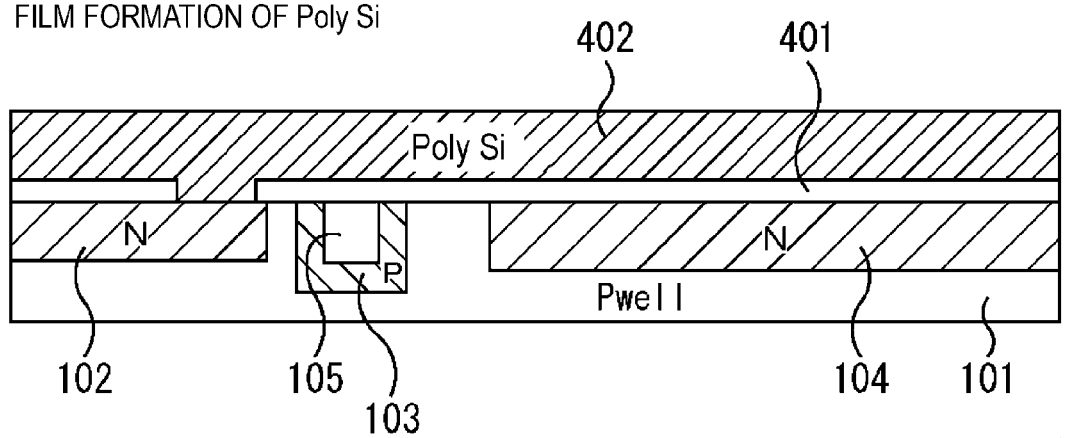
FIG. 62 is an explanatory diagram (version 3) with respect to production process of the second charge accumulation portion (version 2)

Next, as illustrated in FIG. 62, polysilicon 402 used for the intermediate electrode 151 is formed. At this time, through the contact hole, the polysilicon 402 is joined to the N-type semiconductor area 102.

Figure 63:
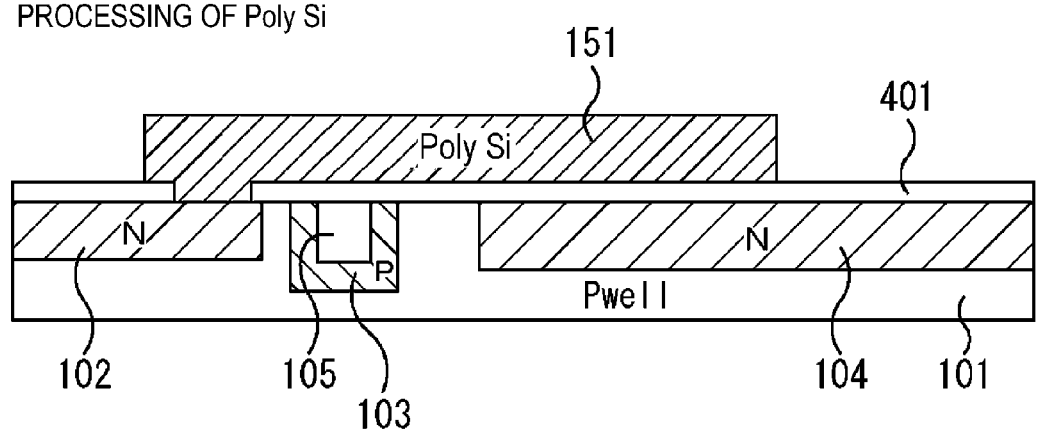
FIG. 63 is an explanatory diagram (version 4) with respect to production process of the second charge accumulation portion (version 2)

Next, as illustrated in FIG. 63, by processing the polysilicon 402 by a photoreflectance (PR) method, the intermediate electrode 151 is formed.

Also, as described above, instead of the polysilicon 402, by forming a material having a small work function difference with respect to silicon by lattice-matching to the silicon or forming silicon by epitaxial growth, it is possible to form the intermediate electrode 151.

Figure 64:
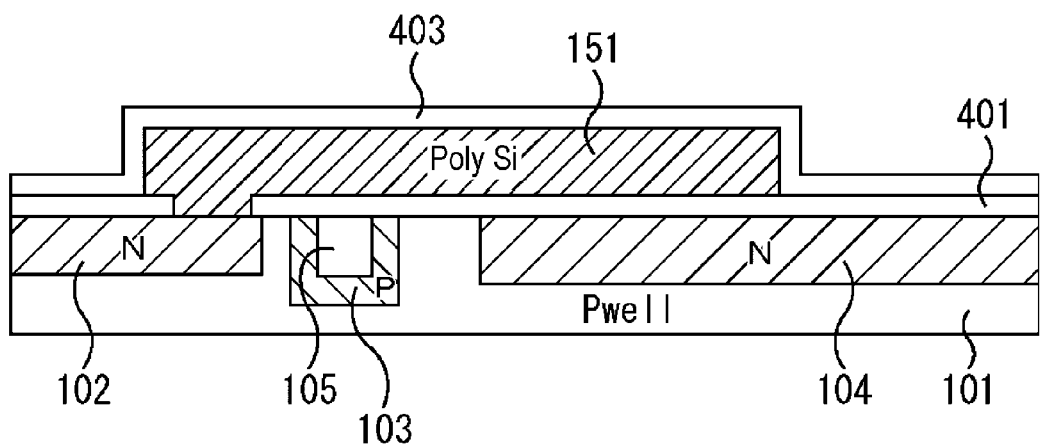
FIG. 64 is an explanatory diagram (version 5) with respect to production process of the second charge accumulation portion (version 2)

Next, as illustrated in FIG. 64, a capacity insulating film 403 is formed. By this means, the surface of the intermediate electrode 151 is covered with the capacity insulating film 403. Here, for the capacity insulating film 403, when a material of a higher permittivity is used, there is an advantage in maintaining the capacity per unit area.

Figure 65:
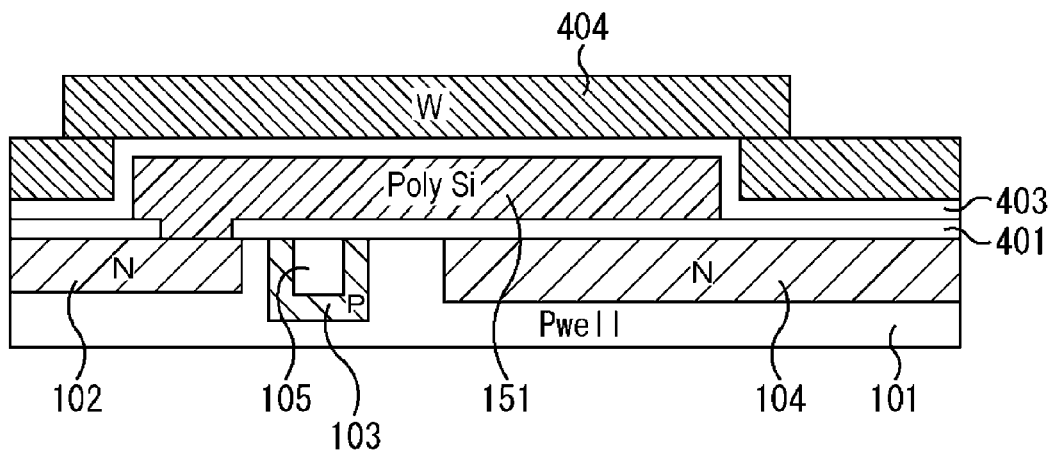
FIG. 65 is an explanatory diagram (version 6) with respect to production process of the second charge accumulation portion (version 2)

Next, as illustrated in FIG. 65, wolfram 406 used for the upper electrode 152 is formed.

Figure 66:
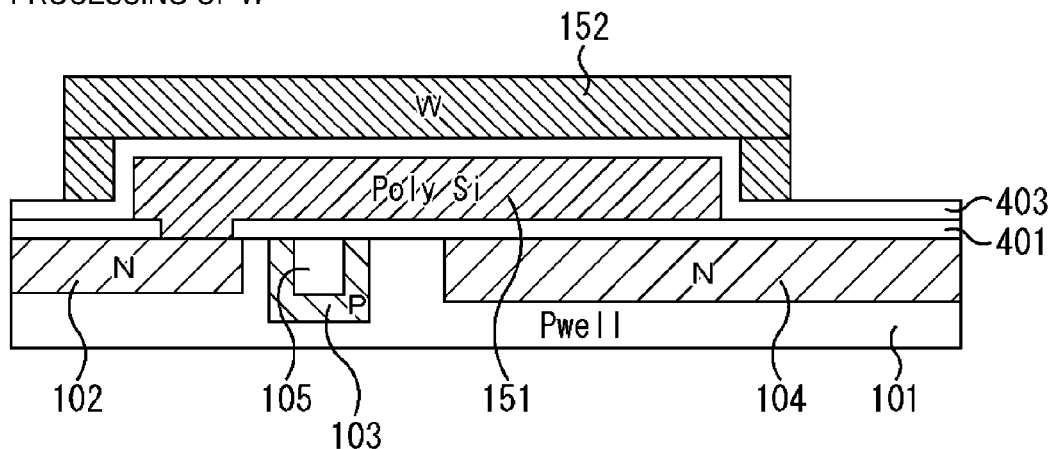
FIG. 66 is an explanatory diagram (version 7) with respect to production process of the second charge accumulation portion (version 2)

Next, as illustrated in FIG. 66, by performing patterning on the wolfram 406 by the PR method and removing unnecessary parts, the upper electrode 152 is formed.

Also, as described above, instead of the wolfram 406, it is possible to form another metal material to form the upper electrode 152.

Figure 67:
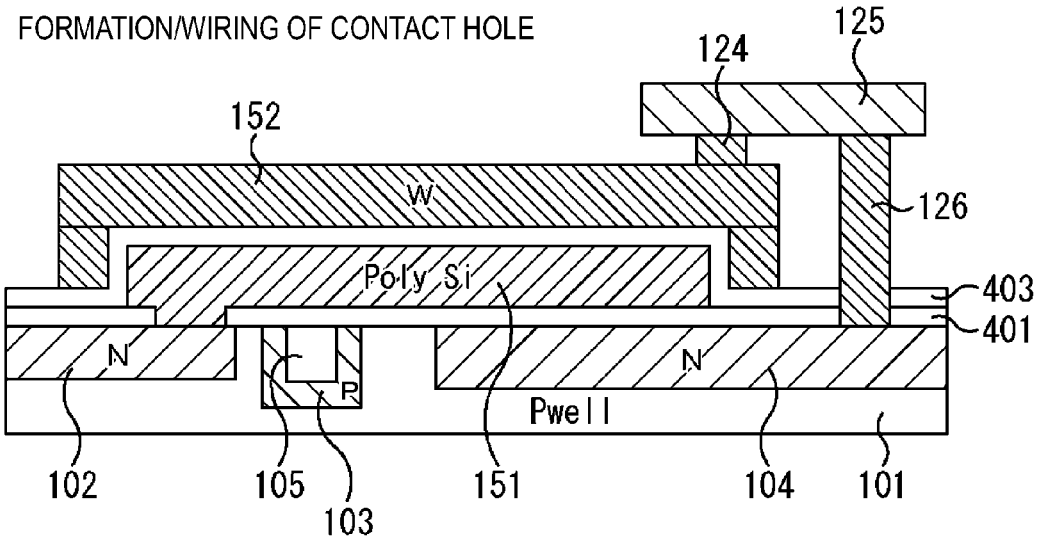
FIG. 67 is an explanatory diagram (version 8) with respect to production process of the second charge accumulation portion (version 2)

Next, as illustrated in FIG. 67, the insulating film 401 and the capacity insulating film 403 are removed and a contact hole is formed to connect the N-type semiconductor area 104 and the wire 126. Subsequently, wires 153 to 155 are formed and the N-type semiconductor area 104 and the upper electrode 152 are electrically connected.

As described above, the second charge accumulation portion 67B is formed.

5-2. Production Process of Second Charge Accumulation Portion 67F

Next, with reference to FIG. 68 to FIG. 79, the production process of the second charge accumulation portion 67F will be explained. Also, in the following, an explanation will be given only to the production process after the P-type semiconductor area 101 and the N-type semiconductor area 102 are formed on the semiconductor substrate.

Figure 68:
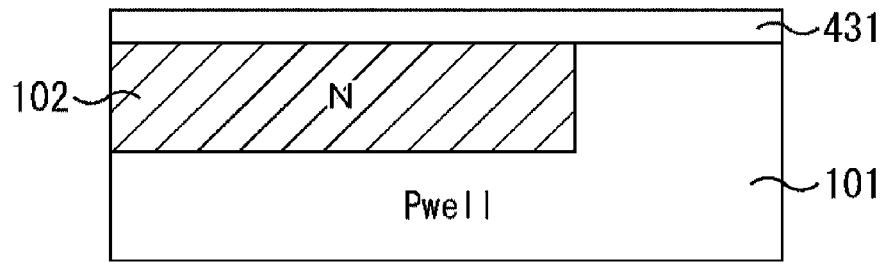
FIG. 68 is an explanatory diagram (version 1) with respect to production process of the second charge accumulation portion (version 6)

First, as illustrated in FIG. 68, an insulating film 431 is formed on the surface of the semiconductor substrate. Here, as a material of the insulating film 431, anything is possible as long as it can insulate between the lower electrode 271 and the semiconductor substrate, for example, $SiO_2$ or SiN is used.

Figure 69:
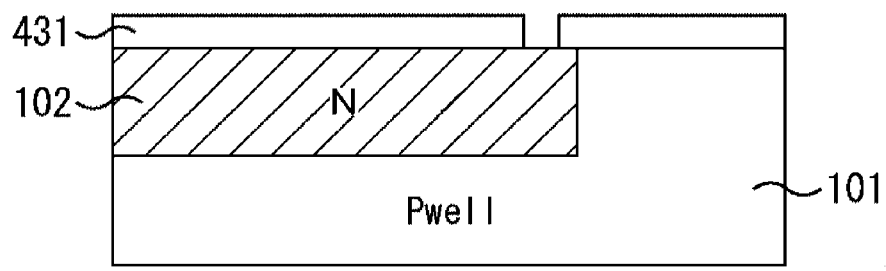
FIG. 69 is an explanatory diagram (version 2) with respect to production process of the second charge accumulation portion (version 6)

Next, as illustrated in FIG. 69, patterning by the lithography is performed, the insulating film 43 is removed by the dry etching method or wet etching method, and a contact hole to connect the N-type semiconductor area 102 and the lower electrode 271 is formed.

Figure 70:
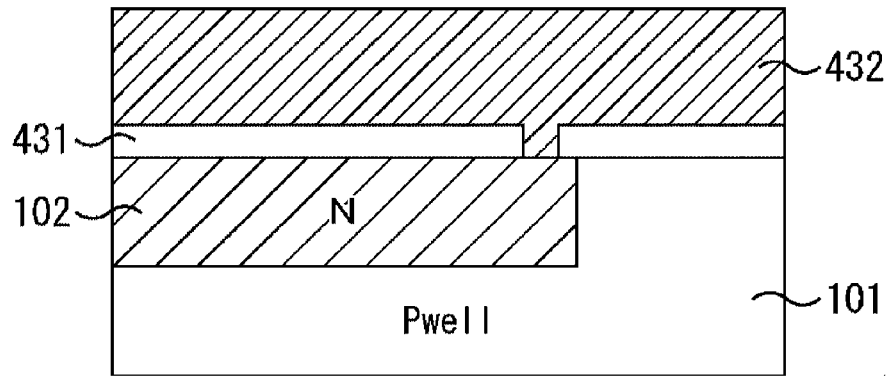
FIG. 70 is an explanatory diagram (version 3) with respect to production process of the second charge accumulation portion (version 6)

Next, as illustrated in FIG. 70, polysilicon 432 used for the lower electrode 271 and the gate electrode 641 is formed. At this time, through a contact hole, the polysilicon 432 is jointed to the N-type semiconductor area 102.

Figure 71:
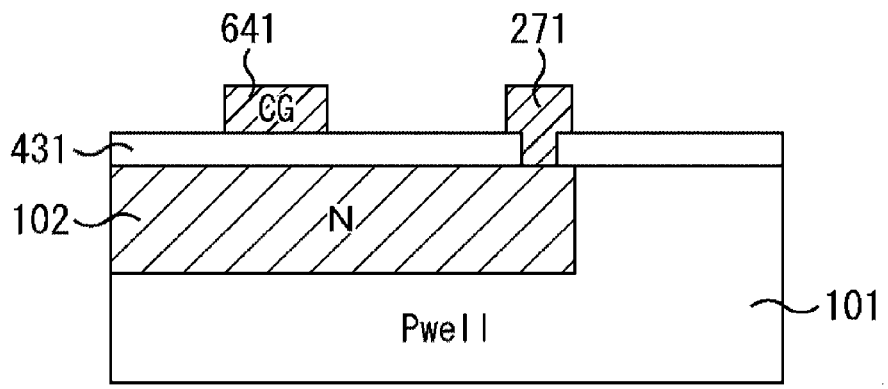
FIG. 71 is an explanatory diagram (version 4) with respect to production process of the second charge accumulation portion (version 6)

Next, as illustrated in FIG. 71, unnecessary parts of the polysilicon 432 are removed by the lithography method and dry etching method to form the lower electrode 271 and the gate electrode 641.

Also, as described above, instead of the polysilicon 432, by forming a material having a small work function difference with respect to silicon by lattice-matching to the silicon or forming silicon by epitaxial growth, it is possible to form the lower electrode 271. Alternatively, as described above, it is possible to form the lower electrode 271 by forming a metal material such as titanium and wolfram.

Figure 72:
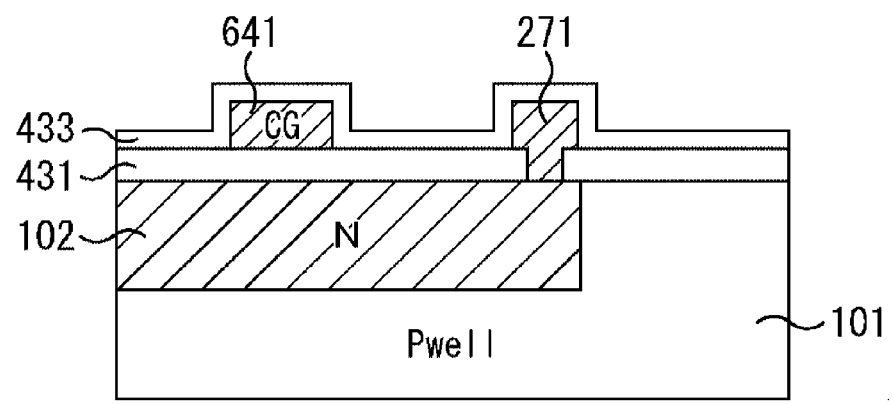
FIG. 72 is an explanatory diagram (version 5) with respect to production process of the second charge accumulation portion (version 6)

Next, as illustrated in FIG. 72, a capacity insulating film 433 is formed. By this means, the entire surface of the lower electrode 271 is formed with the capacity insulating film 433. For the capacity insulating film 433, a high-permittivity film such as SiN, $SiO_2$, $HfO_2$ and ZrO is used.

Figure 73:
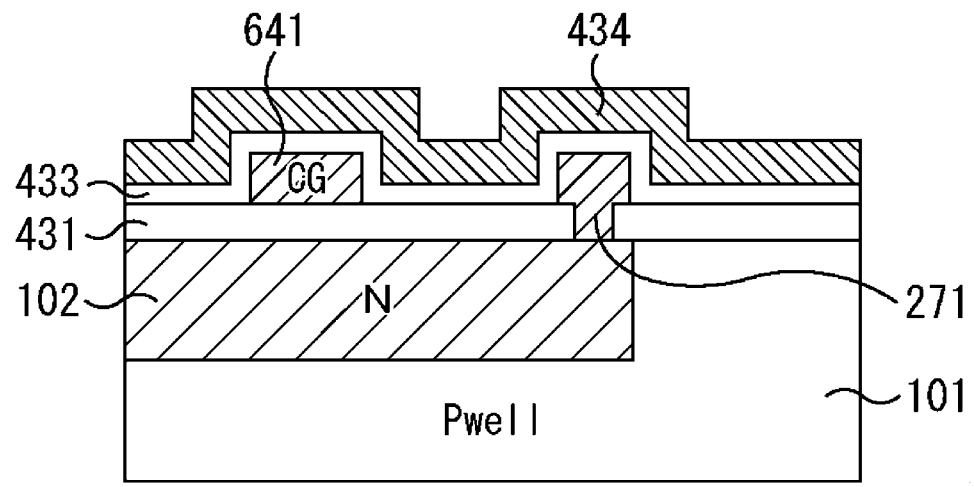
FIG. 73 is an explanatory diagram (version 6) with respect to production process of the second charge accumulation portion (version 6)

Next, as illustrated in FIG. 73, wolfram 434 used for the upper electrode 272 is formed on the capacity insulating film 433.

Figure 74:
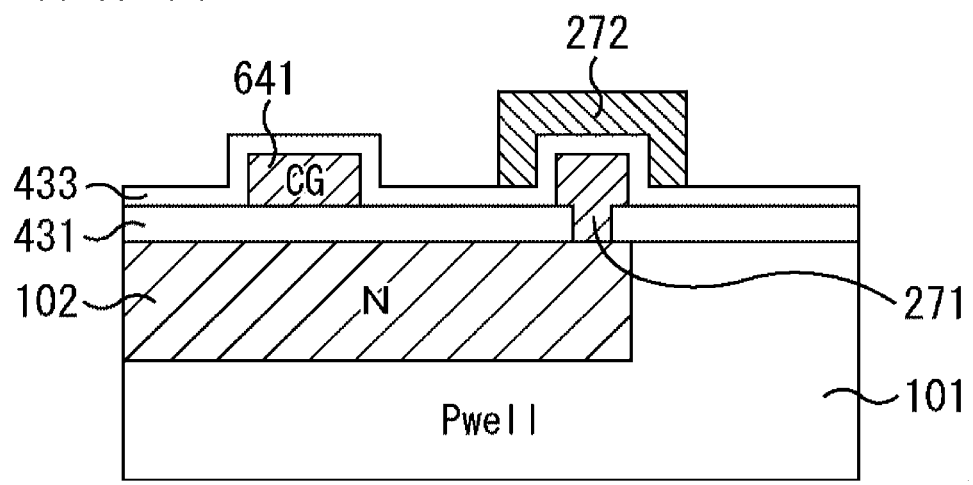
FIG. 74 is an explanatory diagram (version 7) with respect to production process of the second charge accumulation portion (version 6)

Next, as illustrated in FIG. 74, unnecessary parts of the wolfram 434 are removed by the lithography method and the dry etching method to form the upper electrode 272.

Also, as described above, instead of the wolfram 434, it is possible to form another metal material to form the upper electrode 272.

Figure 75:
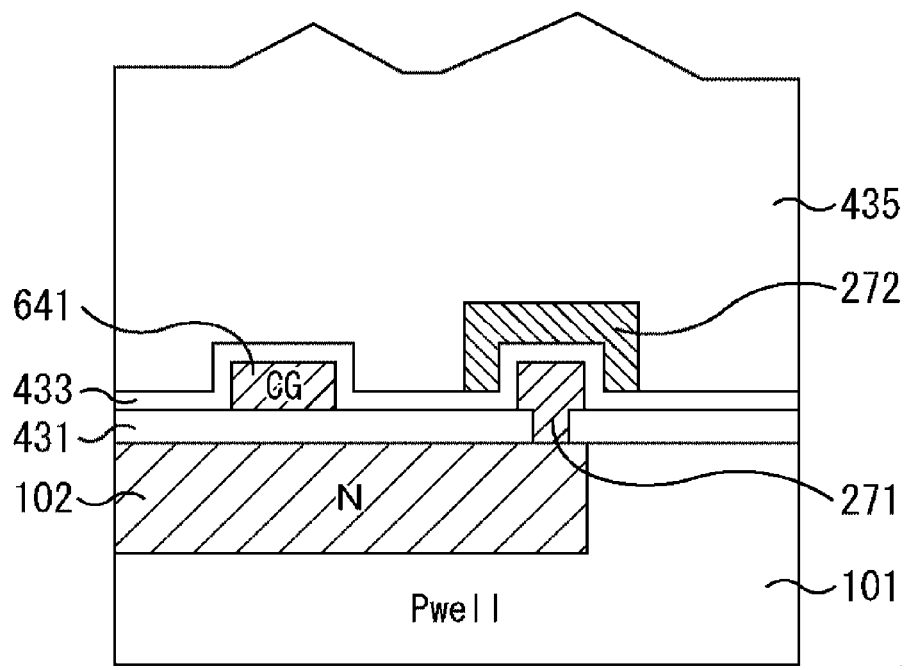
FIG. 75 is an explanatory diagram (version 8) with respect to production process of the second charge accumulation portion (version 6)

Next, as illustrated in FIG. 75, an interlayer insulating film 435 is formed between the unit pixel 60A and the upper layer wires 282 and 284. For the interlayer insulating film 435, for example, $SiO_2$ is used.

Figure 76:
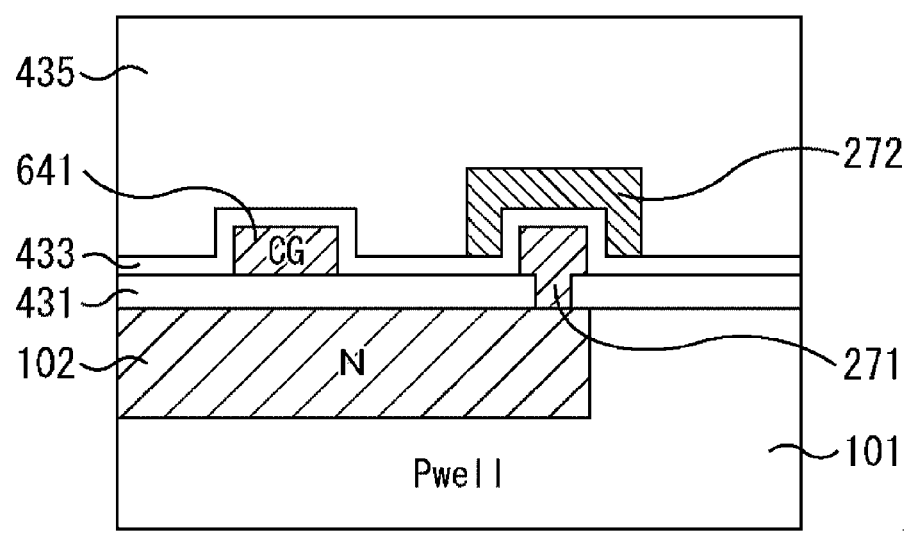
FIG. 76 is an explanatory diagram (version 9) with respect to production process of the second charge accumulation portion (version 6)

Next, as illustrated in FIG. 76, the interlayer insulating film 435 is planarized by a CMP (Chemical Medical polishing) method.

Figure 77:
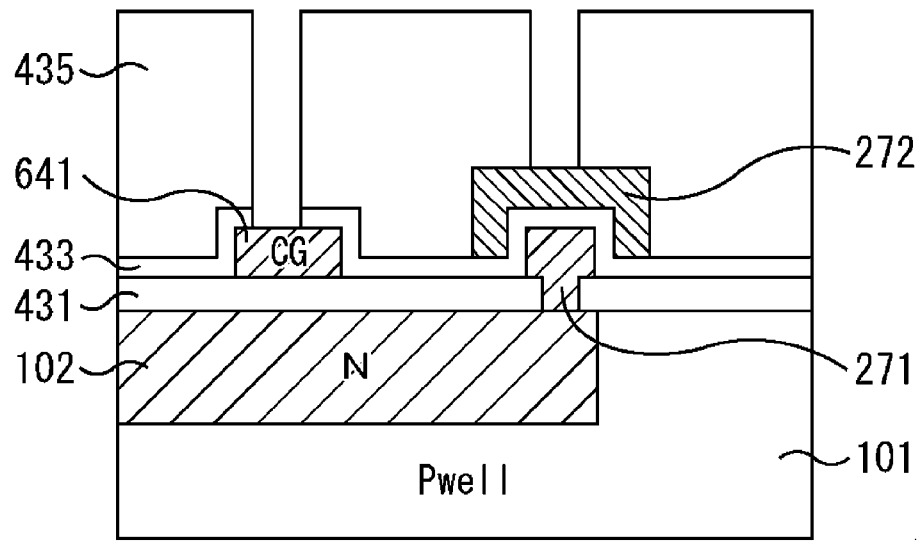
FIG. 77 is an explanatory diagram (version 10) with respect to production process of the second charge accumulation portion (version 6)

Next, as illustrated in FIG. 77, by removing the capacity insulating film 433 and the interlayer insulating film 435, a contact hole to connect the upper electrode 272 and the upper layer wire 282 and a contact hole to connect the gate electrode 641 and the upper layer wire 284 are formed.

Figure 78:
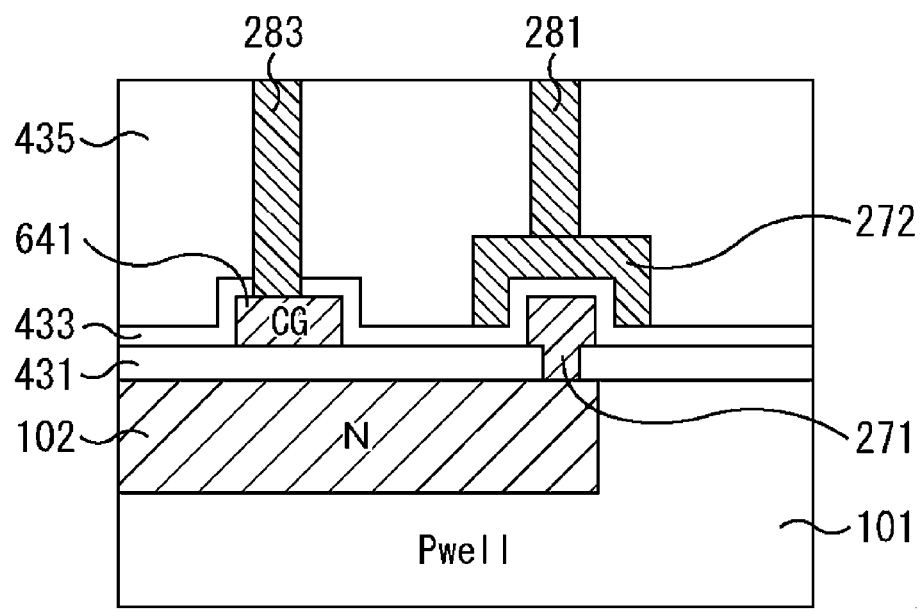
FIG. 78 is an explanatory diagram (version 11) with respect to production process of the second charge accumulation portion (version 6)

Next, as illustrated in FIG. 78, after films having a three-layer structure of W, TiN and Ti are formed in the contact holes, they are planarized by the CMP method to form the wires 281 and 283.

Figure 79:
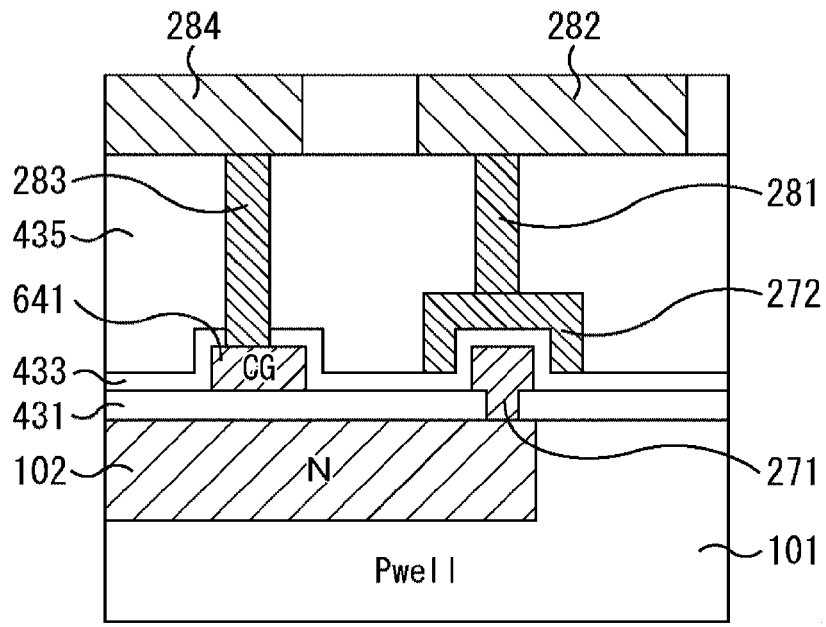
FIG. 79 is an explanatory diagram (version 12) with respect to production process of the second charge accumulation portion (version 6)

Next, as illustrated in FIG. 79, the upper layer wires 282 and 284 having a three-layer structure of Cu, TaN and Ta are formed so as to be connected to the wires 281 and 283, respectively.

As described above, the second charge accumulation portion 67F is formed.

5-3. Production Process of Second Charge Accumulation Portion 67G

Next, with reference to FIG. 80 to FIG. 89, the production process of the second charge accumulation portion 67G will be explained. Also, in the following, an explanation will be given only to the production process after the P-type semiconductor area 101 and the N-type semiconductor area 102 are formed on the semiconductor substrate.

Figure 80:
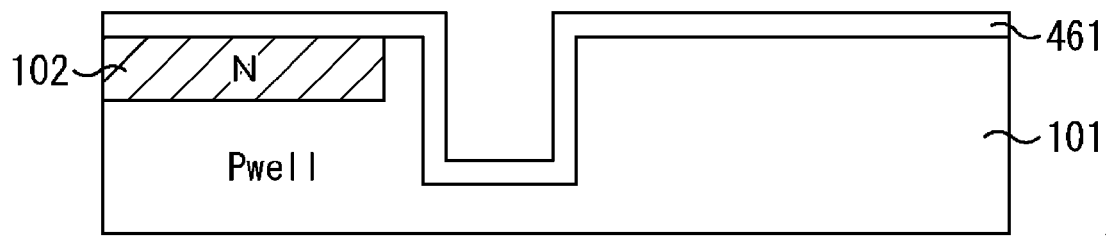
FIG. 80 is an explanatory diagram (version 1) with respect to production process of the second charge accumulation portion (version 7)

First, as illustrated in FIG. 80, a trench is formed in the P-type semiconductor area 101 of the substrate semiconductor. For example, similar to a separation method such as the STI method, this trench is formed by forming an insulating film on the semiconductor substrate, performing patterning of the film by the lithography method and removing it by the dry etching method. Further, on the surface of the semiconductor substrate, an insulating film 461 to insulate the semiconductor substrate and the lower electrode 301 is formed. Alternatively, the insulating film 46 may be formed by thermal oxidation of silicon on the surface of the semiconductor substrate.

Figure 81:
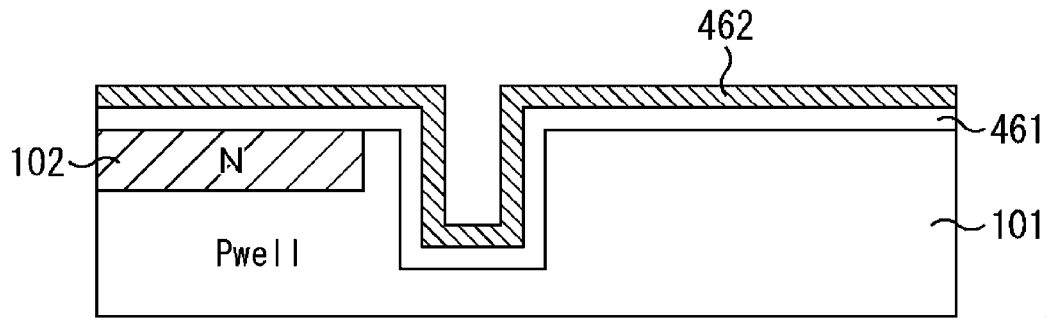
FIG. 81 is an explanatory diagram (version 2) with respect to production process of the second charge accumulation portion (version 7)

Next, as illustrated in FIG. 81, wolfram 462 used for the lower electrode 301 is formed on the insulating film 461. Also, as described above, instead of the wolfram 462, it is possible to form another metal material or alloy of multiple materials to form the lower electrode 301.

Figure 82:
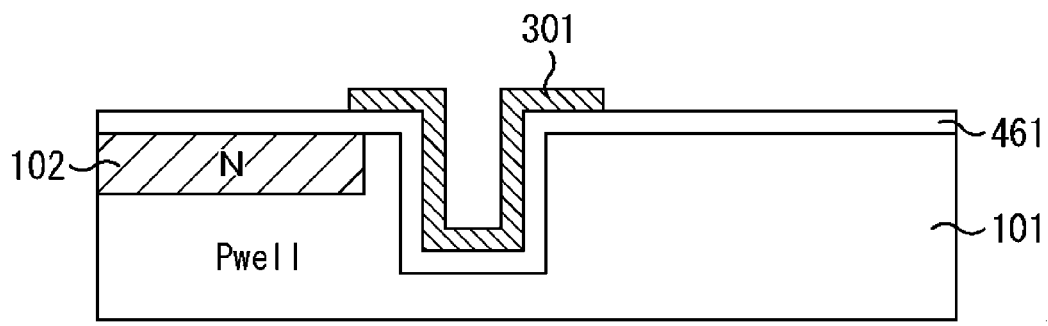
FIG. 82 is an explanatory diagram (version 3) with respect to production process of the second charge accumulation portion (version 7)

Next, as illustrated in FIG. 82, unnecessary parts of the wolfram 462 are removed by the lithography method and the dry etching method to form the lower electrode 301.

Figure 83:
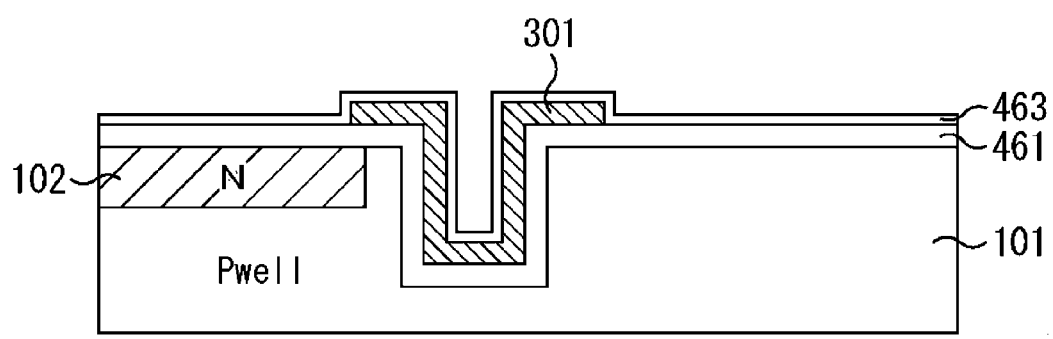
FIG. 83 is an explanatory diagram (version 4) with respect to production process of the second charge accumulation portion (version 7)

Next, as illustrated in FIG. 83, a capacity insulating film 463 is formed. By this means, the surface of the lower electrode 301 is covered with the capacity insulating film 463. For the capacity insulating film 463, a material such as SiN and High-k is used.

Figure 84:
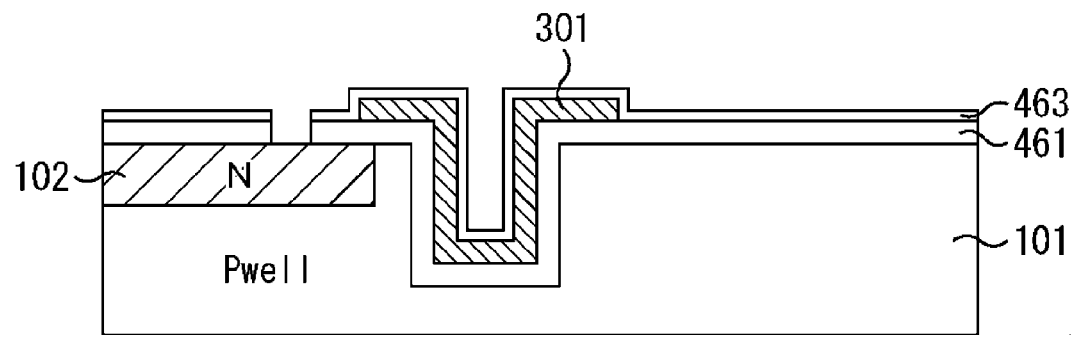
FIG. 84 is an explanatory diagram (version 5) with respect to production process of the second charge accumulation portion (version 7)

Next, as illustrated in FIG. 84, the insulating film 461 and the capacity insulating film 463 are removed by the lithography method and the dry etching method or wet etching method, and a contact hole to connect the intermediate electrode 302 and the N-type semiconductor area 102 is formed.

Figure 85:
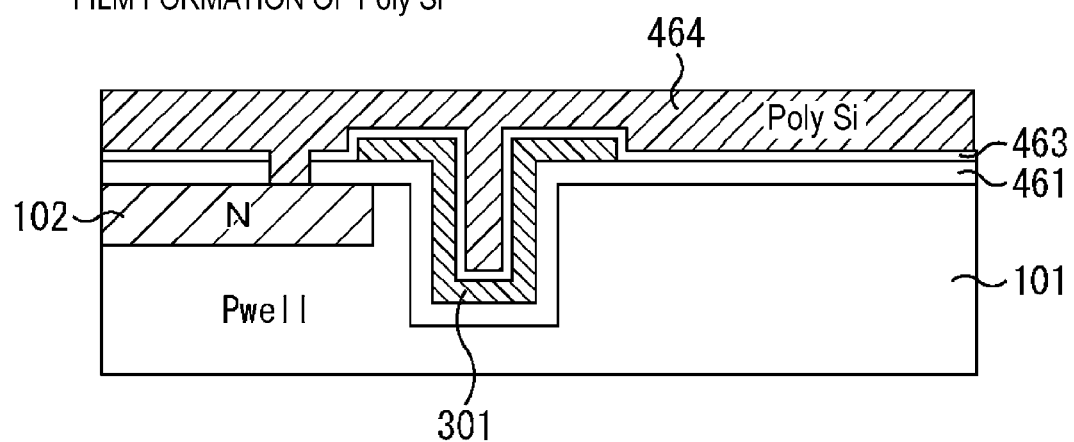
FIG. 85 is an explanatory diagram (version 6) with respect to production process of the second charge accumulation portion (version 7)

Next, as illustrated in FIG. 85, polysilicon 464 used for the intermediate electrode 302 is formed. At this time, through the contact hole, the polysilicon 464 is jointed to the N-type semiconductor area 102.

Figure 86:
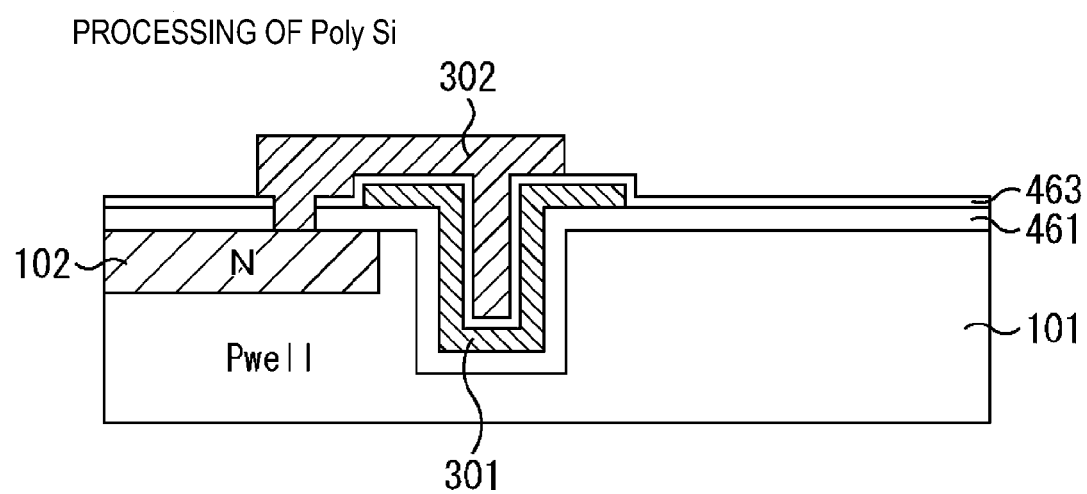
FIG. 86 is an explanatory diagram (version 7) with respect to production process of the second charge accumulation portion (version 7)

Next, as illustrated in FIG. 86, unnecessary parts of the polysilicon 464 are removed by the lithography method and the dry etching method to form the intermediate electrode 302.

Also, as described above, instead of the polysilicon 464, by forming a material having a small work function difference with respect to silicon by lattice-matching to the silicon or forming silicon by epitaxial growth, it is possible to form the intermediate electrode 302. Alternatively, as described above, it is possible to form the intermediate electrode 302 by forming a metal material such as titanium and wolfram.

Figure 87:
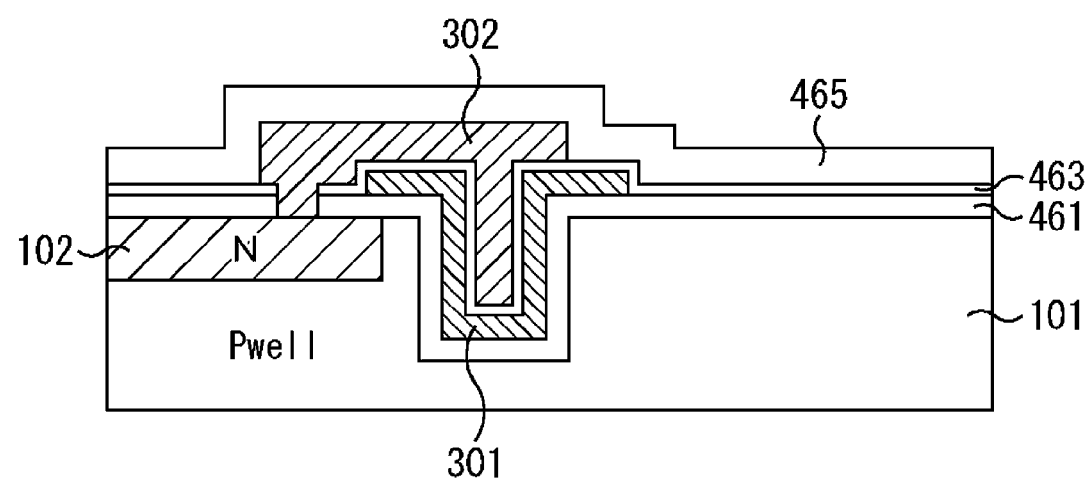
FIG. 87 is an explanatory diagram (version 8) with respect to production process of the second charge accumulation portion (version 7)

Next, as illustrated in FIG. 87, a capacity insulating film 465 is formed. By this means, the entire surface of the intermediate electrode 302 is covered with the capacity insulating film 465.

Figure 88:
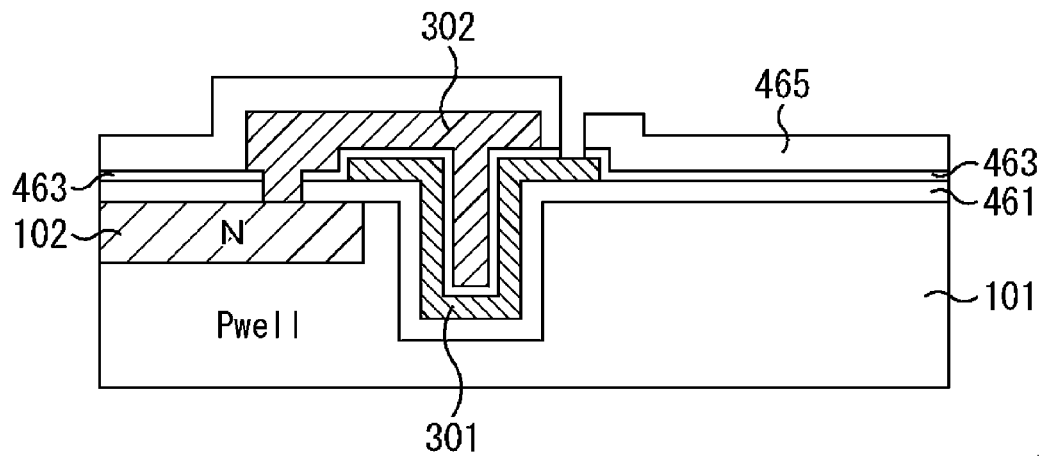
FIG. 88 is an explanatory diagram (version 9) with respect to production process of the second charge accumulation portion (version 7)

Next, as illustrated in FIG. 88, the capacity insulating film 463 and the capacity insulating film 465 are removed by the lithography method and the dry etching method to form a contact hole to connect the lower electrode 301 and the upper electrode 303.

Figure 89:
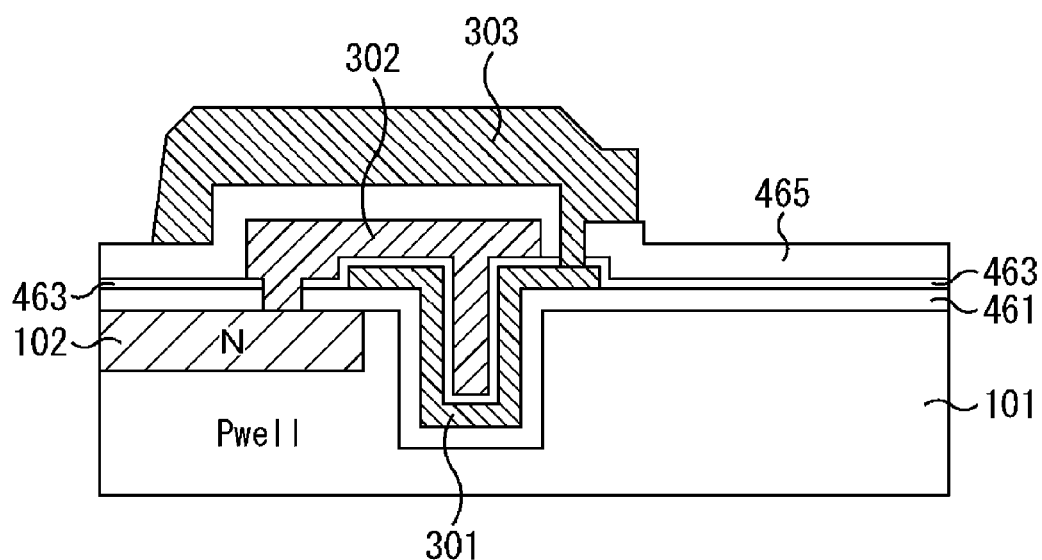
FIG. 89 is an explanatory diagram (version 10) with respect to production process of the second charge accumulation portion (version 7)

Next, as illustrated in FIG. 89, after a film having a three-layer structure of W, TiN and Ti is formed, unnecessary parts are removed by the lithography method and the dry etching method to form the upper electrode 303.

Also, as described above, instead of the wolfram, it is possible to form another metal material or alloy of multiple materials to form the upper electrode 303.

As described above, the second charge accumulation portion 67G is formed.

6. EXPLANATION RELATED TO NOISE REMOVAL PROCESSING AND COMPUTATION PROCESSING

From the unit pixel 60A and the unit pixels according to its variation examples described above, signals are output to the vertical signal wire 17 in the order from the first reset level N1, the first signal level S1, the second signal level S2 to the second reset level N2. Subsequently, in subsequent signal processing portions such as the column processing portion 13 and the signal processing portion 18 illustrated in FIG. 1 to FIG. 3, the first reset level N1, the first signal level S1, the second signal level S2 and the second reset level N2 are subjected to predetermined noise removal processing and signal processing. In the following, the noise removal processing in the column processing portion 13 and computation processing in the signal processing portion 18 will be explained.

First, for example, processing in a CDS circuit as a noise removal section incorporated in the column processing portion 13 will be explained. As the CDS circuit, it is possible to use a well-known circuit configuration, that is, the circuit configuration does not matter.

Figure 90:
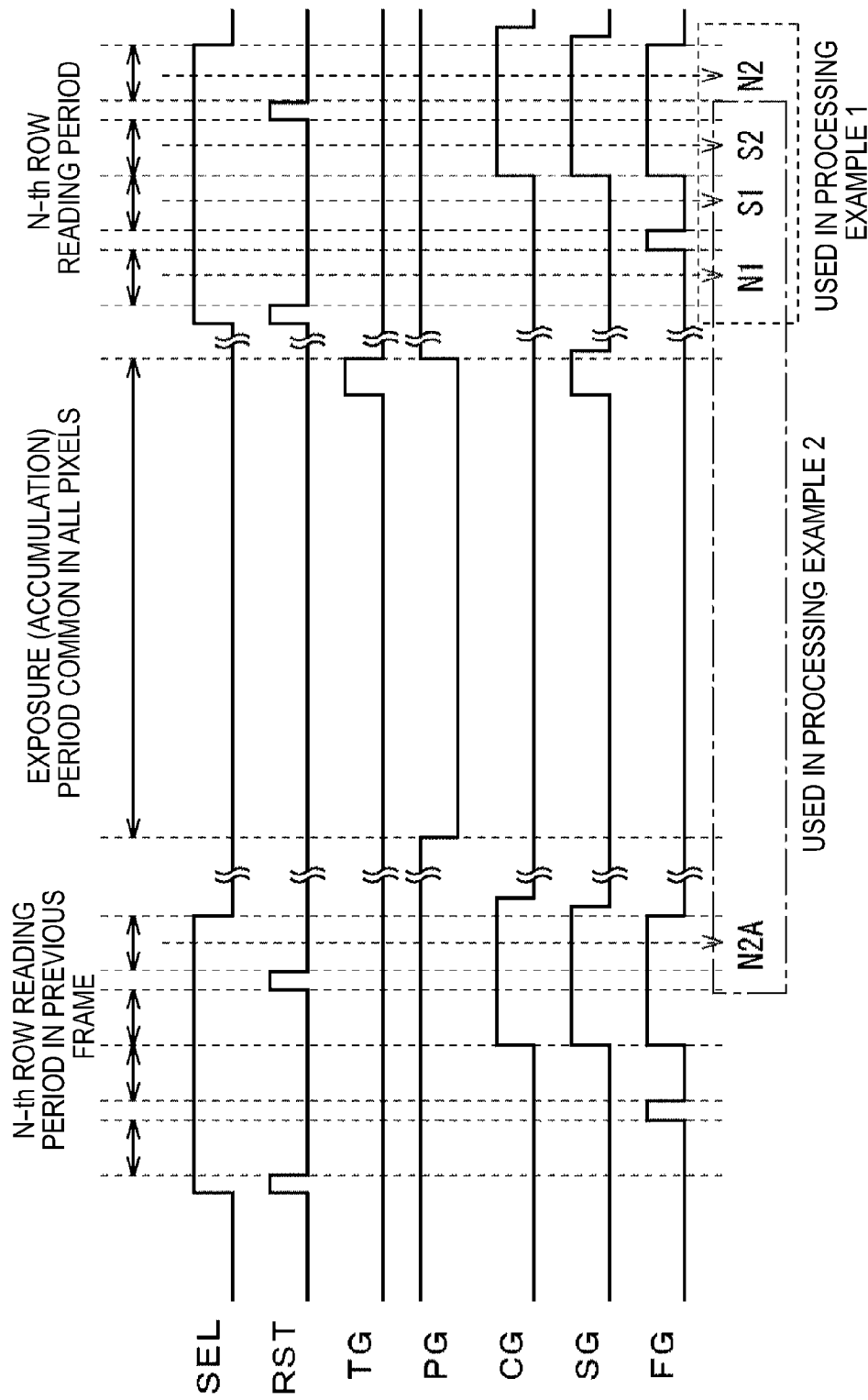
FIG. 90 is a timing chart provided for explaining signal processing in a signal processing portion in the case of processing example 1 and processing example 2.

FIG. 90 illustrates a timing diagram provided for explaining noise removal processing in the cases of processing examples 1 and 2 in the column processing portion 13.

Processing Example 1

First, a difference is found between the a voltage signal S1 based on light charges transferred to the FD portion 71 at the time of signal reading and a voltage signal N1 based on a reset level before the light charges are transferred to the FD portion 71. Further, a difference is found between a voltage signal S2 based on light charges accumulated in the FD portion 71, the first charge accumulation portion 66 and the second charge accumulation portion 67, and a voltage signal N2 based on a reset level after the second charge accumulation portion 67 is reset. When the first difference is referred to as "SN1" and the second difference is referred to as "SN2," SN1=S1−N1 and SN2=S2−N2 are established.

Thus, in processing example 1, the signals S1 and N1 output earlier are subjected to CDS processing to remove a reset noise and a fixed-pattern noise unique to a pixel such as threshold variation of the amplification transistor in the pixel. The signals S2 and N2 output later are subjected to CDS processing in which, although a fixed-pattern noise unique to a pixel such as threshold variation of the amplification transistor in the pixel is removed, a reset noise is not removed. However, it denotes computation processing without using a frame memory, and therefore there are advantages that it is possible to simplify the circuit configuration and realize a low cost.

Processing Example 2

In processing example 2, a storage section such as a frame memory is requested to use information of the previous frame. Therefore, it follows that, for example, the computation processing in processing example 2 uses the data storage portion 19 as a storage section in the signal processing portion 18 or uses a frame memory in an external DSP circuit.

To be more specific, first, a difference is found between the voltage signal S1 based on light charges transferred to the FD portion 71 at the time of signal reading and the voltage signal N1 based on a reset level before the light charges are transferred to the FD portion 71. Next, a difference is found between the voltage signal S2 based on light charges accumulated in the FD portion 71, the first charge accumulation portion 66 and the second charge accumulation portion 67, and a voltage signal N2A in the previous frame. This voltage signal N2A denotes a signal based on a reset level after light charges accumulated in the FD portion 71, the first charge accumulation portion 66 and the second charge accumulation portion 67 in the previous frame are reset. When the first difference is referred to as SN1 and the second difference is referred to as SN2, SN1=S1−N1 and SN2=S2−N2A are established.

Thus, in processing example 2, even the signals S2 and N2 output later are subjected to CDS processing to remove a reset noise and a fixed-pattern noise unique to a pixel such as threshold variation of the amplification transistor in the pixel. In the case of this processing example 2, although a storage section such as a frame memory is requested, there is an advantage that it is possible to largely suppress a reset noise compared to processing example 1.

Processing Example 3

Next, the computation processing in the signal processing portion 18 will be explained. First, when the first difference is within a predetermined range, a comparison of the first difference and the second difference is calculated every pixel, pixels, color or specific pixel in a sharing unit pixel or uniformly calculated in all pixels as the gain to generate a gain table. Subsequently, the product of the second difference and the gain table is calculated as a computation value of the second difference.

Here, when the first difference is referred to as SN1, the second difference is referred to as SN2, the gain is referred to as G and the computation value of the second difference SN2 is referred to as SN2', it is possible to calculate the gain G and the computation value SN2' of the second difference SN2 based on following Equations (6) and (7).

$$G = SN1/SN2 \qquad (6)$$
$$= (Cfd + Cgs + Ccap)/Cfd$$
$$SN2' = G \times SN2 \qquad (7)$$

Here, Cfd represents the capacity value of the FD portion 71, Cgs represents the capacity value of the first charge accumulation portion 66 and Ccap represents the capacity value of the second charge accumulation portion 67. The gain G is equivalent to the capacity ratio.

Figure 91:
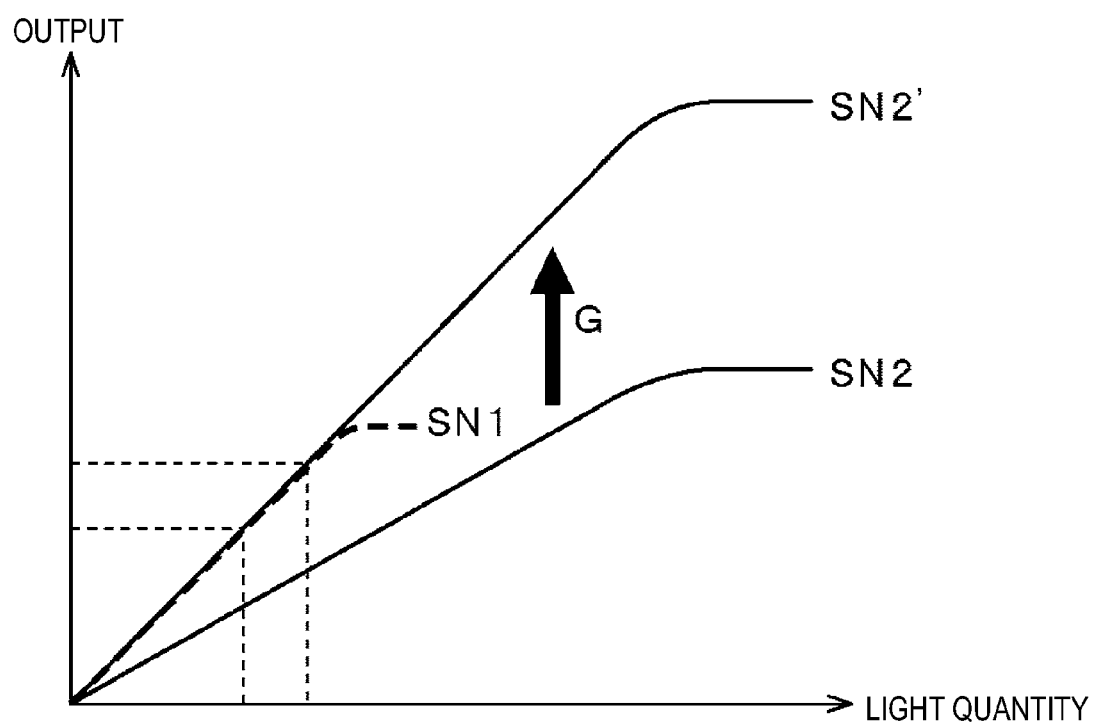
FIG. 91 is a characteristic view (version 1) between an incident light amount and an output, which is provided for explaining signal processing in the case of processing example 3.

FIG. 91 illustrates relationships between the incident amount and the first difference SN1, the second difference SN2 and the computation value SN2' of the second difference SN2.

Figure 92:
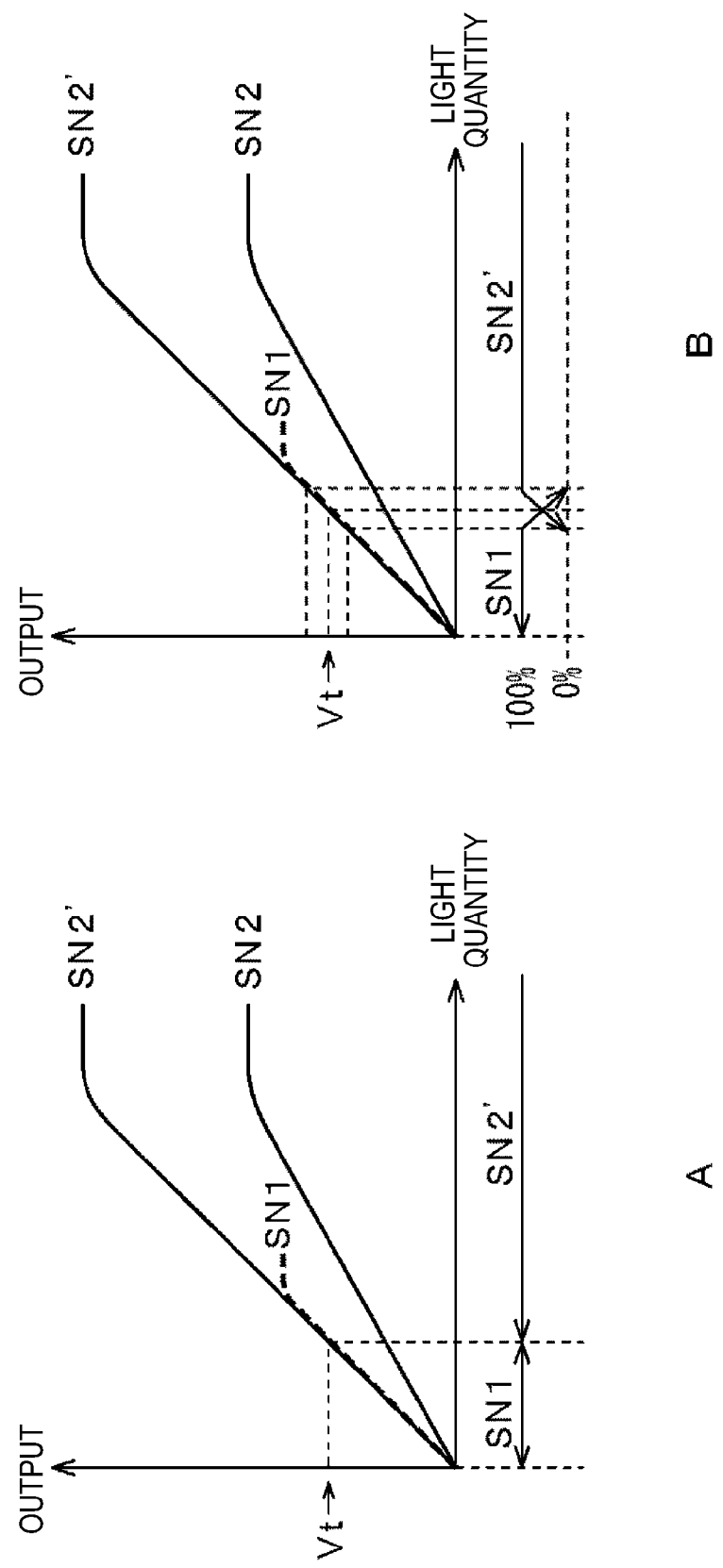
FIG. 92 is a characteristic view (version 2) between an incident light amount and an output, which is provided for explaining signal processing in the case of processing example 3.

Next, as illustrated in FIG. 92A, a predetermined threshold Vt set in advance is used. The predetermined threshold Vt is set in advance in an area in which the first difference SN1 is not saturated in the photoresponse property and the photoresponse property is linear.

Here, when the first difference SN1 is not over the predetermined threshold Vt, the first difference SN1 is output as a pixel signal SN of a processing target pixel. That is, in the case of SN1<Vt, SN=SN1 (SN1 is substituted into SN) is established. When the first difference SN1 is over the predetermined threshold Vt, the computation value SN2' of the second difference SN2 is output as the pixel signal SN of the processing target pixel. That is, in the case of VtSN1, SN=SN2' (SN2 is substituted into SN) is established.

Processing Example 4

In the next computation processing, as illustrated in FIG. 92B, a value of the first difference SN1 within a predetermined range and the computation value SN2' of the second difference SN2 are synthesized at a ratio set in advance and output as the pixel signal SN.

For example, in anteroposterior ranges with reference to the predetermined threshold Vt, as described below, a synthesis ratio of the first difference SN1 and the computation value SN2' of the second difference SN2 is changed in a phased manner. As described above, the predetermined threshold Vt denotes a value set in advance in an area in which the first difference SN1 is not saturated in the photoresponse property and the photoresponse property is linear.

In the case of SN1<SN1×0.90, SN=SN1
In the case of Vt×0.90≤SN1<Vt×0.94,
SN=0.9×SN1+0.1×SN2'
In the case of Vt×0.94≤SN1<Vt×0.98,
SN=0.7×SN1+0.3×SN2'
In the case of Vt×0.98≤SN1<Vt×1.02,
SN=0.5×SN1+0.5×SN2'
In the case of Vt×1.02≤SN1<Vt×1.06,
SN=0.3×SN1+0.7×SN2'
In the case of Vt×1.06≤SN1<Vt×1.10
SN=0.1×SN1+0.9×SN2'
In the case of Vt×1.10≤SN1, SN=SN2'

By performing such computation processing, it is possible to perform switching from signals at low illumination to signals at high illumination more smoothly.

7. REFERENCE EXAMPLE

Figure 93:
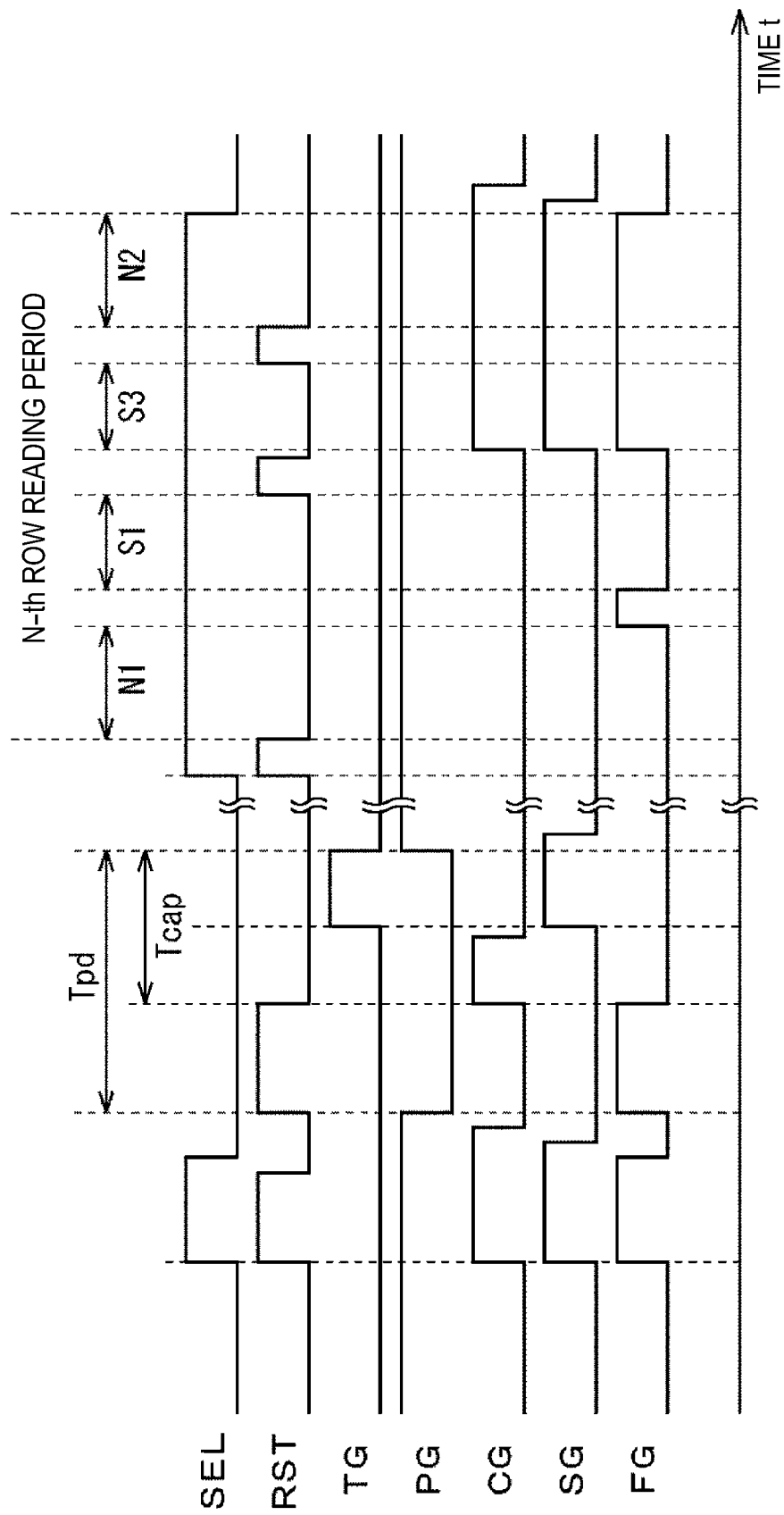
FIG. 93 is a timing chart provided for explaining circuit operations of a unit pixel according to a variation example.

A main feature of the above-described embodiments is that there are two charge accumulation portions 66 and 67 in a unit pixel and the second charge accumulation portion 67 is formed with a capacitor having a larger capacity value per unit area than that of the first charge accumulation portion 66. However, it is possible to provide an effect that, even if the capacity value per unit area is equivalent between the two charge accumulation portions 66 and 67, it is possible to expand the dynamic range. This will be explained with reference to FIG. 93.

In a period set to a predetermined ratio with respect to an exposure period of the photodiode 61 in the exposure period of the photodiode 61, the second transfer gate portion 63 is caused to get in a conduction state such that light charges equal to or larger than a predetermined amount overflown from the photodiode 61 are ejected.

Here, the exposure period in the photodiode 61 is referred to as Tpd and the period to accumulate the light charges overflown from the photodiode 61 in the second charge accumulation portion 67 is referred to as Tcap. The unit pixel is operated in the timing chart illustrated in FIG. 93 to restrict the exposure time Tcap in the second charge accumulation portion 67. By this operation, it is possible to compress information on the high illumination side and, even if the capacity value of the second charge accumulation portion 67 is small or equivalent to that of the first charge accumulation portion 66, it is possible to expand the dynamic range.

After noise elements and signal elements at low illumination are read, the FD portion 71 is temporarily reset once and the light charges, which are accumulated in the second charge accumulation portion 67 and overflown from the photodiode 61, are read as signals on the high illumination side. Unlike other embodiments, the signals on the high illumination side to temporarily reset the FD portion 71 do not include light charges accumulated in the first charge accumulation portion 66.

At the time of the signal reading, a voltage signal based on light charges transferred to the FD portion 71 is referred to as S1, a voltage signal based on a reset level before the light charges are transferred to the FD portion 71 is referred to as N1, and the first difference is referred to as SN1. Also, a voltage signal based on light charges accumulated in the FD portion 71, the first charge accumulation portion 66 and the second charge accumulation portion 67 in a case where the FD portion 71 is reset immediately before the reading, is referred to as S3. Further, a voltage signal of the reset levels or reset suitability levels of the FD portion 71, the first charge accumulation portion 66 and the second charge accumulation portion 67 is referred to as N2, a third difference is referred to as SN3, a gain is referred to as G and a computation value of the third difference SN3 is referred to as SN3'. Subsequently, the following computation is possible.

$$SN1 = S1 - N1$$
$$SN3 = S3 - N2$$
$$G = SN1/SN3$$
$$\quad = (Cfd + Csg + Ccap)/Cfd$$
$$SN3' = G \times SN3 \times Tpd/Tcap$$

In the photoresponse property, when a predetermined threshold set in advance is Vt in an area in which the first difference SN1 is not saturated and the photoresponse property is linear, and when a pixel signal of a processing target pixel is SN, the pixel signal SN is output as follows.

In the case of SN1<Vt, SN=SN1 (SN1 is substituted into SN)
In the case of Vt≤SN1, SN=SN3' (SN3' is substituted into SN)

8. VARIATION EXAMPLE

8-1. Example of Accumulating Light Charges Only by Photodiode 61

In the above embodiment and variation examples, light charges overflown from the photodiode 61 at high illumination are accumulated in the first charge accumulation portion 66 via the overflow path of the first transfer gate portion 62 and, furthermore, accumulated in the second charge accumulation portion 67 via the overflow path of the third transfer gate portion 64. That is, a feature of the present embodiment lies in that light charges overflown from the photodiode 61 at high illumination are accumulated in the photodiode 61 and further in the first and second charge accumulation portions 66 and 67.

Figure 94:
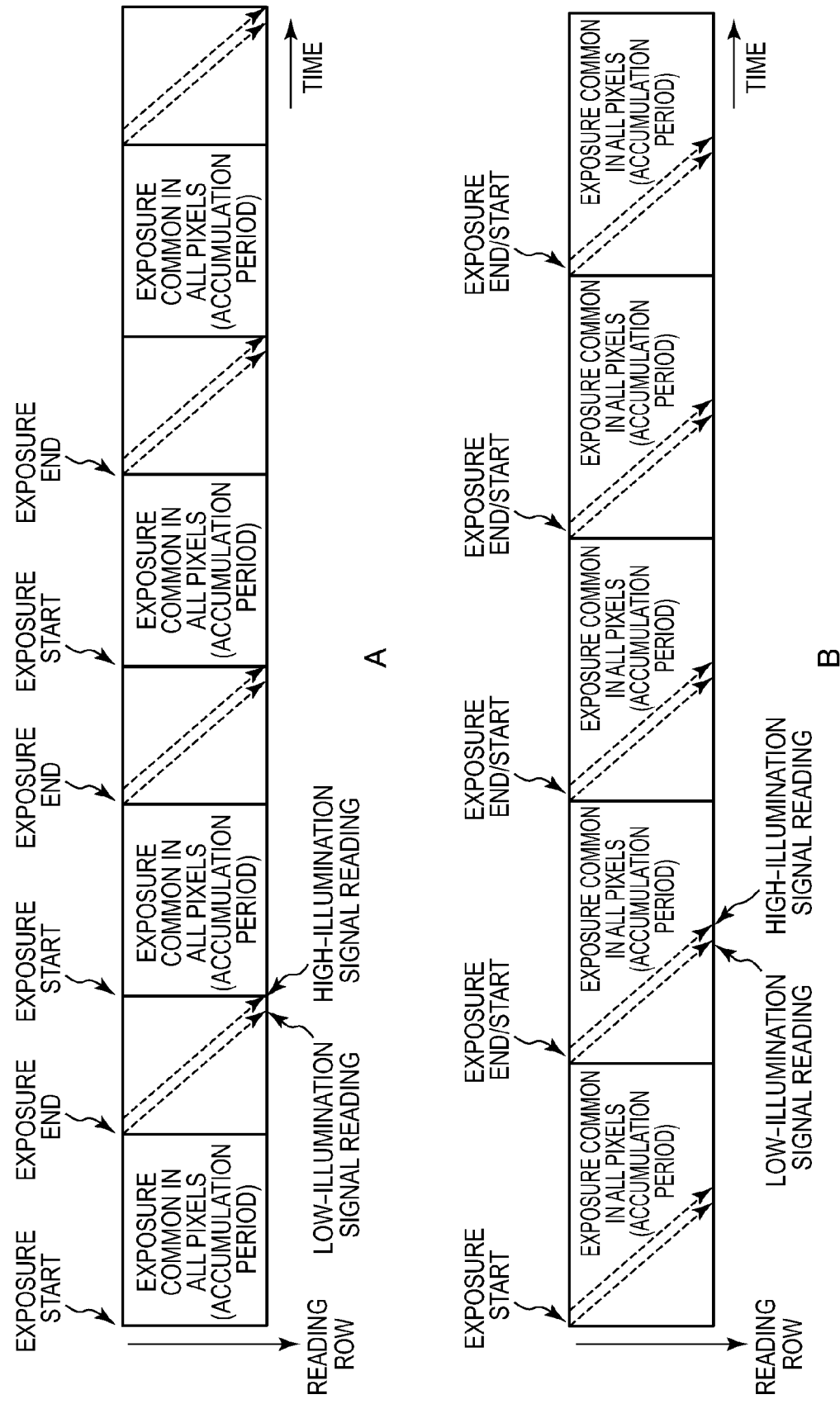
FIG. 94 is an operation explanatory diagram with respect to a unit pixel according to a reference example.

However, in the above pixel configuration, as clear from the operation explanatory diagram in FIG. 94A, it is not possible to perform an exposure during the light charge reading period. Therefore, as a variation example, there is suggested a pixel configuration to accumulate light charges only by the photodiode 61.

Even in this case, there is no change in the gist of the present disclosure that light charges after being read from the photodiode 61 are accumulated using the first charge accumulation portion 66 and the second charge accumulation portion 67 separately. That is, after light charges are read from the photodiode 61, light charges overflown from the first charge accumulation portion 66 are accumulated in the second charge accumulation portion 67. Therefore, it follows that an overflow path is requested between the first charge accumulation portion 66 and the second charge accumulation portion 67.

Thus, by employing a pixel configuration to accumulate light charges only by the photodiode 61, as illustrated in the operation explanatory diagram in FIG. 94B, it is possible to perform an exposure during a light charge reading period, and therefore it is possible to realize seamless operations in which the exposure period is contiguous at the time of taking motion pictures. However, since light charges are accumulated only by the photodiode 61, the dynamic range is limited by the saturated charge amount of the photodiode 61. Therefore, a significant expansion of the dynamic range is not expected.

However, by accumulating light charges using the first charge accumulation portion 66 and the second charge accumulation portion 67 separately, which is the gist of the present disclosure, it is possible to reduce the total area of the charge accumulation portion to accumulate light charges. Therefore, since it is possible to expand the area of the photodiode 61 by the total area reduction, it is possible to indirectly expand the dynamic range.

8-2. Variation Example of Unit Pixel to which Configuration of Second Charge Accumulation Portion is Applied Also, the configuration of the second charge accumulation portion 67 described with reference to FIG. 47 to FIG. 59 is applicable to a unit pixel different from the above unit pixels.

For example, it is applicable even to a unit pixel in which the first charge accumulation portion 66 is omitted.

Also, for example, it is applicable to a unit pixel of not only a surface-type solid-state image sensor as described above, but also a rear-surface-type solid-state image sensor such as a rear-surface-type CIS (Contact Image Sensor).

Further, for example, it is applicable to a unit pixel of not only a solid-state image sensor adopting a global shutter function but also a solid-state image sensor adopting a rolling shutter function.

Figure 95:
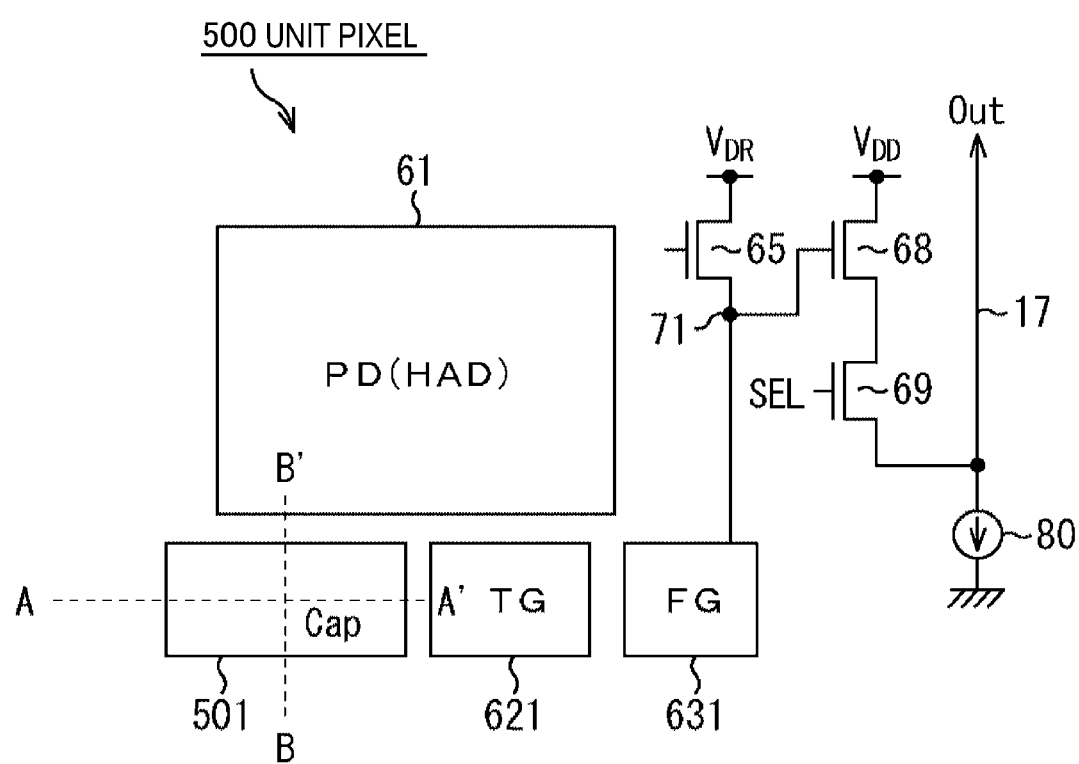
FIG. 95 is a schematic view illustrating an example of adopting a charge accumulation portion according to an embodiment of the present disclosure, in a unit pixel of a solid-state image sensor adopting a rolling shutter function.

FIG. 95 is a schematic view illustrating a pixel configuration in a case where a unit pixel 500 of a solid-state image sensor adopting a rolling shutter function includes a charge accumulation portion (Cap) 501 having the same configuration as that of the second charge accumulation portion 67. Here, in the figure, the same reference numerals are assigned to the components corresponding to those in FIG. 9.

In this unit pixel 500, light charges overflown from the photodiode 61 during an exposure period are transferred to and accumulated in the charge accumulation portion 501. Subsequently, light charges accumulated in the photodiode 61 and the charge accumulation portion 501 are transferred to the FD portion 71 via the gate electrodes 621 and 631, and the voltage of the FD portion 71 is output to the vertical signal wire 17 as a signal level. By this means, it is possible to expand the image dynamic range.

Figure 96:
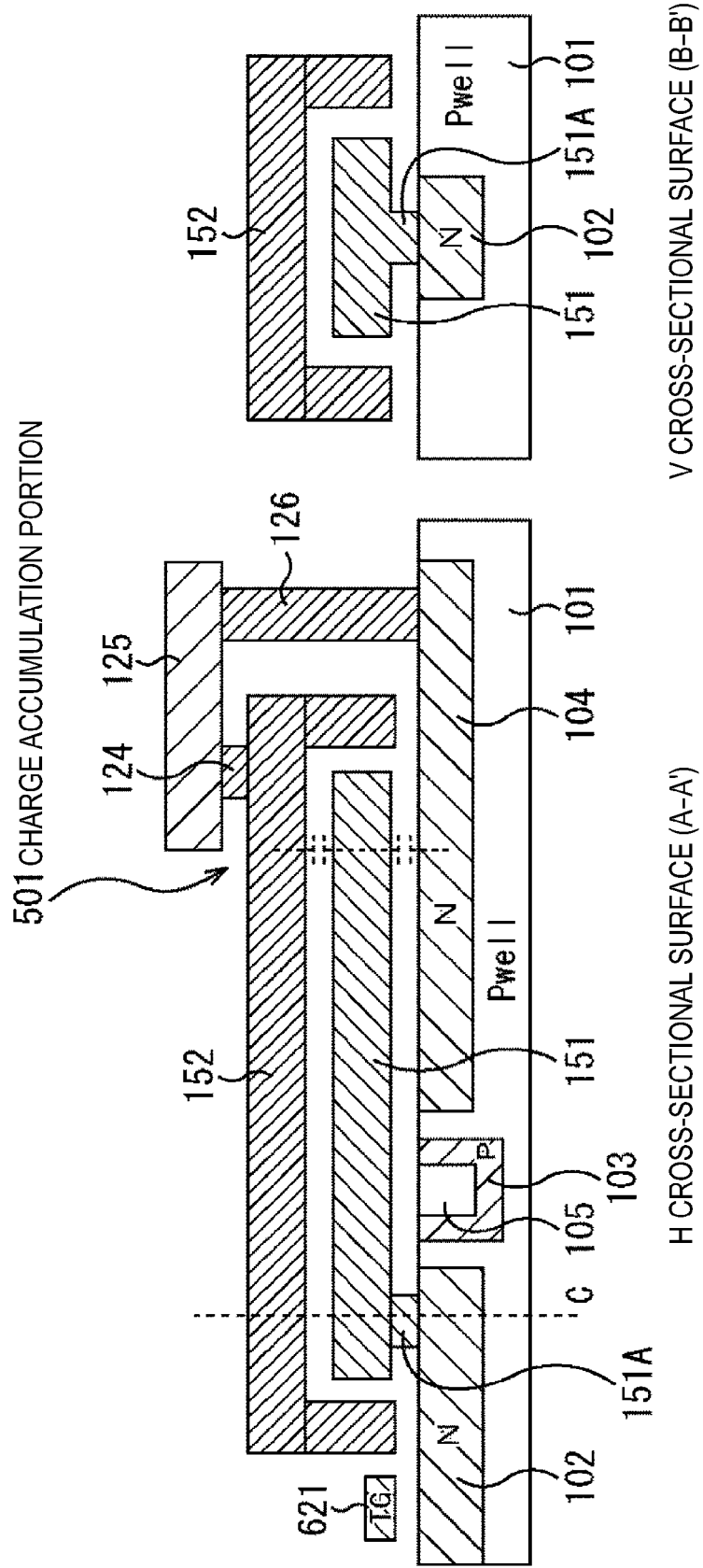
FIG. 96 is a cross-sectional view illustrating an example adopting a charge accumulation portion according to an embodiment of the present disclosure, in a unit pixel of a solid-state image sensor adopting a rolling shutter function.

FIG. 96 is a schematic view illustrating a configuration example of the charge accumulation portion 501. Here, although this figure illustrates an example where the same configuration as that of the second charge accumulation portion 67B in FIG. 50 is applied to the charge accumulation portion 501, other configurations described above are equally applicable.

8-3. Other Variation Examples

Also, although the above embodiment has described a case where the present disclosure is applied to a CMOS image sensor in which unit pixels are arranged in a matrix manner, the present disclosure is not limitedly applied to the CMOS image sensor. That is, the present disclosure is applicable to all solid-state imaging devices of an X-Y address scheme in which unit pixels are two-dimensionally arranged in a matrix manner.

Also, the present disclosure is not limitedly applied to a solid-state imaging device that detects distribution of incident-light quantities of visible light and photographs it as an image, and is applicable to all solid-state imaging devices that photograph distribution of incident-light quantities of infrared ray, X-ray or grain as an image.

Also, the solid-state imaging device may be formed as one chip or formed in a module format including an imaging function collectively packaging an imaging portion and a signal processing portion or optical unit.

Also, all pixels in the present disclosure denote all pixels of parts present in an image, and dummy pixels are excluded. Also, in the present disclosure, if the time difference or image distortion is sufficiently small to the extent that a problem does not arise, it is possible to perform scanning at high speed every multiple rows (for example, several dozens of rows) instead of operations in all pixels at the same time. Further, in the present disclosure, it is possible to apply a global shutter operation to not only all pixels present in an image but also to multiple predetermined rows.

Further, the conduction types of a device configuration in the unit pixel described above is just an example, and the N type and the P type may be reverse. Also, there is a case where the magnitude relationship of electrical potentials or potentials of the above portions is reverse depending on whether a majority carrier moving in a unit pixel is a positive hole or an electron.

9. ELECTRONIC APPARATUS

The present disclosure is not limitedly applied to a solid-state imaging device but is applicable to the overall electronic apparatuses using a solid-state imaging device as an image taking portion (i.e. photoelectric conversion portion), such as: an imaging device including a digital still camera and video camera; a portable terminal device having an imaging function such as a portable telephone machine; and a copy machine using a solid-state imaging device as an image reading portion. Here, the above module format mounted in an electronic apparatus, that is, a camera module may be provided in an imaging device.

Figure 97:
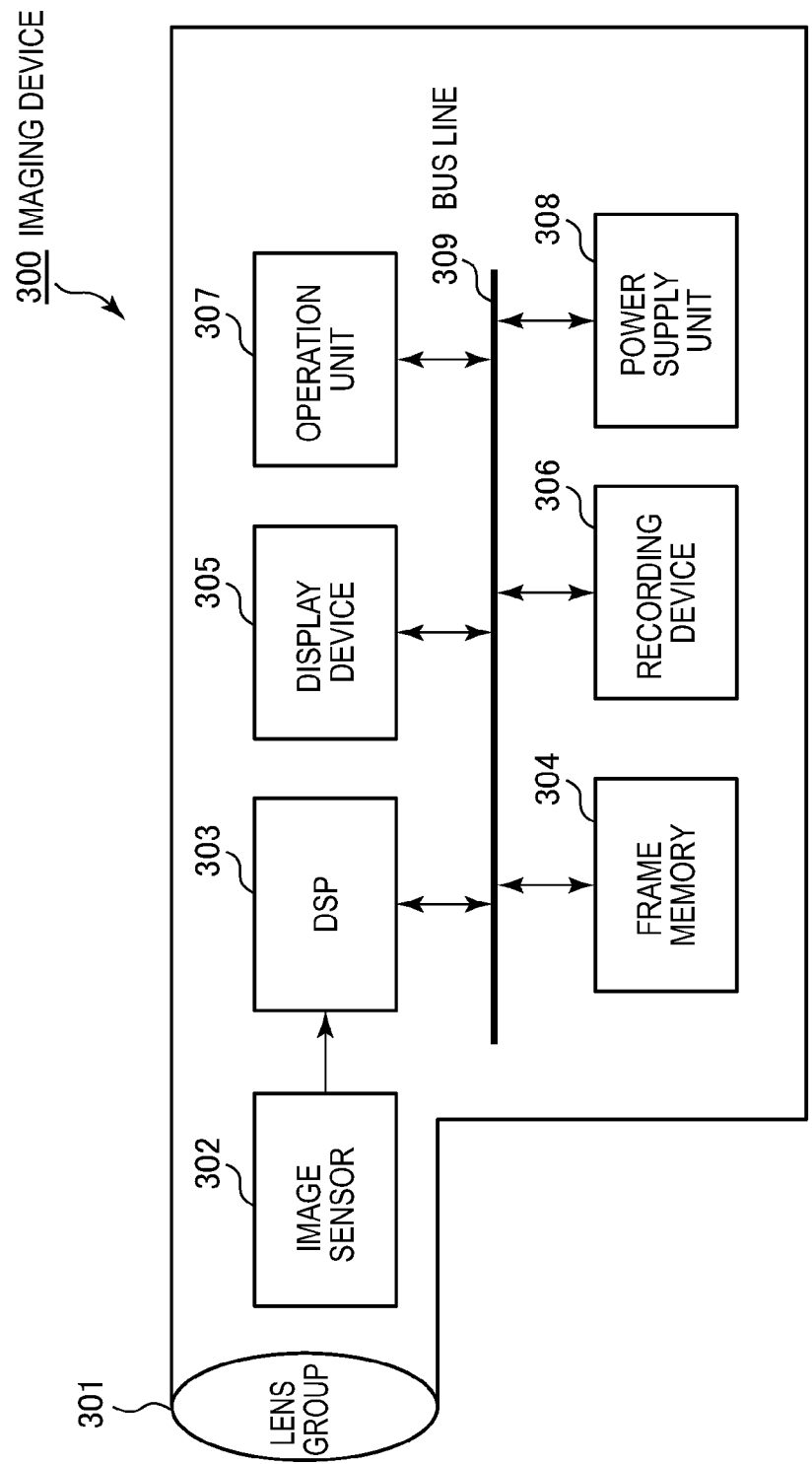
FIG. 97 is a block diagram illustrating a configuration example of electronic apparatus according to an embodiment of the present disclosure, such as an imaging device.

FIG. 97 is a block diagram illustrating a configuration example of an electronic apparatus according to the present disclosure, such as an imaging device.

As illustrated in FIG. 97, an imaging device 300 according to the present disclosure has an optical unit including a lens group 301, and an image sensor (or imaging device) 302, a DSP circuit 303, a frame memory 304, a display device 305, a recording device 306, an operation unit 307 and a power source unit 308. Subsequently, the DSP circuit 303, the frame memory 304, the display device 305, the recording device 306, the operation unit 307 and the power source unit 308 are mutually connected via a bus line 309.

The lens group 301 imports incident light (or image light) from a subject and forms an image on the imaging surface of the image sensor 302. In the image sensor 302, the light quantity of incident light formed on the imaging surface by the lens group 301 is converted into electric signals in a unit pixel and output as pixel signals.

The display device 305 includes a panel-type display device such as a liquid crystal display device and an organic EL (Electro Luminescence) display device, and displays a motion picture or still picture taken in the image sensor 302. The recording device 306 records the motion picture or still picture taken in the image sensor 302, in a storage medium such as a videotape and a DVD (Digital Versatile Disk).

The operation unit 307 issues operation instructions with respect to various functions held in the imaging device under user's operations. The power source unit 308 adequately supplies various powers corresponding to operation powers of the DSP circuit 303, the frame memory 304, the display device 305, the recording device 306 and the operation unit 307 to these supply targets.

It is possible to use the imaging device of the above configuration as an imaging device including a video camera, a digital still camera and a camera module for mobile devices such as a portable telephone machine. Also, in the imaging device, by using, as the image sensor 302, a solid-state imaging device such as the CMOS image sensor 10 according to the above embodiment, it is possible to provide the following operational effects.

That is, the CMOS image sensor 10 according to the above embodiment can realize an imaging without distortion by global exposure. Therefore, it can be realized as an imaging device suitable for the case of taking an image of a subject that moves at high speed, in which image distortion is not acceptable, or the case of the sensing use requesting synchronism in a taken image.

Also, compared to the related art that realizes the global exposure, the CMOS image sensor 10 according to the above embodiment can maintain a larger saturated charge amount without degrading image quality of a taken image at dark situation or low illumination, in other words, it is possible to increase a capacity value to accumulate light charges. Also, when it is possible to maintain a larger saturated charge amount, if an equivalent saturated charge amount is requested, it is possible to decrease the unit pixel size by the maintained saturated charge amount and realize many pixels according thereto. Therefore, it is possible to realize high quality of taken images.

The present disclosure is not limited to the above explanation. A pixel configuration, for example, an overflow path or a conduction layer of a surface layer portion of a flush-mounted MOS capacitor is not limited, and various changes are possible in circuit views and timing charts without departing from the scope of the present technology.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2012-020867 filed in the Japan Patent Office on Feb. 2, 2012 and JP 2012-022724 filed in the Japan Patent Office on Feb. 6, 2012, the entire content of which is hereby incorporated by reference.

What is claimed is:

1. A solid-state imaging device comprising:
   an overflow path of a first conductivity-type between a first semiconductor area of the first conductivity-type and a charge accumulation portion, the charge accumulation portion and the first semiconductor area touch the overflow path;
   a channel region of a second conductivity-type between a floating diffusion portion of the first conductivity-type and the charge accumulation portion, the charge accumulation portion and the floating diffusion portion touch the channel region;
   a second semiconductor area of the second conductivity-type between the charge accumulation portion and a photoelectric conversion portion, the photoelectric conversion portion and the charge accumulation portion touch the second semiconductor area; and
   a dielectric film between an intermediate electrode and a lower electrode,
   wherein the first semiconductor area is between the charge accumulation portion and the lower electrode.

2. The solid-state imaging device according to claim 1, wherein the first conductivity-type is N-type and the second conductivity-type is P-type.

3. The solid-state imaging device according to claim 1, wherein the first conductivity-type is opposite to the second conductivity-type.

4. The solid-state imaging device according to claim 1, wherein a concentration of the first conductivity-type is higher in the first semiconductor area than in the overflow path.

5. The solid-state imaging device according to claim 1, wherein the photoelectric conversion portion is configured to receive light and to convert the light into a charge.

6. The solid-state imaging device according to claim 1, wherein the overflow path is between a well of the second conductivity-type and an overflow gate electrode.

7. The solid-state imaging device according to claim 6, wherein the charge accumulation portion and the photoelectric conversion portion are in the well.

8. The solid-state imaging device according to claim 1, further comprising:
   a gate insulating film on a surface of a substrate, the gate insulating film is between the charge accumulation portion and a charge accumulation gate electrode.

9. The solid-state imaging device according to claim 8, wherein the charge accumulation gate electrode is a metal film.

10. The solid-state imaging device according to claim 8, wherein an upper part of the charge accumulation portion is between the charge accumulation gate electrode and a lower part of the charge accumulation portion.

11. The solid-state imaging device according to claim 10, wherein the upper part of the charge accumulation portion has a conductivity-type that is opposite to the conductivity type of the lower part of the charge accumulation portion.

12. The solid-state imaging device according to claim 10, wherein the lower part of the charge accumulation portion is of the first conductivity-type and the upper part of the charge accumulation portion is of the second conductivity-type.

13. The solid-state imaging device according to claim 8, wherein in a plan view of the solid-state imaging device, a transfer gate electrode is between the photoelectric conversion portion and the charge accumulation gate electrode.

14. The solid-state imaging device according to claim 13, wherein the charge accumulation portion and the first semiconductor area are disposed along a direction in the plan view of the solid-state imaging device, the charge accumulation portion and the photoelectric conversion portion are disposed along a different direction in the plan view of the solid-state imaging device.

15. The solid-state imaging device according to claim 13, wherein the gate insulating film is between the second semiconductor area and the transfer gate electrode.

16. The solid-state imaging device according to claim 13, wherein the transfer gate electrode overlays the second semiconductor area in the plan view of the solid-state imaging device.

17. The solid-state imaging device according to claim 13, wherein the charge accumulation gate electrode overlays the charge accumulation portion in the plan view of the solid-state imaging device.

18. The solid-state imaging device according to claim 8, wherein an upper part of the photoelectric conversion portion is between the charge accumulation gate electrode and a lower part of the photoelectric conversion portion.

19. The solid-state imaging device according to claim 18, wherein the upper part of the photoelectric conversion portion has a conductivity-type that is opposite to the conductivity type of the lower part of the photoelectric conversion portion.

20. The solid-state imaging device according to claim 18, wherein the lower part of the photoelectric conversion portion is of the first conductivity-type and the upper part of the photoelectric conversion portion is of the second conductivity-type.

21. The solid-state imaging device according to claim 1, wherein the lower electrode is either of the first conductivity-type or of the second conductivity-type.

22. The solid-state imaging device according to claim 8, wherein the dielectric film is between the charge accumulation gate electrode and a light blocking film.

23. The solid-state imaging device according to claim 1, further comprising:
 a wire that electrically connects the intermediate electrode to the first semiconductor area.

24. The solid-state imaging device according to claim 23, further comprising:
 a capacity insulating film between the intermediate electrode and another electrode.

25. An electronic apparatus comprising:
 the solid-state imaging device according to claim 1; and
 a signal processing portion performing signal processing on a signal output from the solid-state imaging device.

* * * * *